(12) United States Patent
Kim et al.

(10) Patent No.: US 11,404,412 B2
(45) Date of Patent: Aug. 2, 2022

(54) SEMICONDUCTOR DEVICE

(71) Applicant: Samsung Electronics Co., Ltd., Suwon-si (KR)

(72) Inventors: Munhyeon Kim, Hwaseong-si (KR); Youngchai Jung, Anyang-si (KR); Mingyu Kim, Hwaseong-si (KR); Seon-Bae Kim, Hwaseong-si (KR); Yeonho Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/204,621

(22) Filed: Mar. 17, 2021

(65) Prior Publication Data
US 2022/0045050 A1 Feb. 10, 2022

(30) Foreign Application Priority Data
Aug. 7, 2020 (KR) .................. 10-2020-0099171

(51) Int. Cl.
| | |
|---|---|
| *H01L 29/76* | (2006.01) |
| *H01L 29/94* | (2006.01) |
| *H01L 31/062* | (2012.01) |
| *H01L 27/088* | (2006.01) |
| *H01L 29/06* | (2006.01) |
| *H01L 29/78* | (2006.01) |

(52) U.S. Cl.
CPC ........ *H01L 27/088* (2013.01); *H01L 29/0649* (2013.01); *H01L 29/7827* (2013.01)

(58) Field of Classification Search
CPC ............. H01L 27/088; H01L 29/0649; H01L 29/7827; H01L 29/42376; H01L 29/66666

USPC ........................................................ 257/368
See application file for complete search history.

(56) References Cited

U.S. PATENT DOCUMENTS

| | | | |
|---|---|---|---|
| 5,122,848 A | 6/1992 | Lee et al. | |
| 5,250,450 A | 10/1993 | Lee et al. | |
| 6,297,531 B2 | 10/2001 | Armacost et al. | |
| 9,379,246 B2 | 6/2016 | Shimabukuro | |
| 9,536,793 B1 | 1/2017 | Zhang et al. | |
| 9,799,765 B1 * | 10/2017 | Bergendahl | ....... H01L 29/78642 |
| 9,966,456 B1 | 5/2018 | Park et al. | |
| 10,424,515 B2 | 9/2019 | Mallela et al. | |
| 10,504,794 B1 | 12/2019 | Lee et al. | |
| 10,535,652 B2 | 1/2020 | Cheng et al. | |

(Continued)

FOREIGN PATENT DOCUMENTS

JP 5114968 B2 1/2013

*Primary Examiner* — Theresa T Doan
(74) *Attorney, Agent, or Firm* — Muir Patent Law, PLLC

(57) ABSTRACT

A semiconductor device includes a substrate with an active region being provided with a channel pattern, a device isolation layer including a first part defining the active region and a second part surrounding a first portion of the channel pattern, an upper epitaxial pattern disposed on an upper surface of the channel pattern, a gate electrode surrounding a second portion of the channel pattern and extending in a first direction, a gate spacer on the gate electrode, an interlayer dielectric layer on the gate spacer, and an air gap between a bottom surface of the gate electrode and the second part of the device isolation layer. At least a portion of the air gap vertically overlaps the gate electrode. The second portion of the channel pattern is higher than the first portion of the channel pattern.

20 Claims, 44 Drawing Sheets

(56) References Cited

U.S. PATENT DOCUMENTS

| | | |
|---|---|---|
| 10,541,272 B2 | 1/2020 | Chanemougame et al. |
| 10,553,682 B2 | 2/2020 | Bi et al. |
| 10,600,885 B2 | 3/2020 | Cheng et al. |
| 11,271,107 B2 * | 3/2022 | Li .................... H01L 21/76224 |
| 2020/0013891 A1 | 1/2020 | Liu et al. |
| 2020/0058767 A1 | 2/2020 | Cheng et al. |

* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2020-0099171 filed on Aug. 7, 2020 in the Korean Intellectual Property Office, the disclosure of which is hereby incorporated by reference in its entirety.

BACKGROUND

The present inventive concepts relate to a semiconductor device, and more particularly, to a semiconductor device including a vertical field effect transistor.

Semiconductor devices are beneficial in the electronic industry because of their small size, multi-functionality, and/or low fabrication costs. Semiconductor devices may encompass semiconductor memory devices storing logic data, semiconductor logic devices processing operations of logic data, and hybrid semiconductor devices having both memory and logic elements. Higher integration of semiconductor devices may be desirable with the advanced development of the electronic industry. Semiconductor devices with higher reliability, higher speed, and/or multi-functionality may be desirable. Semiconductor devices are gradually complicated to meet these demands.

SUMMARY

Some example embodiments of the present inventive concepts provide a semiconductor device with increased electrical characteristics.

According to an embodiment of the present inventive concept, a semiconductor device includes a substrate provided with a first active region protruding from a main surface of the substrate, the first active region being provided with a first channel pattern protruding from an upper surface of the first active region, a device isolation layer on the substrate, the device isolation layer including a first part defining the first active region and a second part surrounding a first portion of the first channel pattern of the first active region, a first upper epitaxial pattern disposed on an upper surface of the first channel pattern of the first active region, a first gate electrode that surrounds a second portion of the first channel pattern of the first active region and extends in a first direction parallel to the main surface of the substrate, a gate spacer on the first gate electrode, an interlayer dielectric layer on the gate spacer, and an air gap between a bottom surface of the first gate electrode and the second part of the device isolation layer. At least a portion of the air gap vertically overlaps the first gate electrode. The second portion of the first channel pattern of the first active region is higher than the first portion of the first channel pattern of the first active region.

According to an example embodiment of the present inventive concept, a semiconductor device includes a substrate provided with a first active region and a second active region, the second active region being spaced apart in a first direction from the first active region, each of the first active region and the second active region vertically protruding from a main surface of the substrate, the first active region being provided with a first channel pattern protruding from an upper surface of the first active region, the second active region being provided with a second channel pattern protruding from an upper surface of the second active region, and each of the first and second channel patterns extending in the first direction, a device isolation layer on the substrate, the device isolation layer defining the first and second active regions and surrounding a first portion of each of the first channel pattern and the second channel pattern, a gate electrode that surrounds the first and second channel patterns and extends in the first direction, a gate spacer on the gate electrode and on the device isolation layer, and an air gap below the gate electrode, at least a portion of the air gap vertically overlapping the gate electrode. At least one side of the air gap is defined by the gate spacer.

According to an embodiment of the present inventive concept, a semiconductor device includes a substrate provided with a first active region and a second active region, the first and second active regions being spaced apart from each other in a first direction, each of the first and second active regions vertically protruding from a main surface of the substrate, the first active region being provided with a first channel pattern protruding from an upper surface of the first active region, and the second active region being provided with a second channel pattern protruding from an upper surface of the second active region, a first lower epitaxial pattern and a second lower epitaxial pattern being disposed in a recessed region of the first active region and a recessed region of the second active region, respectively, a device isolation layer on the substrate, the device isolation layer defining the first and second active regions, a first upper epitaxial pattern and a second upper epitaxial pattern disposed on an upper surface of the first channel pattern and an upper surface of the second channel pattern, respectively, a first gate electrode that surrounds the first and second channel patterns and extends in the first direction, a gate spacer on the first gate electrode, at least a portion of the gate spacer being interposed between the device isolation layer and a bottom surface of the first gate electrode, an interlayer dielectric layer on the gate spacer, a first active contact that penetrates the interlayer dielectric layer and is coupled to the first upper epitaxial pattern, a second active contact and a third active contact that penetrate the interlayer dielectric layer and the gate spacer and are coupled to the first lower epitaxial pattern and the second lower epitaxial pattern, respectively, a gate contact that penetrates the interlayer dielectric layer and the gate spacer and is coupled to the first gate electrode, a first metal layer on the interlayer dielectric layer, the first metal layer including a first power rail, a second power rail, and a first line, each of the first power rail, the second power rail, and the first line extending in a second direction different from the first direction, and the first line being between the first power rail and the second power rail, the first line being electrically connected to the gate contact, the first power rail being electrically connected to the first lower epitaxial pattern via the second active contact, and the second power rail being electrically connected to the second lower epitaxial pattern via the third active contact, a second metal layer on the first metal layer, the second metal layer including a second line that extends in the first direction, the second line being electrically connected to the first line of the first metal layer, and an air gap between the first gate electrode and the device isolation layer. At least a portion of the air gap vertically overlaps the first gate electrode.

DETAILED DESCRIPTION OF EMBODIMENTS

Figure 1:
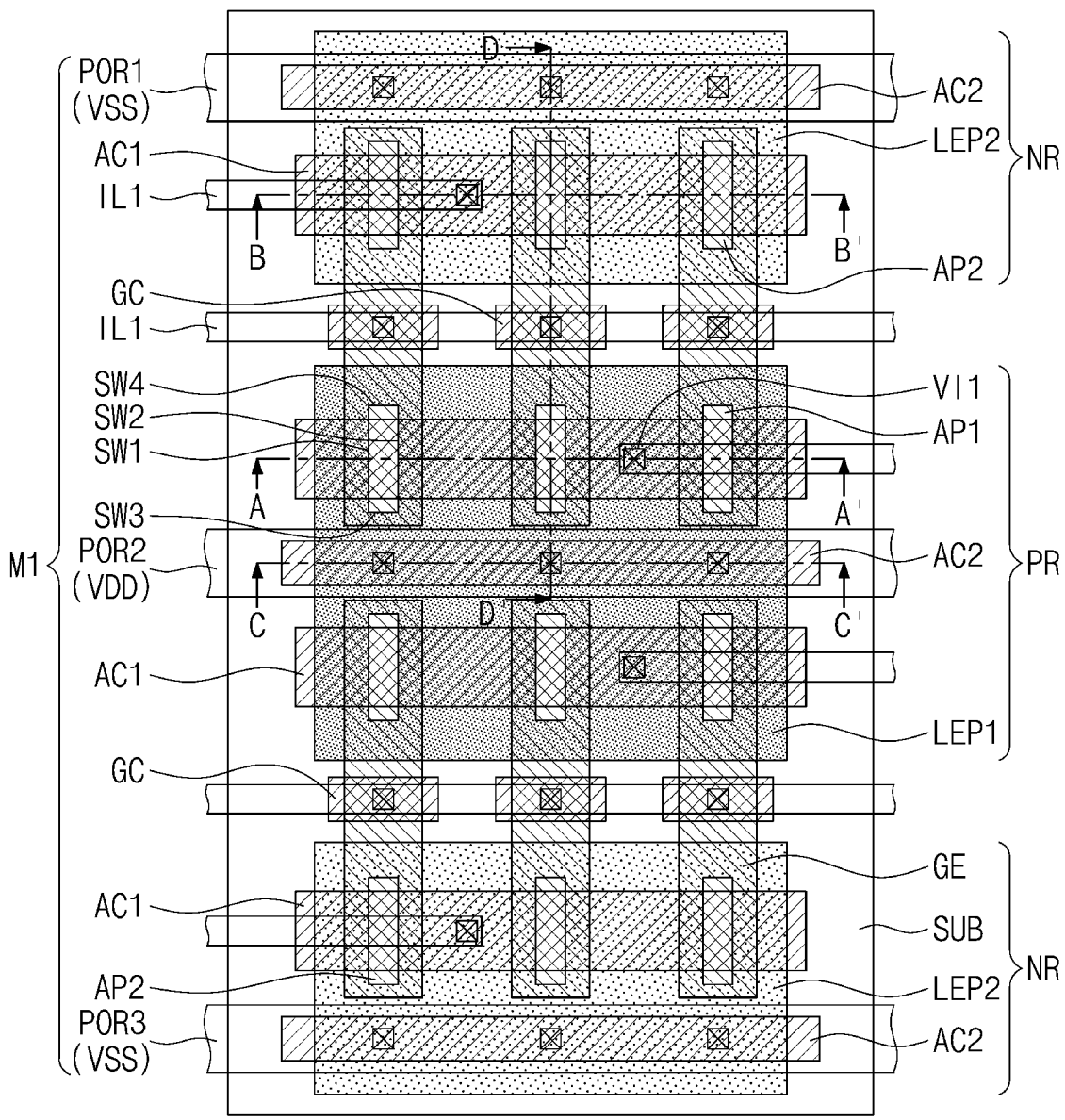
FIG. 1 illustrates a plan view showing a semiconductor device according to some example embodiments of the present inventive concepts.
Figure 2A:
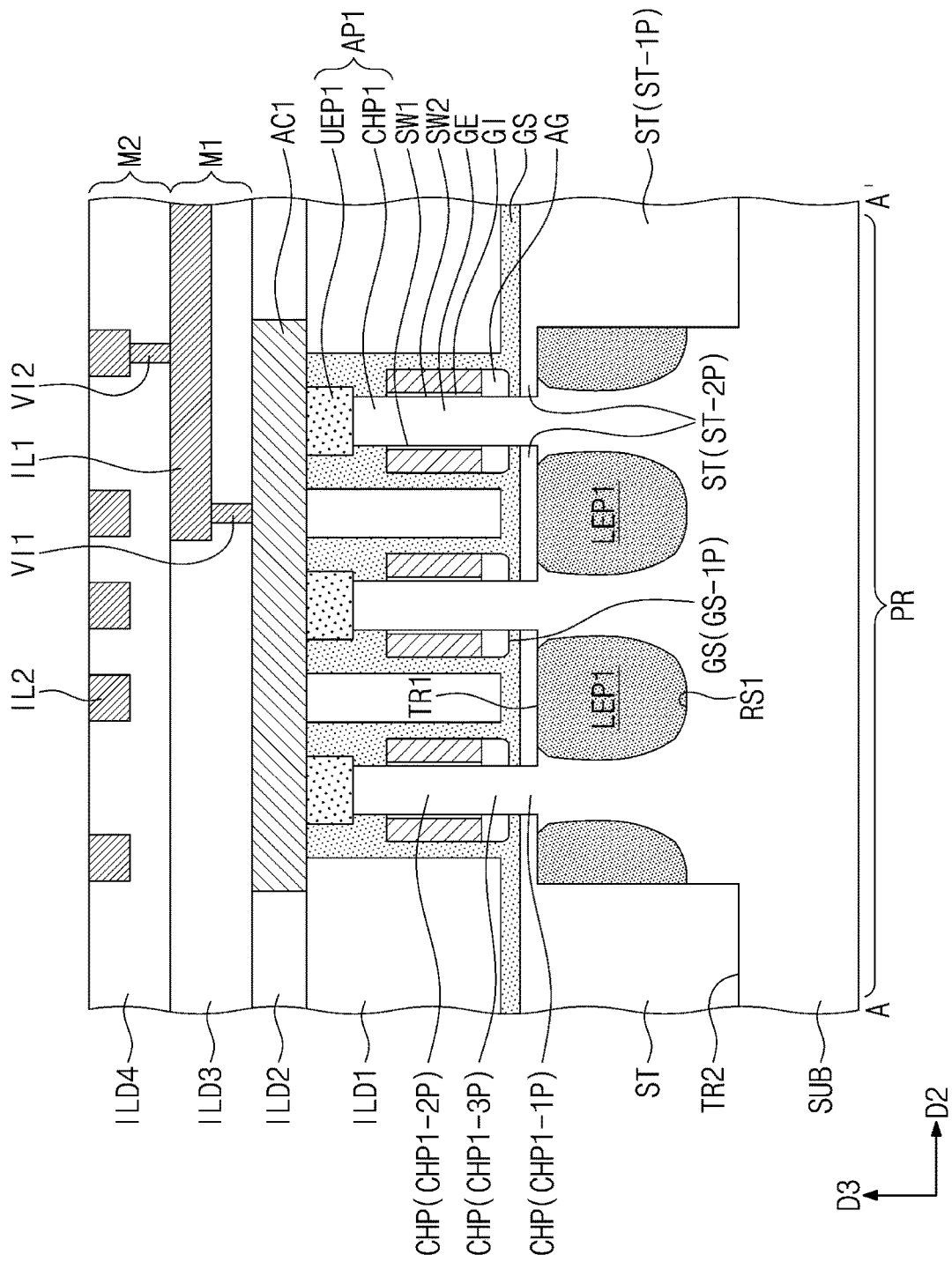
FIGS. 2A, 2B, 2C, and 2D illustrate cross-sectional views respectively taken along lines A-A', B-B', C-C', and D-D' of FIG. 1.
Figure 2B:
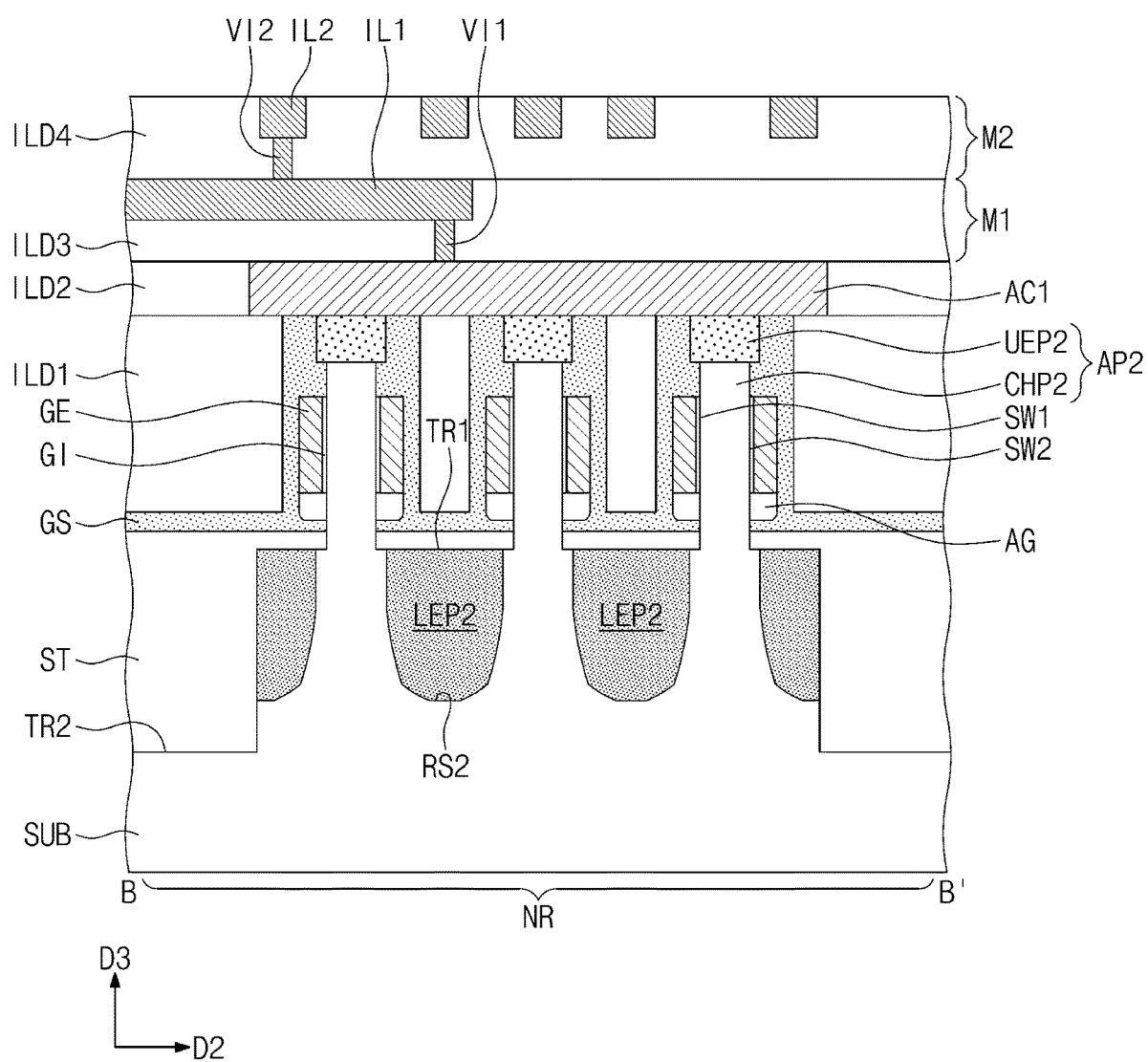
Figure 2C:
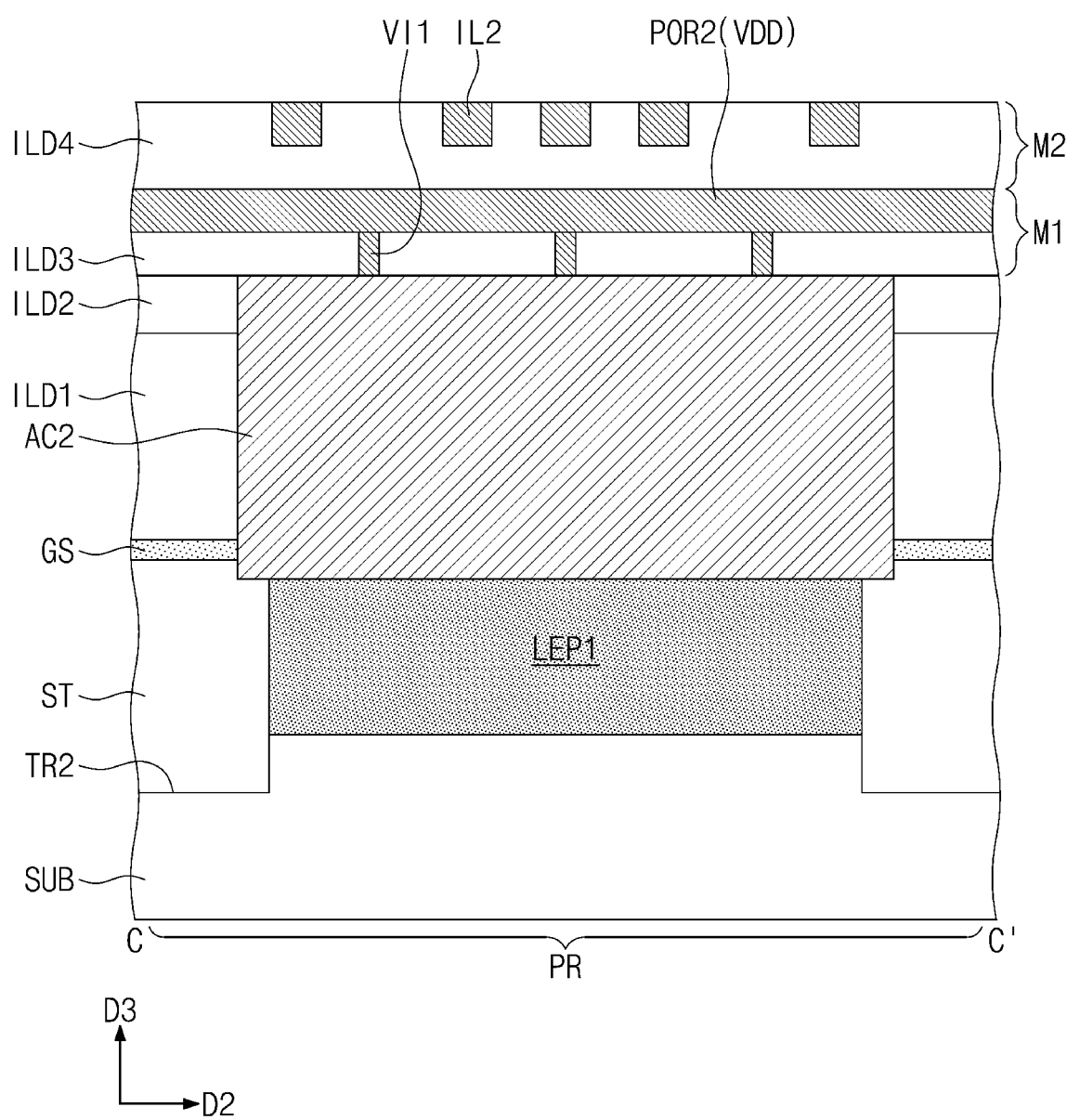

FIG. 1 illustrates a plan view showing a semiconductor device according to some example embodiments of the present inventive concepts. FIGS. 2A, 2B, 2C, and 2D illustrate cross-sectional views respectively taken along lines A-A', B-B', C-C', and D-D' of FIG. 1. FIG. 3 illustrates an enlarged cross-sectional view showing section M of FIG. 2D.

Referring to FIGS. 1 and 2A to 2D, a substrate SUB may be provided thereon with vertical transistors, such as vertical field effect transistors for a logic circuit. The substrate SUB may be a compound semiconductor substrate or a semiconductor substrate including silicon, germanium, or silicon-germanium. For example, the substrate SUB may be a silicon substrate.

A first power rail POR1, a second power rail POR2, and a third power rail POR3 may be disposed on the substrate SUB. The first, second, and third power rails POR1, POR2, and POR3 may be sequentially arranged in a first direction D1. The first power rail POR1 and the third power rail POR3 may each be a pathway to which is provided a first voltage VSS, for example, a ground voltage. The second power rail POR2 may be a pathway to which is provided a second voltage VDD, for example, a power voltage. The first, second, and third power rails POR1, POR2, and POR3 may be formed in a first metal layer M1 which will be discussed below.

The substrate SUB may include a first active region PR and a second active region NR. The first active region PR and the second active region NR may be a logic cell region that includes logic transistors for a logic circuit of a semiconductor device. The first active region PR and the second active region NR may include at least one of the logic transistors. The first active region PR may be one of p-type metal oxide field effect transistor (PMOSFET) and n-type metal oxide field effect transistor (NMOSFET) regions, and the second active region NR may be the other of PMOSFET and NMOSFET regions. For example, the first active region PR is a PMOSFET region, and the second active region NR is an NMOSFET region.

The first active region PR and the second active region NR may be defined by a second trench TR2 formed on an upper portion of the substrate SUB. The first active region PR and the second active region NR may be spaced apart from each other in the first direction D1 across the second trench TR2. The first active region PR and the second active region NR may extend in a second direction D2 that intersects the first direction D1. The first active region PR may vertically overlap the second power rail POR2. The second active region NR may vertically overlap the first and third power rails POR1 and POR3.

The first active region PR may be provided with first active patterns AP1. The second active region NR may be provided with second active patterns AP2. The first active patterns AP1 may protrude from an upper surface of the first active region PR. The second active patterns AP2 may protrude from an upper surface of the second active region NR. The first and second active patterns AP1 and AP2 may include portions of the substrate SUB that protrude from a top surface of the substrate SUB. For example, the first and second active patterns AP1 and AP2 may include non-recessed upper portions (e.g., the first and second channel patterns CHP1 and CHP2) of the substrate SUB. The first and second active patterns AP1 and AP2 may include or may be formed of a crystalline semiconductor material (e.g., single crystalline silicon) which is the same as that of the substrate SUB. A first trench TR1 may be defined between neighboring first active patterns AP1 and between neighboring second active patterns AP2.

When the substrate SUB is viewed in a plan view, each of the first and second active patterns AP1 and AP2 may have a bar shape that extends in the first direction D1. The first active patterns AP1 may be arranged in the second direction D2 at a first pitch. The second active patterns AP2 may be arranged in the second direction D2 at a second pitch. The first pitch and the second pitch may be the same as each other.

A first lower epitaxial pattern LEP1 may be disposed on the first active region PR. A second lower epitaxial pattern LEP2 may be disposed on the second active region NR. The first lower epitaxial pattern LEP1 and the second lower epitaxial pattern LEP2 may have different conductivity types from each other. The first and second active patterns AP1 and AP2 may be used to form the first and second lower epitaxial patterns LEP1 and LEP2 in a self-alignment manner.

The first and second lower epitaxial patterns LEP1 and LEP2 may be epitaxial patterns formed by a selective epitaxial growth process. For example, the first active region PR may be provided thereon with a first recess RS1, or a recessed upper portion of the substrate SUB. The first recess RS1 may be formed in the first trench TR1. The first recess RS1 may be filled with the first lower epitaxial pattern LEP1 that is formed by a selective epitaxial growth process in which an inner wall of the first recess RS1 is used as a seed. The second active region NR may be provided thereon with a second recess RS2, or a recessed upper portion of the substrate SUB. The second recess RS2 may be formed in the first trench TR1. A selective epitaxial growth process may be performed to form the second lower epitaxial pattern LEP2 that fills the second recess RS2.

For example, the first lower epitaxial pattern LEP1 may include or may be formed of a p-type impurity region. The second lower epitaxial pattern LEP2 may include or may be formed of an n-type impurity region. Each of the first and second lower epitaxial patterns LEP1 and LEP2 may include a semiconductor material selected from silicon (Si), germanium (Ge), or silicon-germanium (SiGe). In an embodiment, the first lower epitaxial pattern LEP1 which is coupled to the second power trail POR2 (VDD) may serve as a source region of an p-type metal oxide semiconductor (PMOS) vertical transistor, and the second lower epitaxial pattern LEP2 which is coupled to the first power trail POR1 (VSS) may serve as a source region of a n-type metal oxide (NMOS) vertical transistor.

The first active patterns AP1 may be formed on the first lower epitaxial pattern LEP1. The first active patterns AP1 may protrude perpendicular to the top surface of the substrate SUB. Each of the first active patterns AP1 may include a first channel pattern CHP1 that extends in a direction (e.g., a third direction D3) perpendicular to the top surface of the substrate SUB, and may also include a first upper epitaxial pattern UEP1 on the first channel pattern CHP1. The first channel pattern CHP1 may be disposed between the first lower epitaxial pattern LEP1 and the first upper epitaxial pattern UEP1. A selective epitaxial growth process may be performed to from the first upper epitaxial pattern UEP1 grown from the first channel pattern CHP1. For example, the first channel pattern CHP1 may include or may be formed of undoped silicon, and the first upper epitaxial pattern UEP1 may include or may be formed of silicon doped with p-type impurities. In an embodiment, the first upper epitaxial pattern UEP1 may serve as an output (or a drain region) of a PMOS vertical transistor.

The second active patterns AP2 may be formed on the second lower epitaxial pattern LEP2. The second active patterns AP2 may protrude perpendicular to the top surface of the substrate SUB. Each of the second active patterns AP2 may include a second channel pattern CHP2 that extends in a third direction D3, and may also include a second upper epitaxial pattern UEP2 on the second channel pattern CHP2. The second channel pattern CHP2 may be disposed between the second lower epitaxial pattern LEP2 and the second upper epitaxial pattern UEP2. A selective epitaxial growth process may be performed to form the second upper epitaxial pattern UEP2 grown from the second channel pattern CHP2. For example, the second channel pattern CHP2 may include or may be formed of undoped silicon, and the second upper epitaxial pattern UEP2 may include or may be formed of silicon doped with n-type impurities. In an embodiment, the second upper epitaxial pattern UEP2 may serve as an output (or a drain region) of an NMOS vertical transistor.

A device isolation layer ST may be disposed on the substrate SUB. The device isolation layer ST may fill the first and second trenches TR1 and TR2. For example, the device isolation layer ST may include or may be formed of a silicon oxide layer.

A gate electrode GE may extend in the first direction D1, while surrounding the first channel pattern CHP1 and the second channel pattern CHP2. The gate electrode GE may have a bar or linear shape that extends in the first direction D1. The gate electrode GE may have one end adjacent to the first power rail POR1 and another end adjacent to the second power rail POR2. Alternatively, the gate electrode GE may have one end adjacent to the second power rail POR2 and another end adjacent to the third power rail POR3.

The gate electrode GE may surround sidewalls of each of the first and second channel patterns CHP1 and CHP2. For example, the gate electrode GE may include or may be formed of one or more of conductive metal nitride (e.g., titanium nitride or tantalum nitride) and metal (e.g., titanium, tantalum, tungsten, copper, or aluminum).

A gate dielectric pattern GI may be interposed between the gate electrode GE and each of the first and second channel patterns CHP1 and CHP2. The gate dielectric pattern GI may cover inner walls of the gate electrode GE and at least a portion of a bottom surface of the gate electrode GE. The gate dielectric pattern GI may have an uppermost surface coplanar with a top surface of the gate electrode GE. The gate dielectric pattern GI may include or may be formed of one or more of a silicon oxide layer, a silicon nitride layer, a silicon oxynitride layer, and a high-k dielectric material layer. For example, the high-k dielectric material layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The first and second upper epitaxial patterns UEP1 and UEP2 may protrude upwardly beyond the gate electrode GE. The top surface of the gate electrode GE may be located at a level the same as or lower than that of a bottom surface of each of the first and second upper epitaxial patterns UEP1 and UEP2. For example, each of the first and second active patterns AP1 and AP2 may have a structure that vertically extends from the substrate SUB and penetrates the gate electrode GE.

Each of the first and second channel patterns CHP1 and CHP2 may have first, second, third, and fourth sidewalls SW1, SW2, SW3, and SW4. The first sidewall SW1 and the second sidewall SW2 may face each other in the second direction D2. The third sidewall SW3 and the fourth sidewall SW4 may face each other in the first direction D1. The fourth sidewall SW4 may be adjacent to the device isolation layer ST between the first and second active patterns AP1 and AP2. The gate electrode GE may surround the first, second, third, and fourth sidewalls SW1, SW2, SW3, and SW4 of each of the first and second channel patterns CHP1 and CHP2.

A semiconductor device according to the present embodiment may include vertical transistors in which carriers migrate in the third direction D3. For example, when the transistor is turned on due to voltage applied to the gate electrode GE, the carriers may migrate from the lower epitaxial pattern LEP1 or LEP2 through the channel pattern CHP1 or CHP2 to the upper epitaxial pattern UEP1 or UEP2. The gate electrode GE according to the present embodiment may have a gate-all-around structure that surrounds four sidewalls SW1, SW2, SW3, and SW4 of the channel pattern CHP1 or CHP2. As the gate electrodes GE completely surround the channel patterns CHP1 and CHP2, the semiconductor device according to the present inventive concepts may have excellent electrical characteristics.

A gate spacer GS may be disposed on the gate electrode GE. The gate spacer GS may cover the top surface and the sidewall of the gate electrode GE. The gate spacer GS may extend onto the device isolation layer ST. The gate spacer GS may extend along the first and second active patterns AP1 and AP2. The gate spacer GS may cover sidewalls of the first and second upper epitaxial patterns UEP1 and UEP2. The gate spacer GS may have a top surface higher than that of the gate electrode GE. The top surface of the gate spacer GS may be coplanar with that of a first interlayer dielectric layer ILD1 which will be discussed below. The gate spacer GS may include or may be formed of one or more of SiCN, SiCON, and SiN. Alternatively, the gate spacer GS may include a multi-layer that is formed of two or more of SiCN, SiCON, and SiN.

Air gaps AG may be disposed between the gate electrode GE and the device isolation layer ST. The air gaps AG may be empty spaces formed between the gate electrode GE, the gate spacer GS, and the first and second channel patterns CHP1 and CHP2. For example, the air gap AG may be adjacent to the gate spacer GS. The gate spacer GS may surround the air gap AG. The term "air" as discussed herein, may refer to atmospheric air, or other gases that may be present during the manufacturing process.

For example, the air gaps AG may be defined by the bottom surface of the gate electrode GE and the first, second, and third sidewalls SW1, SW2, and SW3 of each of the first and second channel patterns CHP1 and CHP2. The air gap AG may vertically overlap the gate electrode GE. The air gap AG may separate the gate spacer GS from at least a portion of the bottom surface of the gate electrode GE.

The air gap AG may be formed by recessing a lower portion of the gate electrode GE. The air gaps AG may extend along the first, second, and third sidewalls SW1, SW2, and SW3 of each of the first and second channel patterns CHP1 and CHP2. The air gap AG may expose at least portions of the first, second, and third sidewalls SW1, SW2, and SW3. The air gaps AG may extend along lower portions of the first and second channel patterns CHP1 and CHP2. The gate spacer GS may separate the air gap AG from a first interlayer dielectric layer ILD1 which will be discussed below.

In the present embodiment, a lower portion of the gate electrode GE may be recessed to provide the air gap AG below the gate electrode GE. The presence of the air gap AG may control a spacing distance between the gate electrode GE and the lower epitaxial pattern LEP1 or LEP2. Therefore, the gate electrode GE and the lower epitaxial patterns LEP1 and LEP2 may have therebetween reduced parasitic capacitance produced by the fact that the gate electrode GE partially extends toward the lower epitaxial patterns LEP1 and LEP2. As a result, a semiconductor device may increase in electrical characteristics.

Figure 2D:
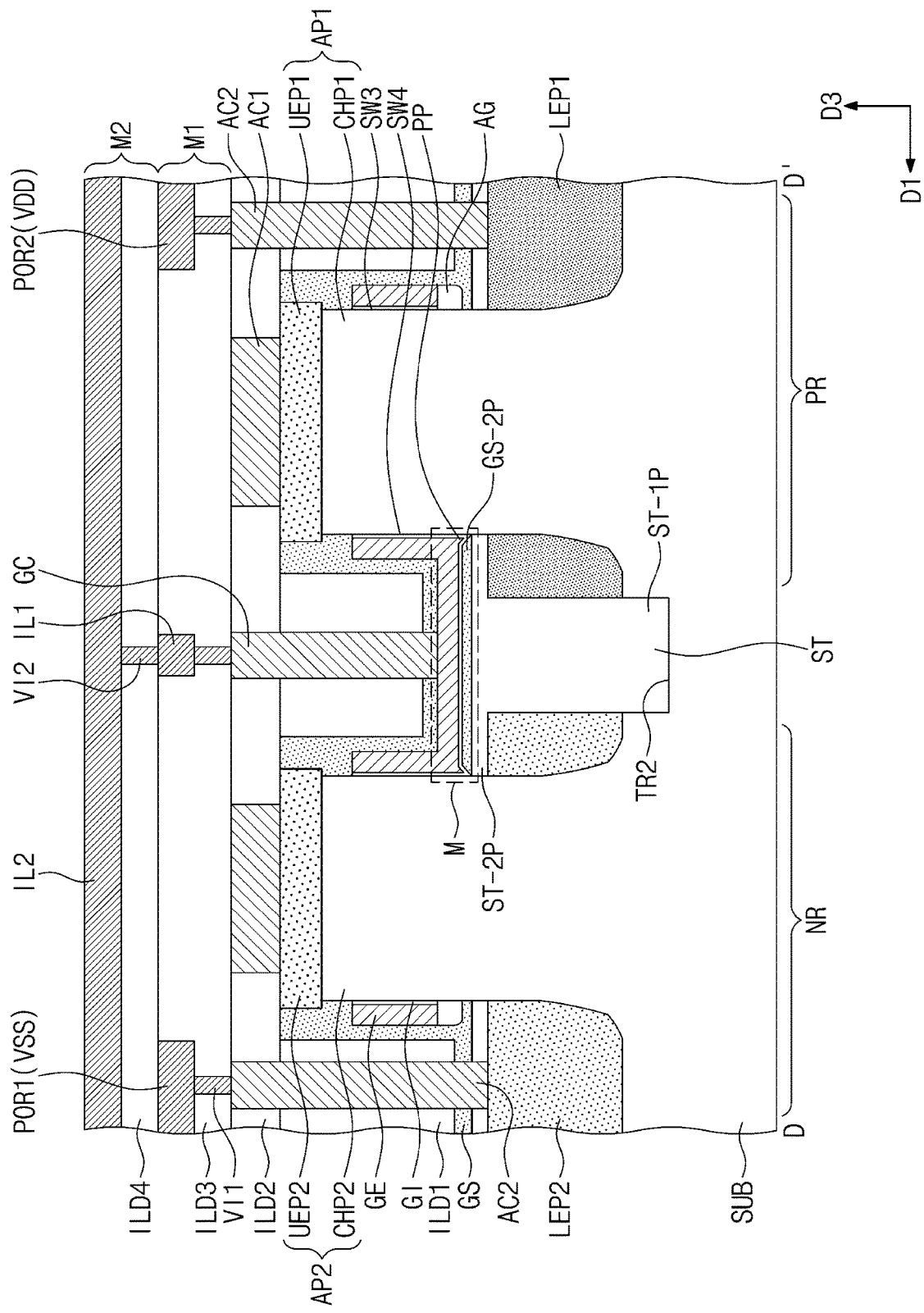
Figure 3:
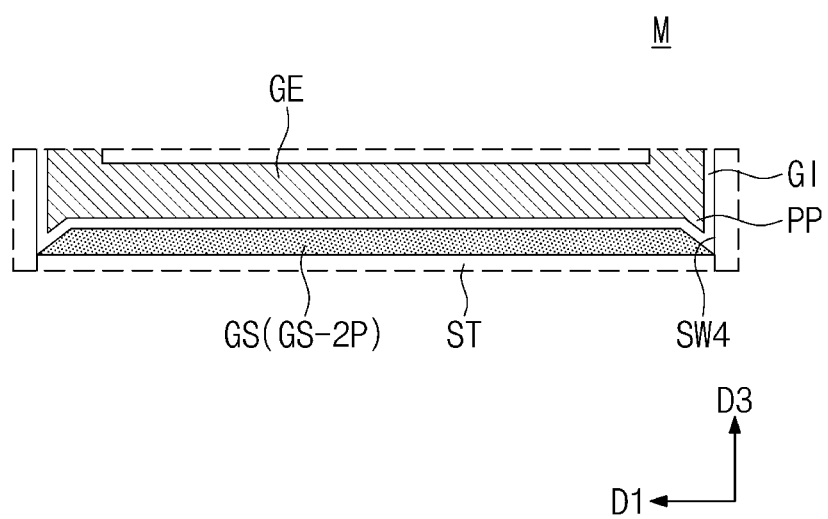
FIG. 3 illustrates an enlarged cross-sectional view showing section M of FIG. 2D.

Referring to FIGS. 2D and 3, the gate electrode GE may include a protrusion PP that is provided between the gate spacer GS and the fourth sidewall SW4 of each of the first and second channel patterns CHP1 and CHP2 and that protrudes toward the device isolation layer ST. For example, the air gap AG does not extend along the fourth sidewall SW4. The gate electrode GE may contact the fourth sidewall SW4. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The protrusion PP may be disposed on the device isolation layer ST between the first and second active patterns AP1 and AP2. The gate dielectric pattern GI may extend along a bottom surface of the protrusion PP. Unlike the first, second, and third sidewalls SW1, SW2, and SW3, the fourth sidewall SW4 of the first and second channel patterns CHP1 and CHP2 is not exposed by the air gaps AG. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Compared to a case where the protrusion PP is not provided, the presence of the protrusion PP may expand a region where the gate electrode GE overlaps each of the first and second lower epitaxial patterns LEP1 and LEP2. In addition, the presence of the protrusion PP may increase a contact area between the gate electrode GE and each of the first and second channel patterns CHP1 and CHP2. A semiconductor device may eventually have an enhanced operating speed.

The gate electrode GE may run across the device isolation layer ST between the first and second active patterns AP1 and AP2. At least a portion of the gate spacer GS may be interposed between the device isolation layer ST and the gate electrode GE. For example, a portion of the gate spacer GS on the device isolation layer ST between the first and second active patterns AP1 and AP2 may be interposed between the device isolation layer ST and the gate electrode GE.

Referring back to FIGS. 1 and 2A to 2D, a first interlayer dielectric layer ILD1 may be formed on the substrate SUB. The first interlayer dielectric layer ILD1 may cover a sidewall of the gate spacer GS. For example, the first interlayer dielectric layer ILD1 may include or may be formed of a silicon oxide layer or a silicon oxynitride layer. The gate spacer GS may separate the first interlayer dielectric layer ILD1 from the air gap AG. The gate spacer GS may separate the first interlayer dielectric layer ILD1 from the device isolation layer ST. The first interlayer dielectric layer ILD1 may have a top surface substantially coplanar with that of the gate spacer GS and those of the first and second upper epitaxial patterns UEP1 and UEP2. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

A second interlayer dielectric layer ILD2 may be disposed on the first interlayer dielectric layer ILD1. For example, the first and second interlayer dielectric layers ILD1 and ILD2 may include or may be formed of a silicon oxide layer or a silicon oxynitride layer. The second interlayer dielectric layer ILD2 may cover the first and second upper epitaxial patterns UEP1 and UEP2.

A first active contact AC1 may penetrate the second interlayer dielectric layer ILD2 to be coupled to one or more of the first and second upper epitaxial patterns UEP1 and UEP2. When the substrate is viewed in a plan view, the first active contact AC1 may have a bar shape that extends in the second direction D2. A plurality of first active contacts AC1 may be arranged in the first direction D1.

A second active contact AC2 may penetrate the first and second interlayer dielectric layers ILD1 and ILD2 to be coupled to one or more of the first and second lower epitaxial patterns LEP1 and LEP2. When the substrate SUB is viewed in a plan view, the second active contact AC2 may have a bar shape that extends in the second direction D2. A plurality of second active contacts AC2 may be arranged in the first direction D1. The second active contact AC2 may vertically overlap one of the first, second, and third power rails POR1, POR2, and POR3. The second active contact AC2 may additionally penetrate the gate spacer GS and the device isolation layer ST.

The first and second active contacts AC1 and AC2 may have their top surfaces substantially coplanar with that of the second interlayer dielectric layer ILD2. The second active contacts AC2 may have their bottom surfaces at a lower level than that of bottom surfaces of the first active contacts AC1.

A gate contact GC may penetrate the first and second interlayer dielectric layers ILD1 and ILD2 to be coupled to the gate electrode GE. The gate contact GC may be disposed between the first and second active patterns AP1 and AP2. When the substrate SUB is viewed in a plan view, the gate contact GC may have a bar shape that extends in the second direction D2 between a pair of first active contacts AC1. The gate contact GC may additionally penetrate the gate spacer GS.

The gate contact GC may have a top surface coplanar with that of the second interlayer dielectric layer ILD2. The gate contact GC may have a bottom surface at a higher level than that of the bottom surface of the second active contact AC2.

The gate contact GC and the first and second active contacts AC1 and AC2 may include or may be formed of, for example, at least one metal selected from aluminum, copper, tungsten, molybdenum, and cobalt.

A third interlayer dielectric layer ILD3 may be disposed on the second interlayer dielectric layer ILD2. The third interlayer dielectric layer ILD3 may include or may be formed of, for example, a silicon oxide layer or a silicon oxynitride layer. A first metal layer M1 may be disposed in the third interlayer dielectric layer ILD3. The first metal layer M1 may include the first, second, and third power rails POR1, POR2, and POR3, first lines ILL and first vias VI1.

The first lines IL1 and the first, second, and third power rails POR1, POR2, and POR3 may have linear shapes that extend parallel to each other in the second direction D2. The first lines IL1 may be disposed between the first and second power rails POR1 and POR2 or between the second and third power rails POR2 and POR3.

The first vias VI1 may be disposed below the first, second, and third power rails POR1, POR2, and POR3. The first via VI1 may electrically connect the second active contact AC2 to one of the first, second, and third power rails POR1, POR2, and POR3. The first via VI1 may electrically connect the first line IL1 to one or more of the first active contact AC1 and the gate contact GC.

A fourth interlayer dielectric layer ILD4 may be disposed on the third interlayer dielectric layer ILD3. The fourth interlayer dielectric layer ILD4 may include or may be formed of, for example, a silicon oxide layer or a silicon oxynitride layer. A second metal layer M2 may be disposed in the fourth interlayer dielectric layer ILD4. The second metal layer M2 may include second lines IL2 and second vias VI2.

The second lines IL2 may have their linear shapes that extend parallel to each other in the first direction D1. The second vias VI2 may be disposed below the second lines IL2. The second vias VI2 may electrically connect the second lines IL2 to the first metal layer M1.

In an embodiment as shown in FIGS. 2A and 2D, the first channel pattern CHP1 may include a first portion CHP1-1P, a second portion CHP1-2P, and third portion CHP1-3P. The device isolation layer ST may surround the first portion CHP1-1P of the first channel pattern CHP1. For example, the device isolation layer ST may include a first part ST-1P defining the first active region PR and the second active region NR, and a second part ST-2P surrounding the first portion CHP1-1P of the first channel pattern CHP1. The second part ST-2P of the device isolation layer ST may be disposed on an upper surface of the first active region PR and surround the first portion CHP1-1P of the first channel pattern CHP1. The gate electrode GE may surround the second portion CHP1-2P of the first channel pattern CHP1. The air gap AG may partially surround the third portion CHP1-3P of the first channel pattern CHP1. For example, the first to third sidewalls SW1 to SW3 of the first channel pattern CHP1 may be surrounded by the air gap AG, and the fourth sidewall SW4 of the first channel pattern CHP1 may contact the gate electrode GE with no air gap therebetween. This description may be applicable to the second channel pattern CHP2.

In an embodiment as shown in FIGS. 2A and 2D, a portion of the device isolation layer ST may be disposed between the first channel pattern CHP1 and the second channel pattern CHP2 which are spaced apart from each other in the first direction D1, and the portion of the device isolation layer ST may be closer to the fourth sidewall SW4 of the first channel pattern CHP1 than the third sidewall SW3 thereof. The first lower epitaxial pattern LEP1 may be adjacent to the third sidewall SW3 of the first channel pattern CHP1.

In an embodiment as shown in FIG. 2A, a portion GS-1P of the gate spacer GS may contact the second part ST-2P of the device isolation layer ST and a sidewall of the first channel pattern CHP1 of the first active region PR. At least a portion of a bottom surface of the gate electrode GE may be spaced apart from the portion GS-1P of the gate spacer GS. The air gap AG may be disposed between the bottom surface of the gate electrode GE and the portion GS-1P of the gate spacer GS.

In an embodiment as shown in FIG. 2D, a portion GS-2P of the gate spacer GS may be disposed on the second part ST-2P of the device isolation layer ST and the first part ST-1P of the device isolation layer ST. The portion GS-2P of the gate spacer GS may extend from the fourth sidewall SW4 of the first channel pattern CHP1 of the first active region PR toward the second channel pattern CHP2 of the second active region NR. The portion GS-2P of the gate spacer GS may include a first end with an inclined sidewall adjacent to the fourth sidewall SW4 of the first channel pattern CHP1 of the first active region PR. The gate electrode GE may include the protrusion PP that extends into a region between the fourth sidewall SW4 of the first channel pattern CHP1 of the first active region PR and the inclined sidewall of the first end of the portion GS-2P of the gate spacer GS.

FIGS. 4, 6, 8, 10, 12, 15, and 18 illustrate plan views showing a method of fabricating a semiconductor device according to some example embodiments of the present inventive concepts. FIGS. 5A, 7A, 9A, 11A, 13A, 14A, 16A with 17A, and 19A illustrate cross-sectional views taken along line A-A' of FIGS. 4, 6, 8, 10, 12, 15, and 18, respectively. FIGS. 5B, 7B, 9B, 11B, 13B, 14B, 16B with 17B, and 19B illustrate cross-sectional views taken along line B-B' of FIGS. 4, 6, 8, 10, 12, 15, and 18, respectively.

Figure 4:
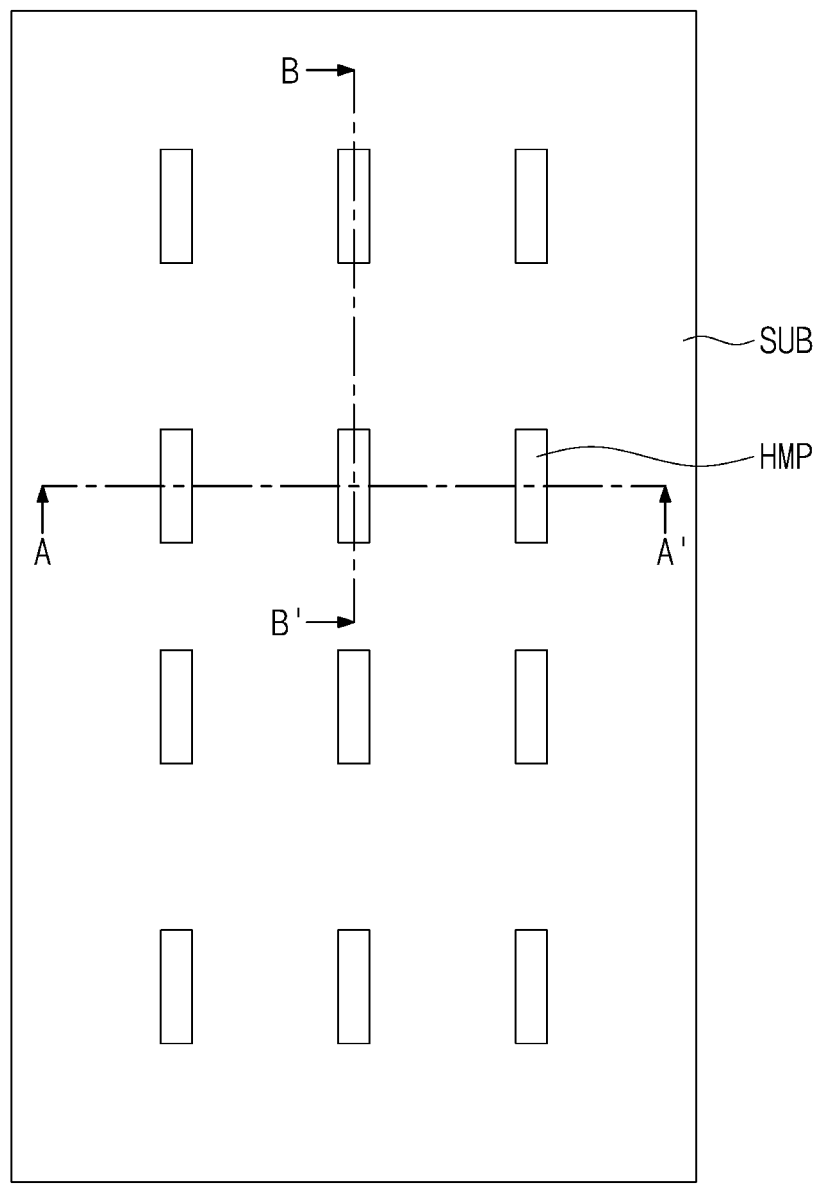
FIGS. 4, 6, 8, 10, 12, 15, and 18 illustrate plan views showing a method of fabricating a semiconductor device according to some example embodiments of the present inventive concepts.
Figure 5A:
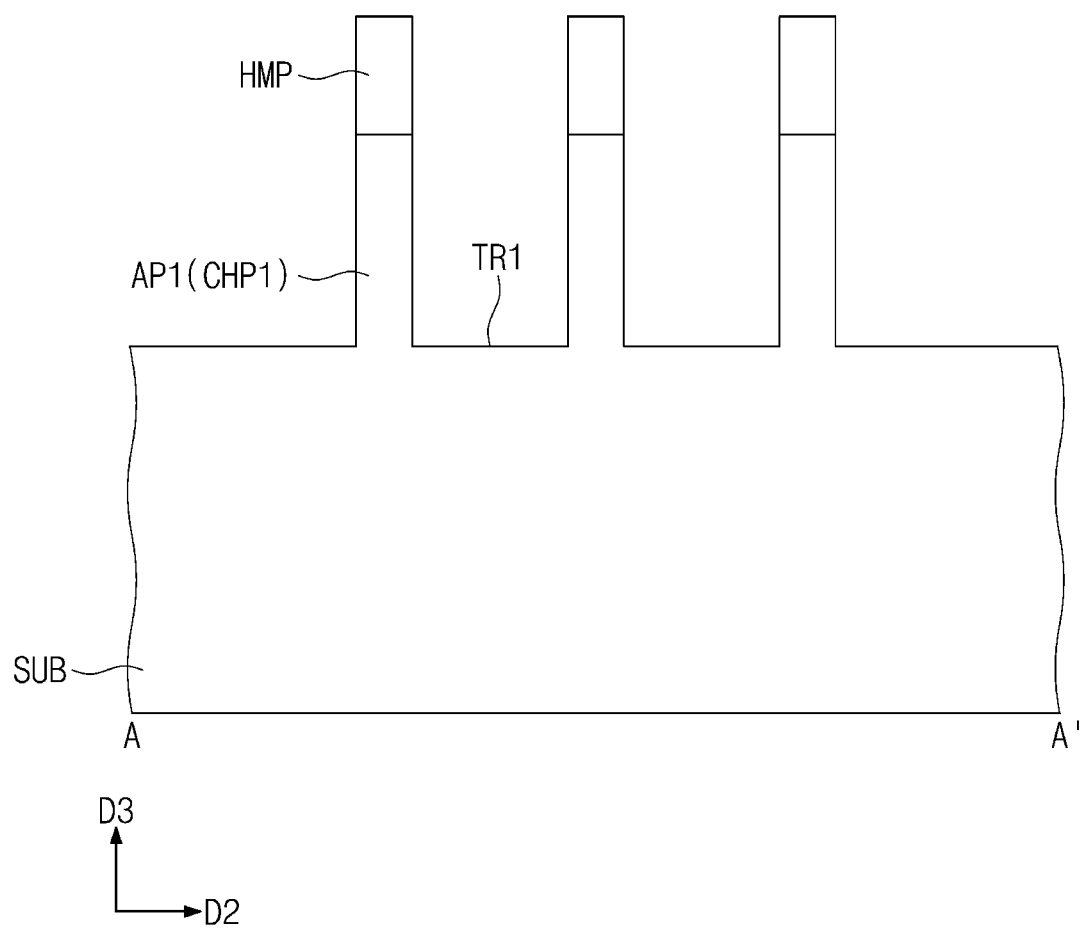
FIGS. 5A, 7A, 9A, 11A, 13A, 14A, 16A, 17A, and 19A illustrate cross-sectional views taken along line A-A' of FIGS. 4, 6, 8, 10, 12, 15, and 18, respectively.
Figure 5B:
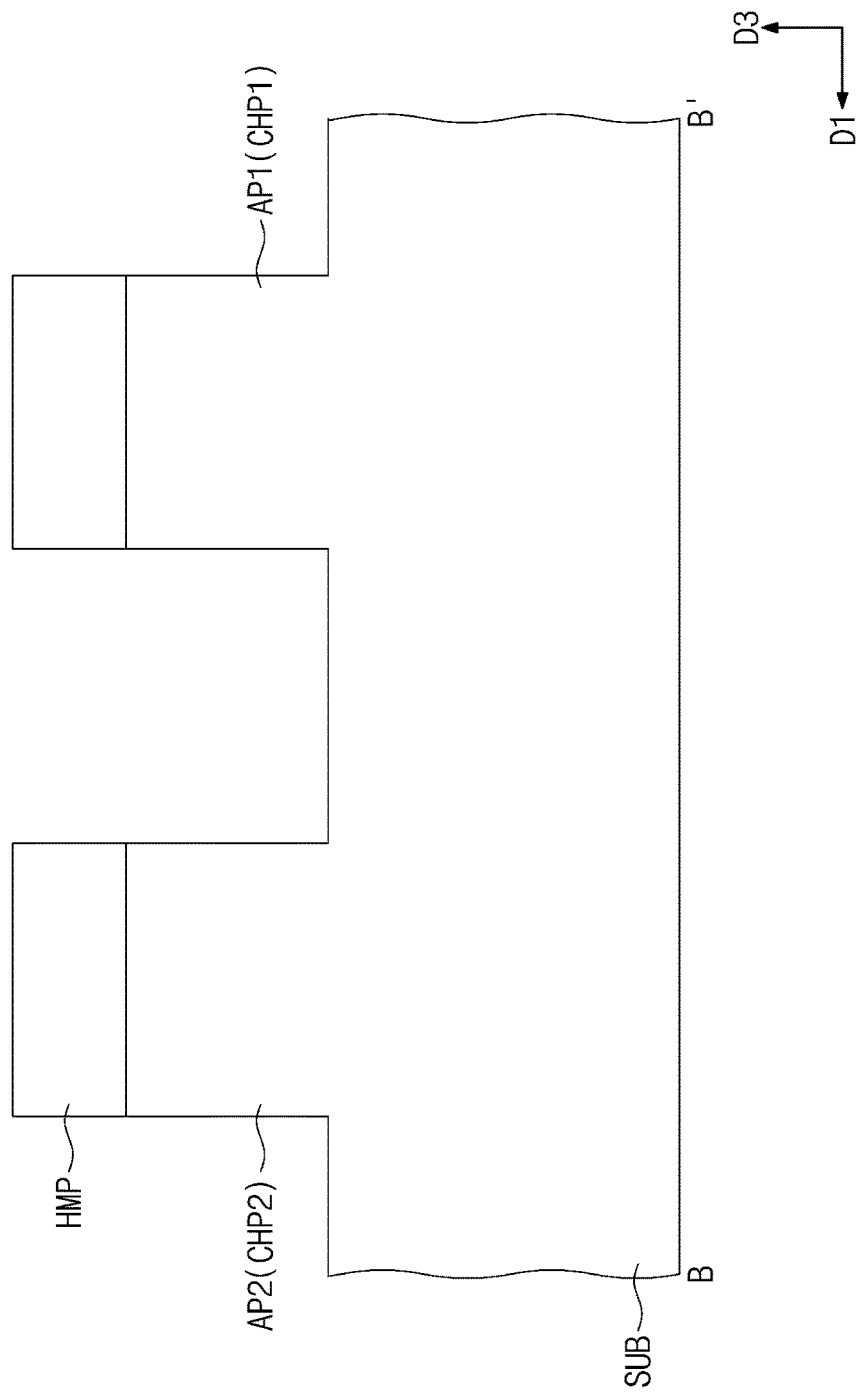
FIGS. 5B, 7B, 9B, 11B, 13B, 14B, 16B, 17B, and 19B illustrate cross-sectional views taken along line B-B' of FIGS. 4, 6, 8, 10, 12, 15, and 18, respectively.

Referring to FIGS. 4, 5A, and 5B, an upper portion of a substrate SUB may be patterned to form a first active pattern AP1 and a second active pattern AP2. The formation of the first and second active patterns AP1 and AP2 may include forming a hardmask pattern HMP on an entire surface of the substrate SUB, patterning the hardmask pattern HMP, and using the hardmask pattern HMP as an etching mask to anisotropically etch the upper portion of the substrate SUB.

The patterning of the upper portion of the substrate SUB may form a first trench TR1 between neighboring first active patterns AP1 and between neighboring second active patterns AP2. The first and second active patterns AP1 and AP2 may each have a semiconductor pillar, which is the first channel pattern CHP1 or the second channel pattern CHP2, that vertically protrudes from a top surface of the substrate SUB which is formed after the patterning of the upper portion of the substrate SUB. The first active pattern AP1 may include a first channel pattern CHP1 that protrudes from the top surface of the substrate SUB. The second active pattern AP2 may include a second channel pattern CHP2 that protrudes from the top surface of the substrate SUB. The first and second channel patterns CHP1 and CHP2 may include or may be formed of undoped crystalline silicon.

Figure 6:
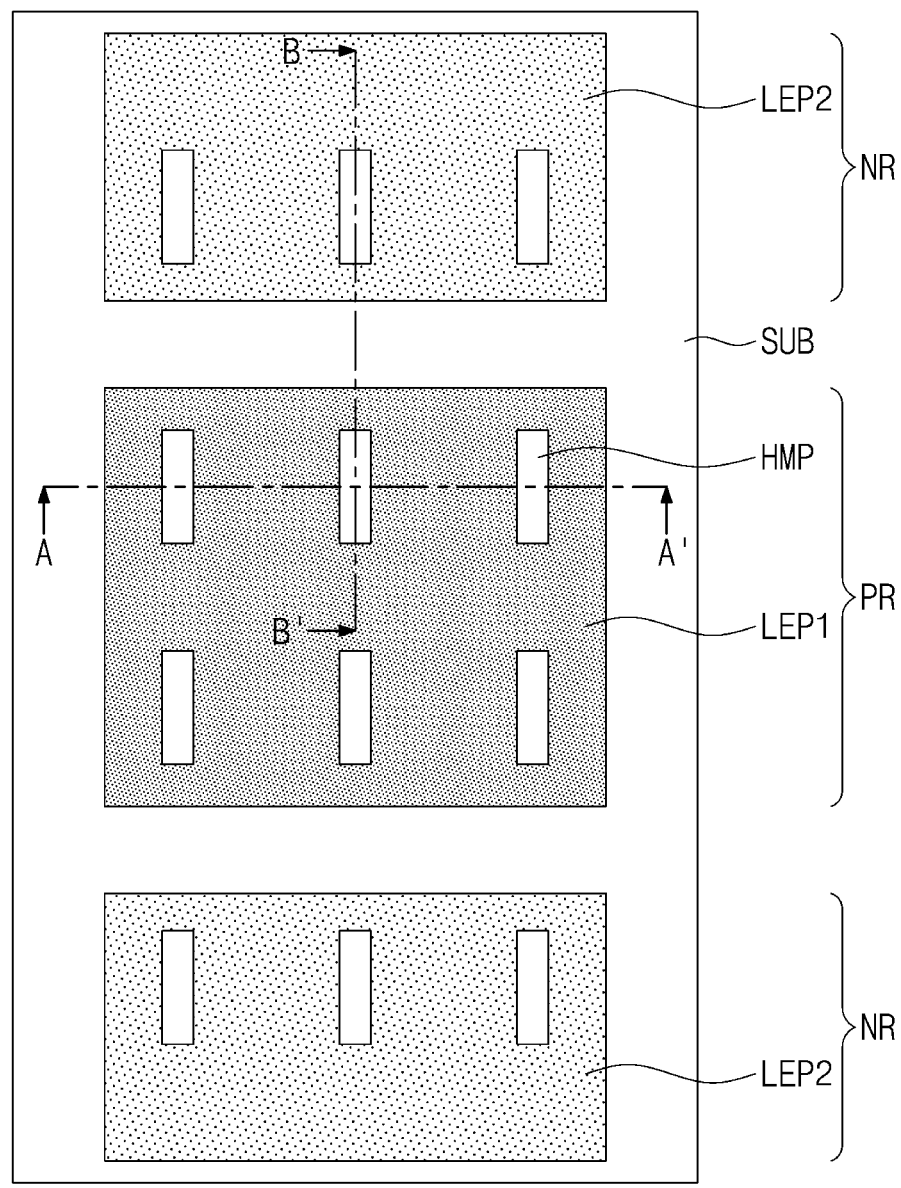
Figure 7A:
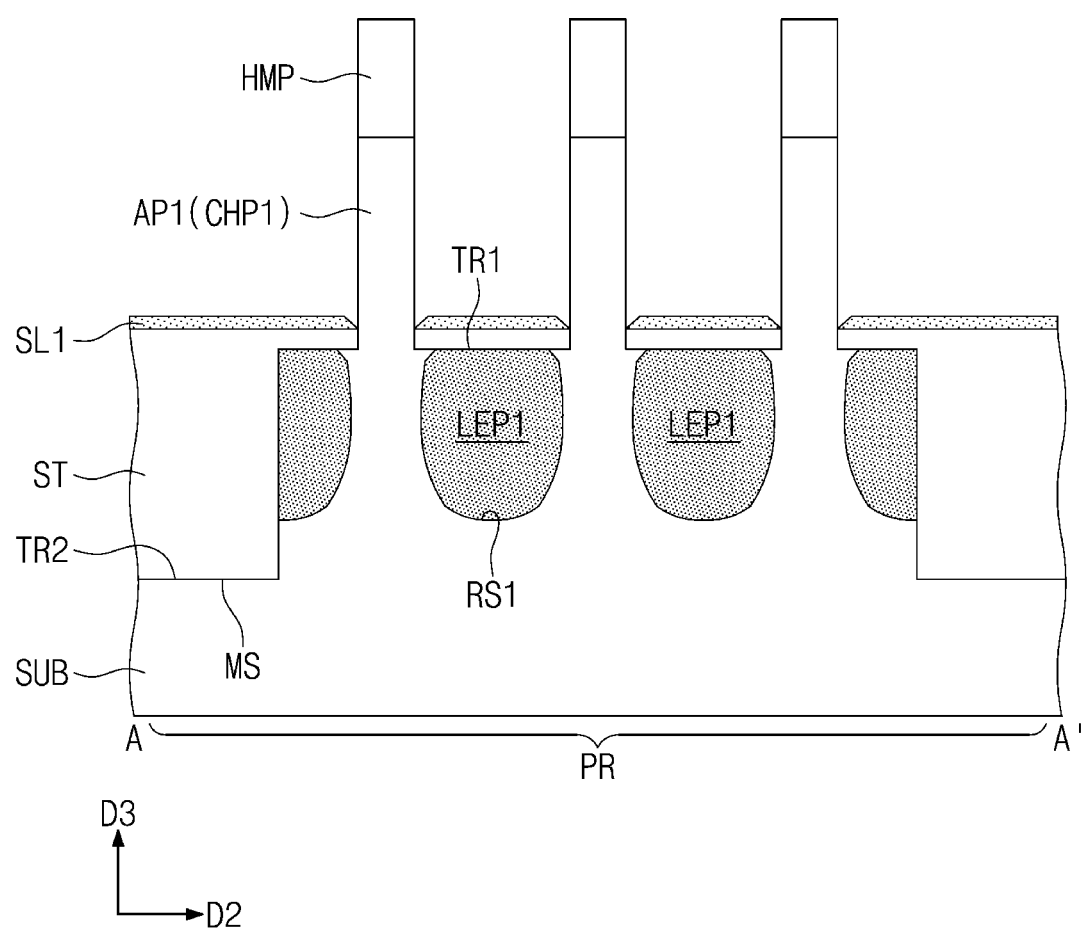
Figure 7B:
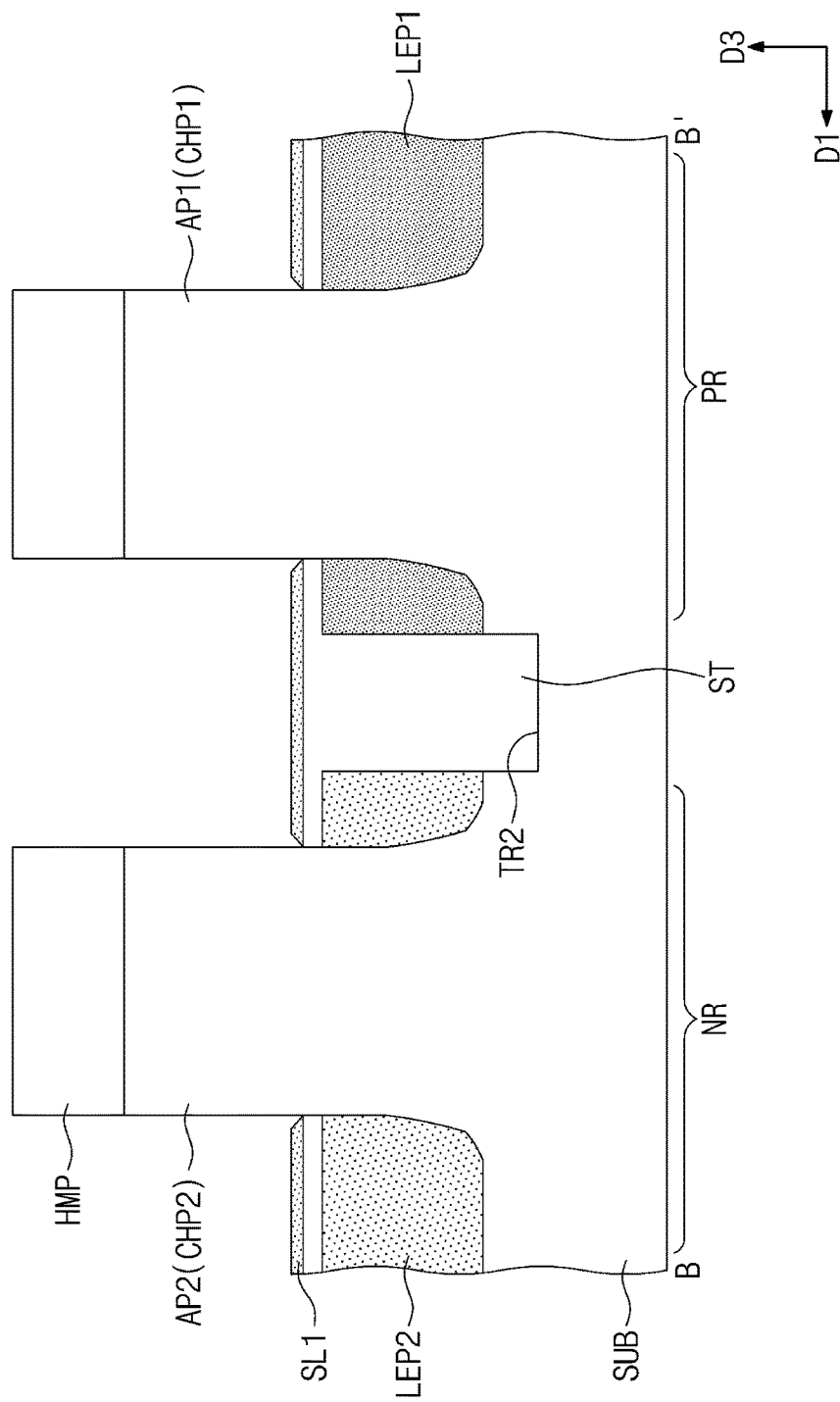

Referring to FIGS. 6, 7A, and 7B, first and second lower epitaxial patterns LEP1 and LEP2 may be formed on the substrate SUB. The first and second lower epitaxial patterns LEP1 and LEP2 may be formed in a self-alignment manner by using the first and second channel patterns CHP1 and CHP2 and the hardmask pattern HMP.

For example, the hardmask pattern HMP and the first channel pattern CHP1 may be used as an etching mask, such that the top surface of the substrate SUB may be etched to form a first recess RS1. The first lower epitaxial pattern LEP1 may be formed by performing a selective epitaxial growth process in which an inner wall of the first recess RS1 is used as a seed. For example, the selective epitaxial growth process may include a chemical vapor deposition (CVD) process or a molecular beam epitaxy (MBE) process. For example, impurities may be in-situ doped during the selective epitaxial growth process. For another example, after the first lower epitaxial pattern LEP1 is formed, impurities may be implanted into the first lower epitaxial pattern LEP1. The first lower epitaxial pattern LEP1 may be doped to have a first conductivity type (e.g., p-type).

The hardmask pattern HMP and the second channel pattern CHP2 may be used as an etching mask, such that the top surface of the substrate SUB may be etched to form a second recess. The second lower epitaxial pattern LEP2 may be formed by performing a selective epitaxial growth process in which an inner wall of the second recess is used as a seed. The second lower epitaxial pattern LEP2 may be doped to have a second conductivity type (e.g., n-type). The first lower epitaxial pattern LEP1 and the second lower epitaxial pattern LEP2 may be sequentially formed through different processes. For example, the first lower epitaxial pattern LEP1 and the second lower epitaxial pattern LEP2 are not formed at the same time.

The top surface of the substrate SUB, which is formed after the patterning of the upper portion of the substrate SUB to form the first and second channel patterns CHP1 and CHP2, may be patterned to form a second trench TR2 that defies first and second active regions PR and NR. The second trench TR2 may be formed between neighboring first channel patterns CHP1 and neighboring second channel patterns CHP2. When the top surface of the substrate SUB is patterned, the first and second lower epitaxial patterns LEP1 and LEP2 may be partially removed. The first lower epitaxial pattern LEP1 may be formed on the first active region PR, and the second lower epitaxial pattern LEP2 may be formed on the second active region NR. In an embodiment, a bottom surface of the second trench TR2 may correspond to a main surface MS of the substrate SUB. Each of the first and second active regions PR and NR may protrude vertically from the main surface MS of the substrate SUB.

A device isolation layer ST may be formed to fill the first and second trenches TR1 and TR2. The formation of the device isolation layer ST may include forming on the substrate SUB a dielectric layer that fills the first and second trenches TR1 and TR2, and planarizing the dielectric layer. For example, the device isolation layer ST may include or may be formed of a silicon oxide layer. In an embodiment, the device isolation layer ST may completely fill the second trench TR2, and partially fill the first trench TR1. The device isolation layer ST may cover an upper surface of the first lower epitaxial pattern LEP1 and an upper surface of the second lower epitaxial pattern LEP2. In an embodiment, the device isolation layer ST may contact the upper surface of the first lower epitaxial pattern LEP1 and the upper surface of the second lower epitaxial pattern LEP2.

A first spacer layer SL1 may be formed on the device isolation layer ST. The first spacer layer SL1 may include or may be formed of, for example, one or more of SiCN, SiCON, and SiN. The first spacer layer SL1 may have a width that decreases as approaching a top end thereof. For example, the first spacer layer SL1 may have inclined sidewalls.

Figure 8:
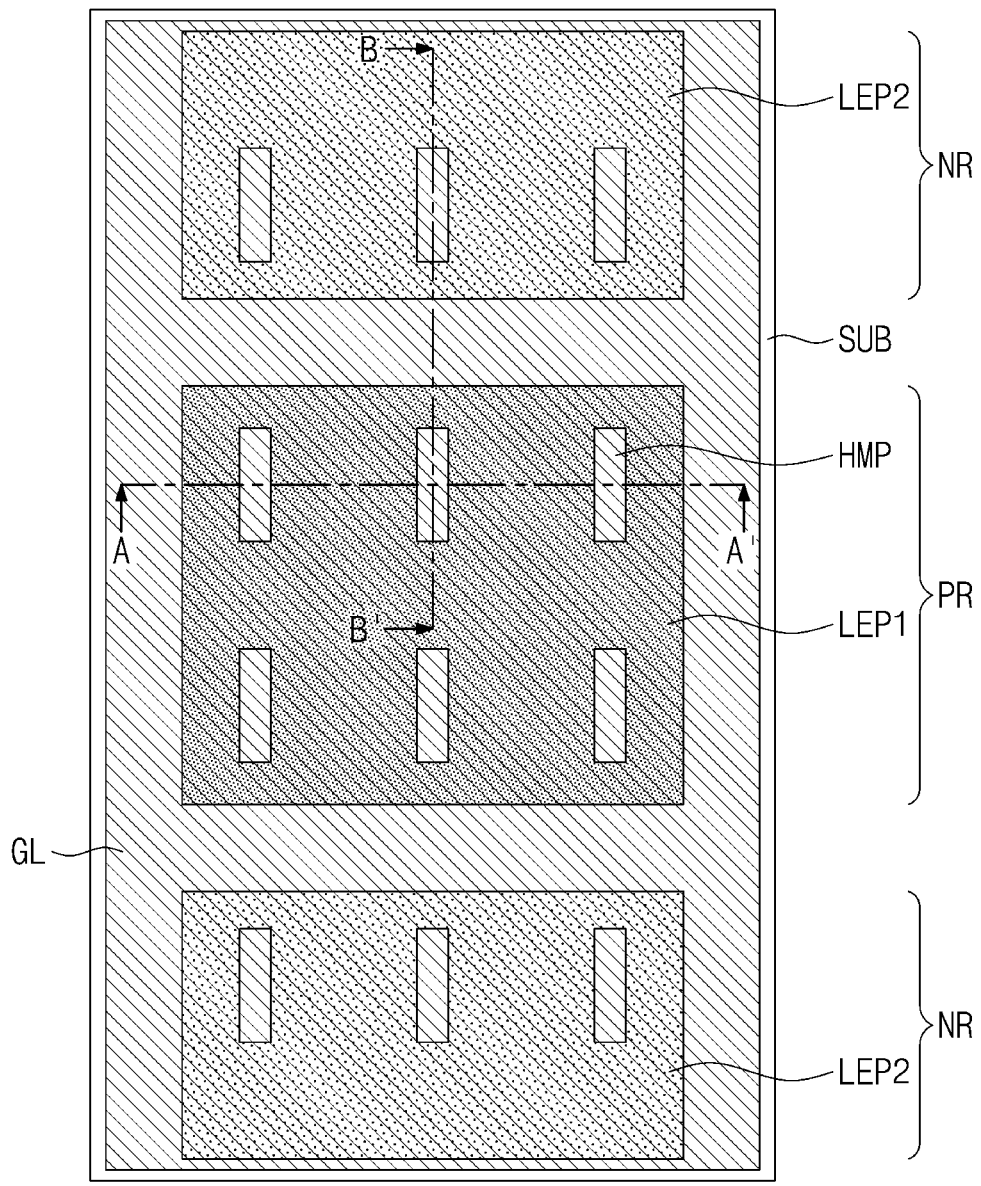
Figure 9A:
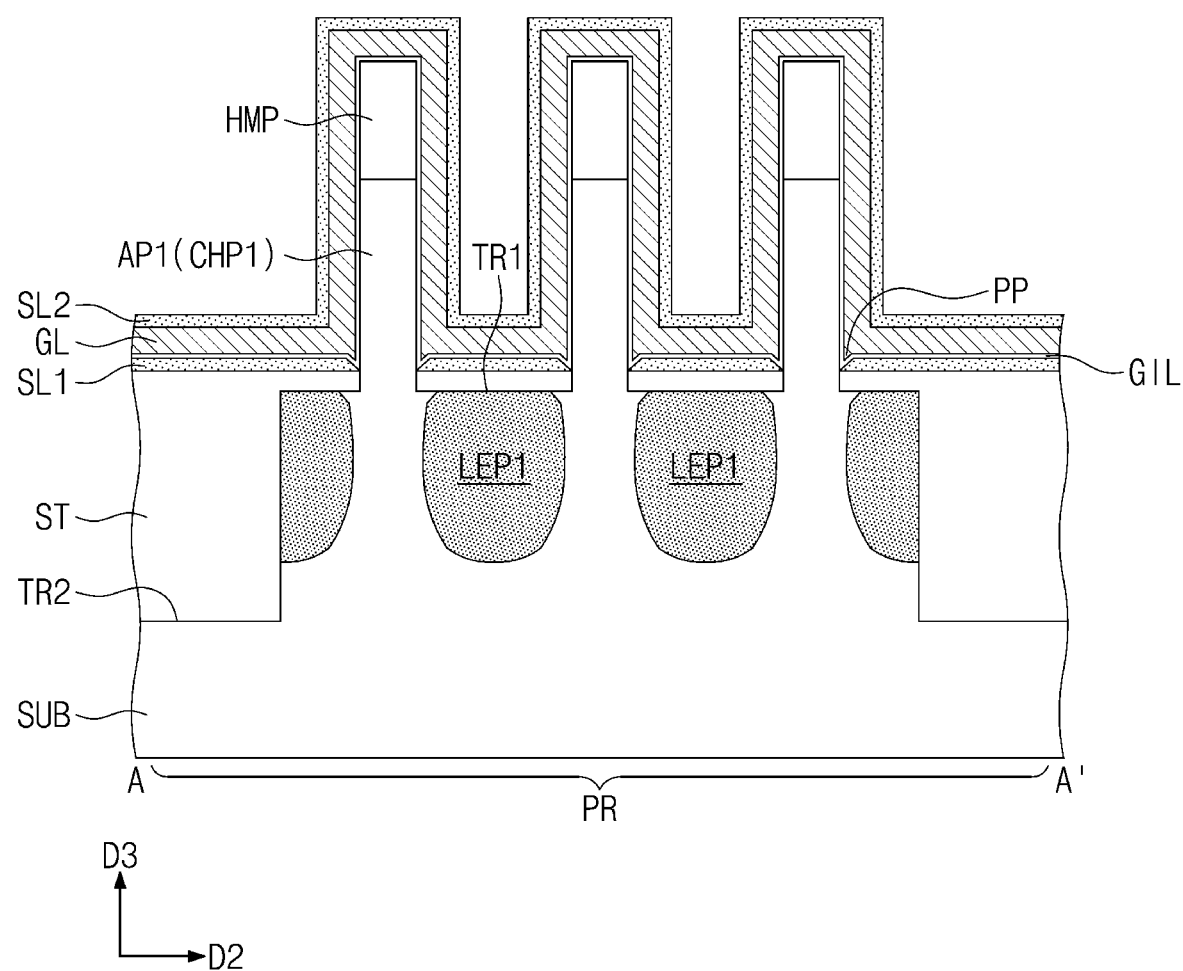
Figure 9B:
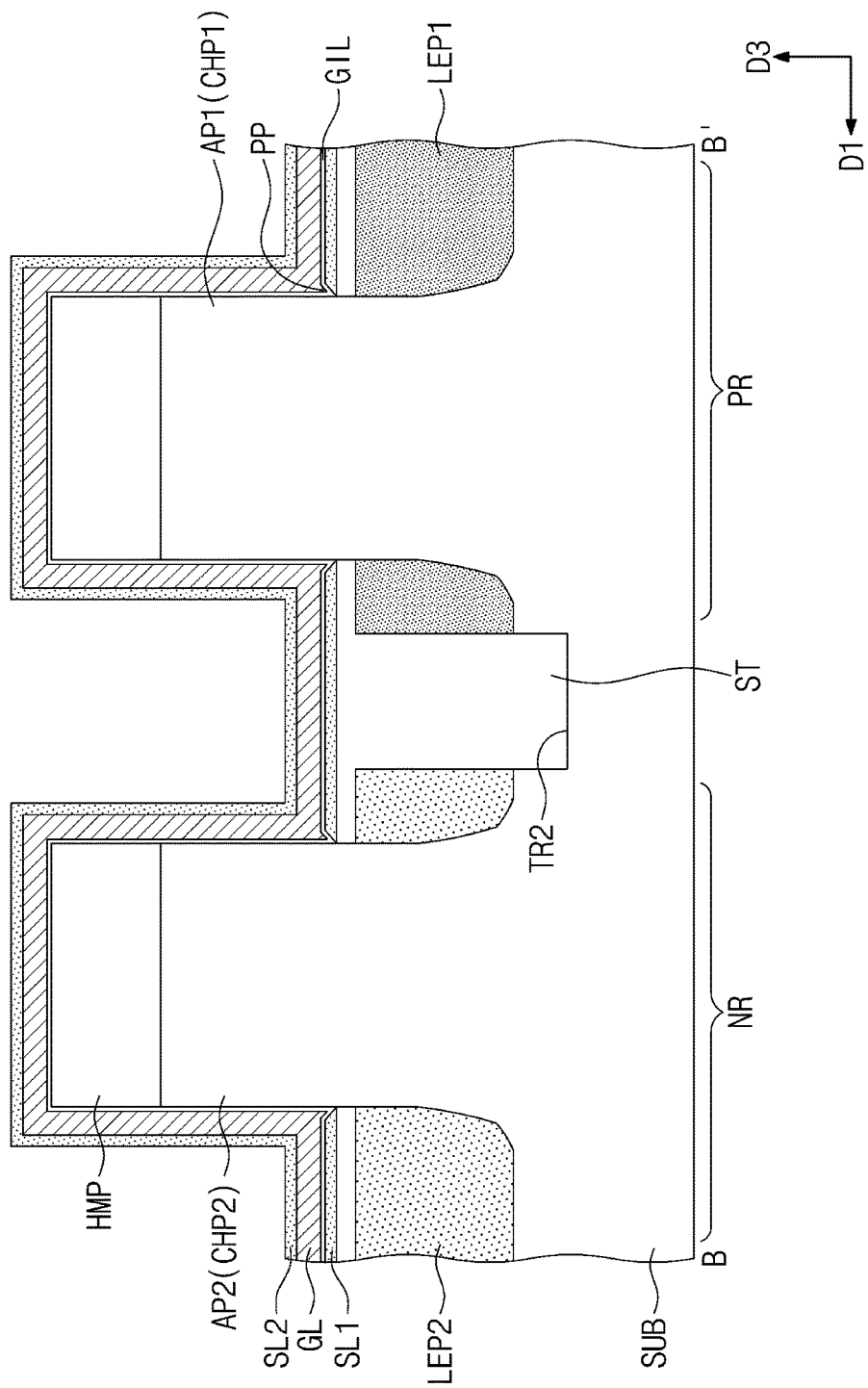

Referring to FIGS. 8, 9A, and 9B, a gate dielectric layer GIL and a gate electrode layer GL may be sequentially formed on the entire surface of the substrate SUB. The gate dielectric layer GIL may conformally cover the first spacer layer SL1, the first and second channel patterns CHP1 and CHP2, and the hardmask pattern HMP. The gate dielectric layer GIL may be formed by using atomic layer deposition (ALD) or chemical vapor deposition (CVD). The gate dielectric layer GIL may include or may be formed of a silicon oxide layer, a silicon oxynitride layer, or a high-k dielectric material layer.

The gate electrode layer GL may be formed on the gate dielectric layer GIL. The gate electrode layer GL may conformally cover the gate dielectric layer GIL. The gate electrode layer GL may include or may be formed of one or more of a conductive metal nitride material and a metallic material. As the first spacer layer SL1 has the inclined sidewalls, the gate electrode layer GL may have a protrusion PP between the inclined sidewall of the first spacer layer SL1 and each of the first and second channel patterns CHP1 and CHP2.

A second spacer layer SL2 may be formed on the entire surface of the substrate SUB. The second spacer layer SL2 may include or may be formed of the same material as that of the first spacer layer SL1. The first and second spacer layers SL1 and SL2 may include or may be formed of a material having etch selectivity with respect to the gate electrode layer GL. For example, the second spacer layer SL2 may include or may be formed of one or more of SiCN, SiCON, and SiN. The second spacer layer SL2 may conformally cover the gate electrode layer GL.

Figure 10:
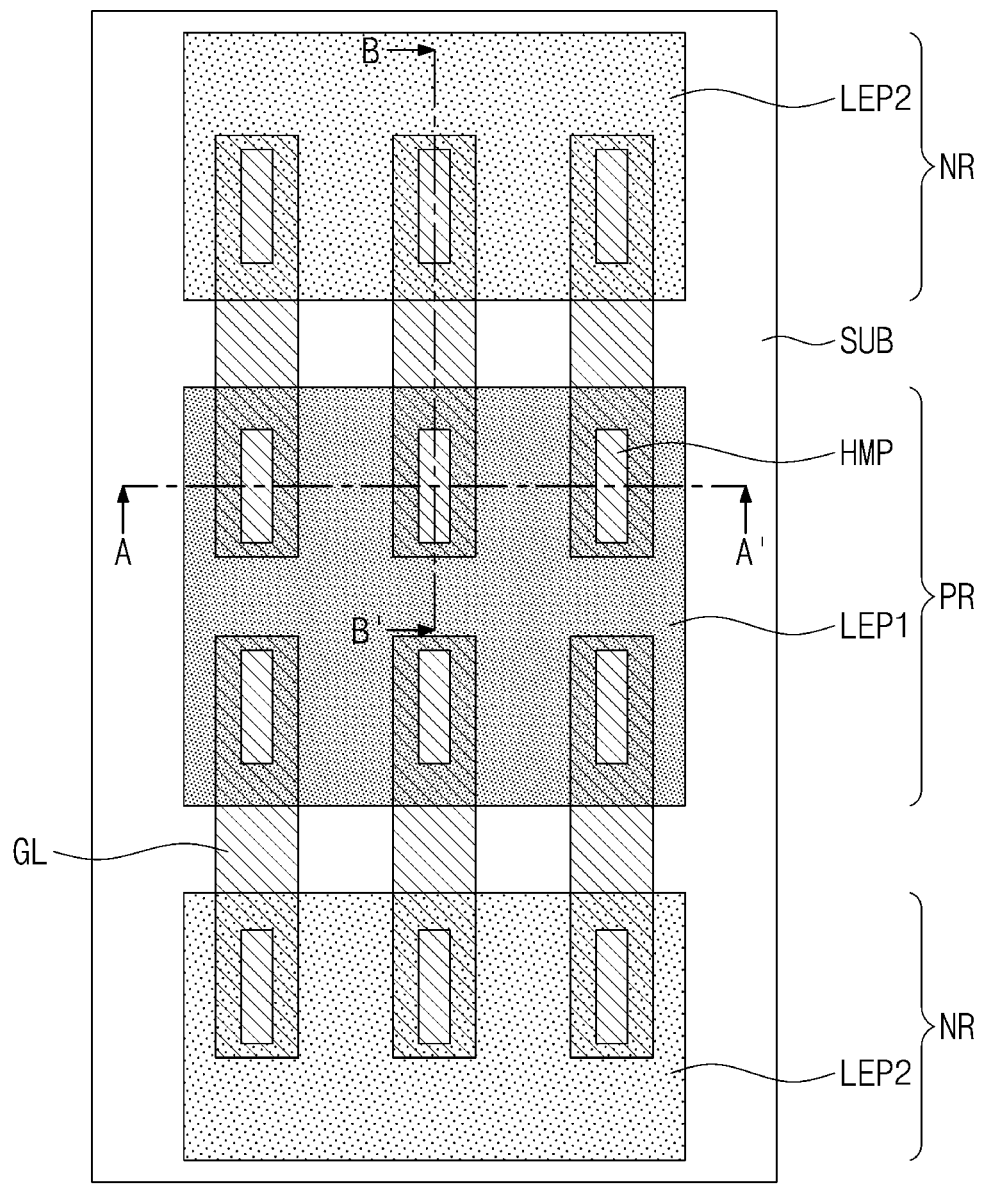
Figure 11A:
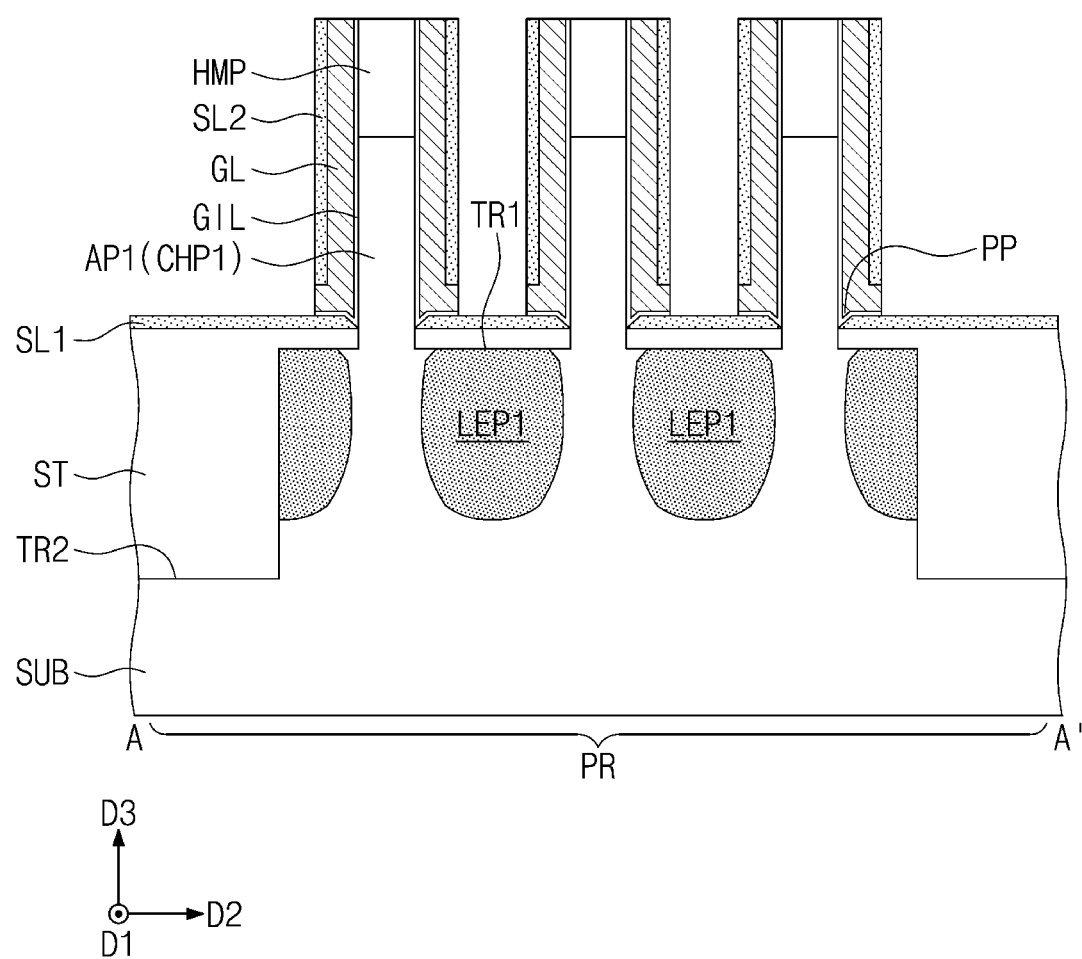
Figure 11B:
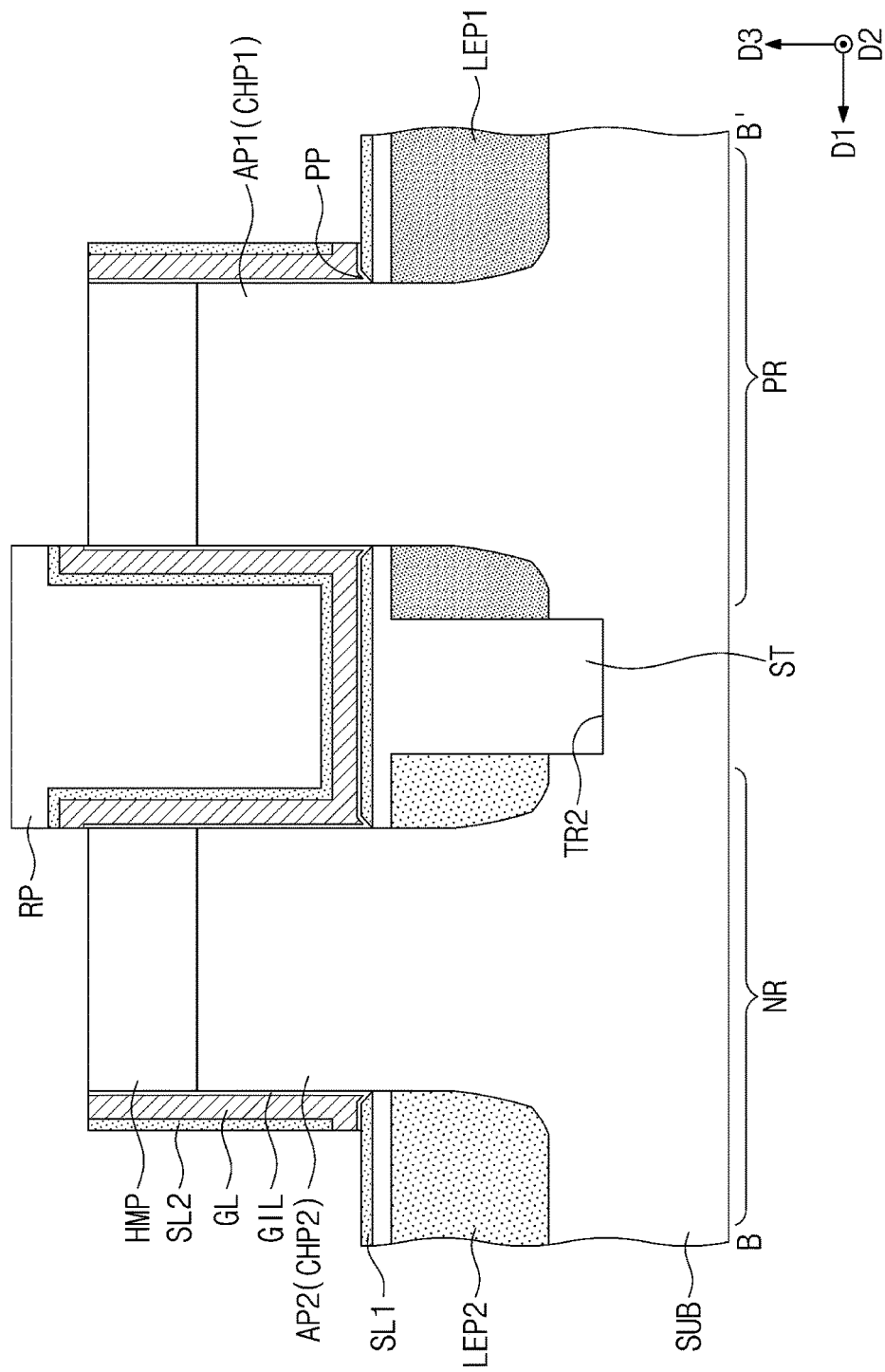

Referring to FIGS. 10, 11A, and 11B, an etching process may be performed to pattern the second spacer layer SL2 and the gate electrode layer GL. A dry etching process may be adopted as the etching process. The etching process may be a self-alignment etching process or a directional etching process. For example, the second spacer layer SL2, the gate electrode layer GL, and the gate dielectric layer GIL may be etched which are exposed when the substrate SUB is viewed in a plan view. The etching process may be carried out to expose a top surface of the hardmask pattern HMP. The etching process may be carried out to partially expose a top surface of the first spacer layer SL1. Therefore, the gate dielectric layer GIL, the gate electrode layer GL, and the second spacer layer SL2 may remain vertically to extend along sidewalls of the first and second channel patterns CHP1 and CHP2. The first spacer layer SL1 may be partially exposed between neighboring first channel patterns CHP1 and between neighboring second channel patterns CHP2.

The gate electrode layer GL may be patterned to form a plurality of gate electrode layers GL. The gate electrode layers GL may extend parallel to each other in a first direction D1. The gate electrode layer GL may surround sidewalls of the first and second channel patterns CHP1 and CHP2, while extending in the first direction D1. In an embodiment, when the substrate SUB is viewed in a plan view, each of the gate electrode layers GL may have a rectangular shape of which long sides extend in the first direction D1, and short sides extend in the second direction D2. Two gate electrode layers GL adjacent to each other in the first direction D1 may be arranged such that a short side of one of the two gate electrode layers GL may face a short side of the other. Two gate electrode layers GL adjacent to each other in the second direction D2 may be arranged such that a long side of one of the two gate electrode layers GL may face a long side of the other. In an embodiment, each of the gate electrode layers GL may overlap the first active region PR and the second active region NR adjacent to each other in the first direction D1.

A resist pattern RP may be formed on the device isolation layer ST between the first and second channel patterns CHP1 and CHP2. The resist pattern RP may be formed on the second spacer layer SL2 between the first and second channel patterns CHP1 and CHP2. For example, the resist pattern RP may include or may be formed of a photoresist material. The presence of the resist pattern RP may cause the gate electrode layer GL to extend in the first direction D1 along the sidewalls of the first and second channel patterns CHP1 and CHP2. For example, no removal may be performed on the gate electrode layer GL that runs across the device isolation layer ST between the first and second channel patterns CHP1 and CHP2.

Figure 12:
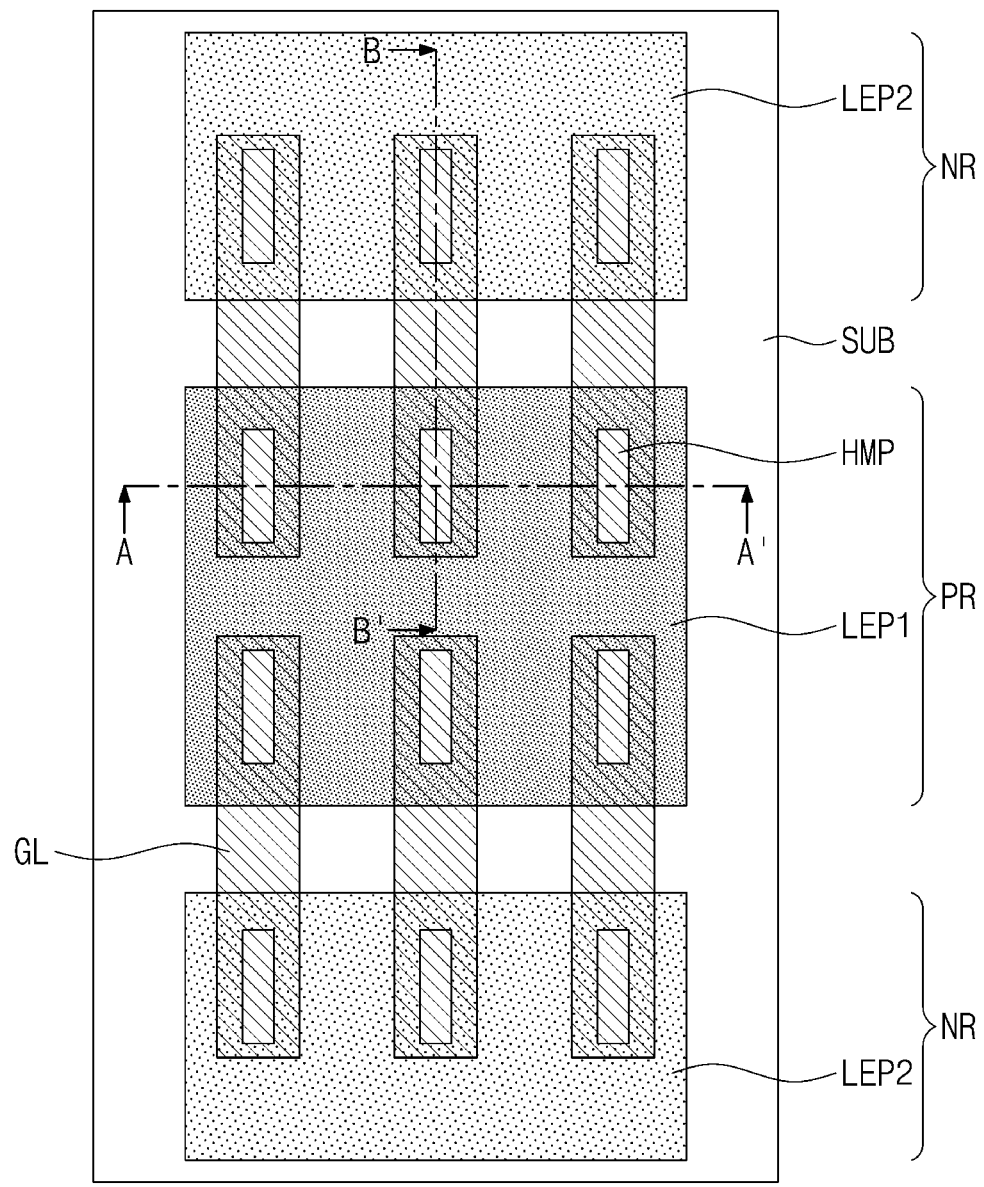
Figure 13A:
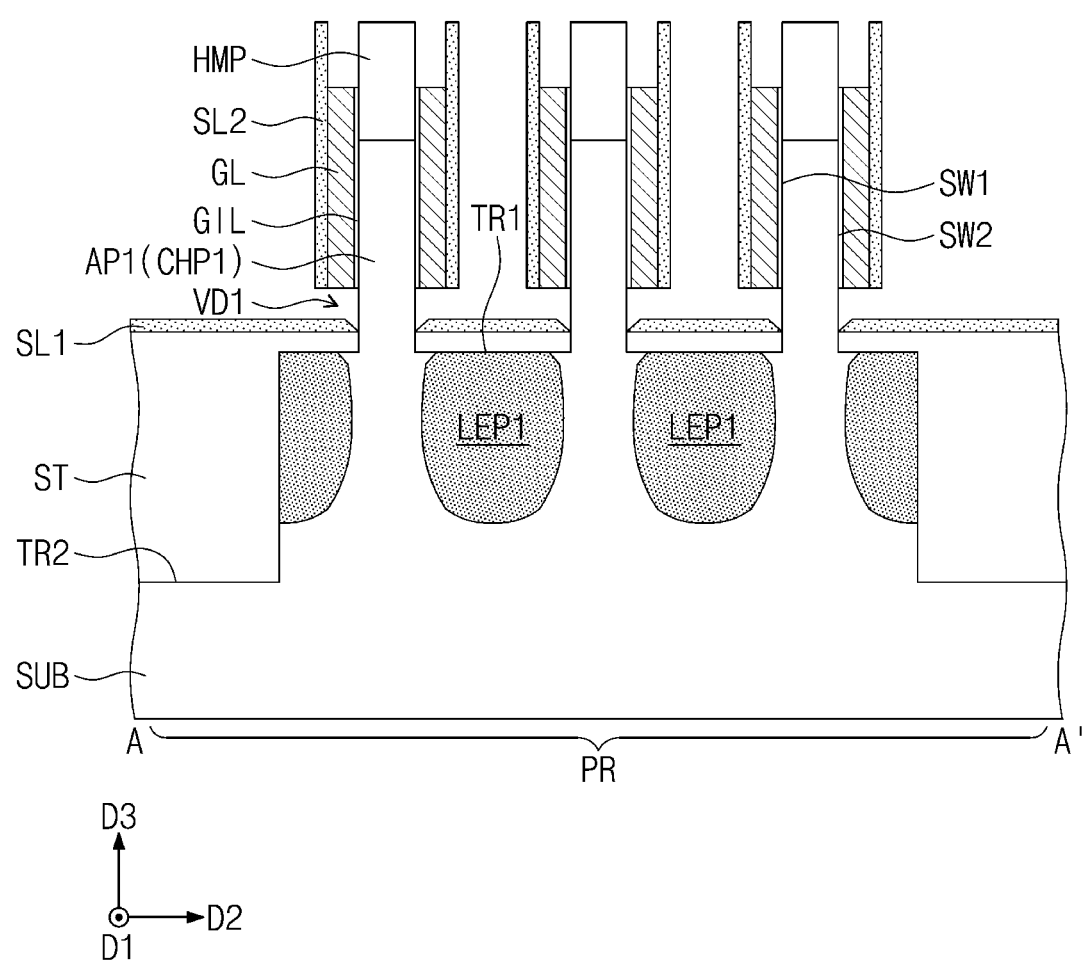
Figure 13B:
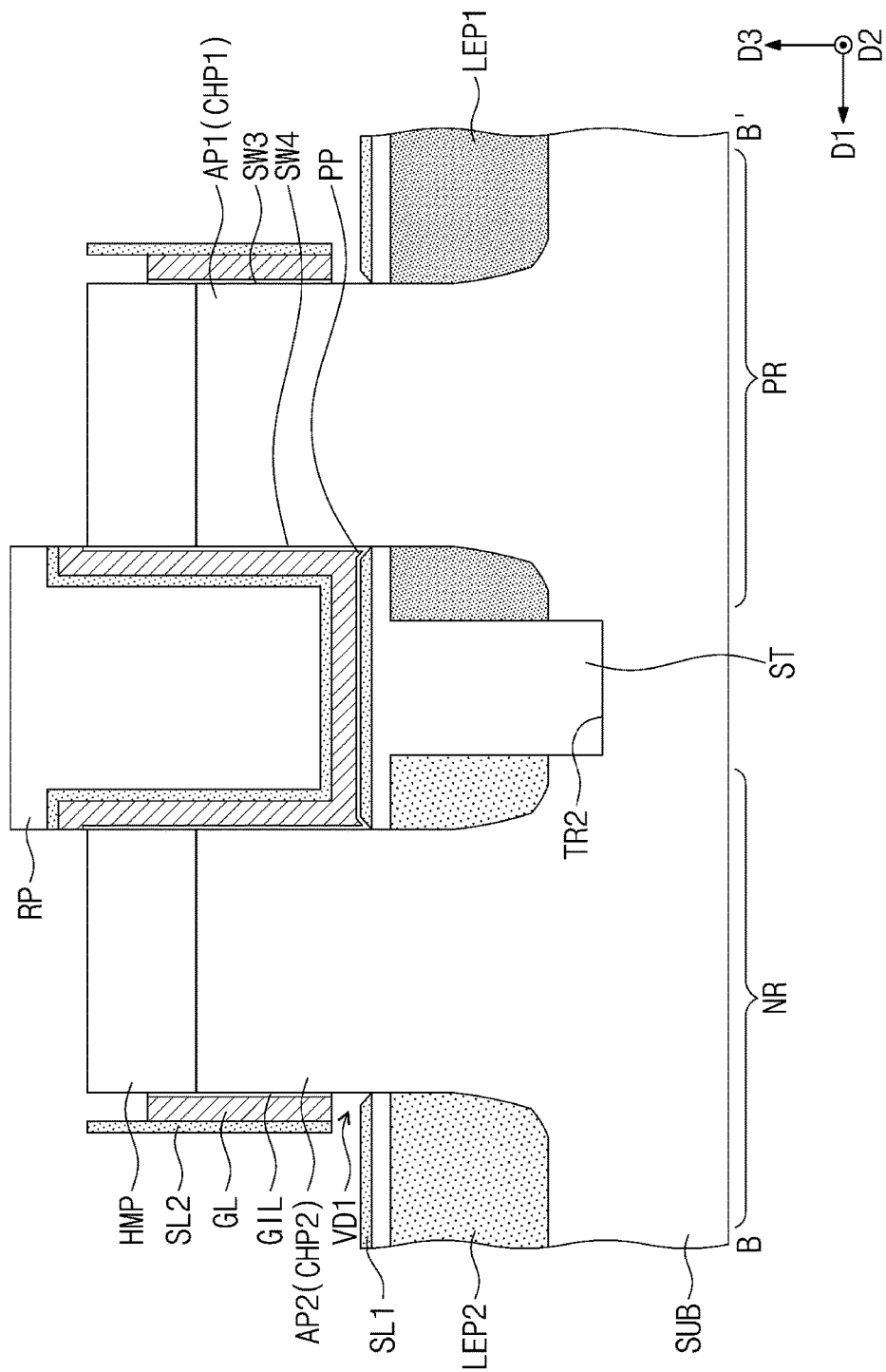

Referring to FIGS. 12, 13A, and 13B, an etching process may be performed on the gate electrode layer GL. A wet etching process may be adopted as the etching process. The etching process may partially remove upper and lower portions of the gate electrode layer GL. The etching process may also remove the gate dielectric layer GIL that corresponds to the removed gate electrode layer GL. As the first and second spacer layers SL1 and SL2 include a material having etch selectivity with respect to the gate electrode layer GL, none of the first and second spacer layers SL1 and SL2 may be removed by the wet etching process.

The resist pattern RP may remain on the second spacer layer SL2 between the first and second channel patterns CHP1 and CHP2, and therefore the gate electrode layer GL may extend in the first direction D1 along the first and second channel patterns CHP1 and CHP2.

The etched gate electrode layer GL and the etched gate dielectric layer GIL may have their top surfaces at a lower level than that of the top surface of the hardmask pattern HMP. As the lower portions of the gate electrode layer GL and the gate dielectric layer GIL are removed, a first void VD1 may be formed below the gate electrode layer GL. For example, the gate electrode layer GL may be removed at its portion that extends toward the first and second lower epitaxial patterns LEP1 and LEP2. In an embodiment, the lower portions, adjacent to the first and second lower epitaxial patterns LEP1 and LEP2, of the gate electrode layer GL may be removed so that the first voids VD1 are formed to expose lower portions of the first channel patterns CHP1 and lower portions of the second channel patterns CHP2. The first void VD1 may be an empty space formed between the gate electrode layer GL and the first spacer layer SL1. The etching process may control a removed amount of the gate electrode layer GL. For example, an etching rate and the like may be controlled to variously change a length of a gate electrode GE which will be discussed below.

Each of the first and second channel patterns CHP1 and CHP2 may have a first sidewall SW1 and a second sidewall SW2 that face each other in a second direction D2, and may also have a third sidewall SW3 and a fourth sidewall SW4 that face each other in the first direction D1. The fourth sidewall SW4 may be adjacent to the device isolation layer ST between the first and second channel patterns CHP1 and CHP2. The first void VD1 may be adjacent to the first, second, and third sidewalls SW1, SW2, and SW3. In an embodiment, each of the first channel patterns CHP1 may have a rectangular shape extending in the first direction D1 when the substrate SUB is viewed in a plan view. The long sides of the rectangular shape may extend in the first direction D1, and correspond to the first sidewall SW1 and the second sidewall SW2. The short sides of the rectangular shape may extend in the second direction D2, and correspond to the third sidewall SW3 and the fourth sidewall SW4. Two first channel patterns CHP1 adjacent to each other in the first direction D1 may be arranged such that a short side of one of the two first channel patterns CHP1 may face a short side of the other. Two first channel patterns CHP1 adjacent to each other in the second direction D2 may be arranged such that a long side of one of the two first channel patterns CHP1 may face a long side of the other. A first channel pattern CHP1 and a second channel pattern CHP2 adjacent to each other in the first direction D1 may be arranged such that a short side of the first channel pattern CHP1 may face a short side of the second channel pattern CHP2. A first channel pattern CHP1 and a second channel pattern CHP2 adjacent to each other in the second direction D2 may be arranged such that a long side of the first channel pattern CHP1 may face a long side of the second channel pattern CHP2. In an embodiment, the gate electrode layer GL, the first channel patterns CHP1, and the second channel patterns CHP2 may extend in the same direction of the first direction D1.

The presence of the resist pattern RP may prevent removal of the gate electrode layer GL and the gate dielectric layer GIL that are adjacent to the fourth sidewalls SW4. Therefore, the protrusion PP of the gate electrode layer GL may remain between the first spacer layer SL1 and the fourth sidewalls SW4.

Figure 14A:
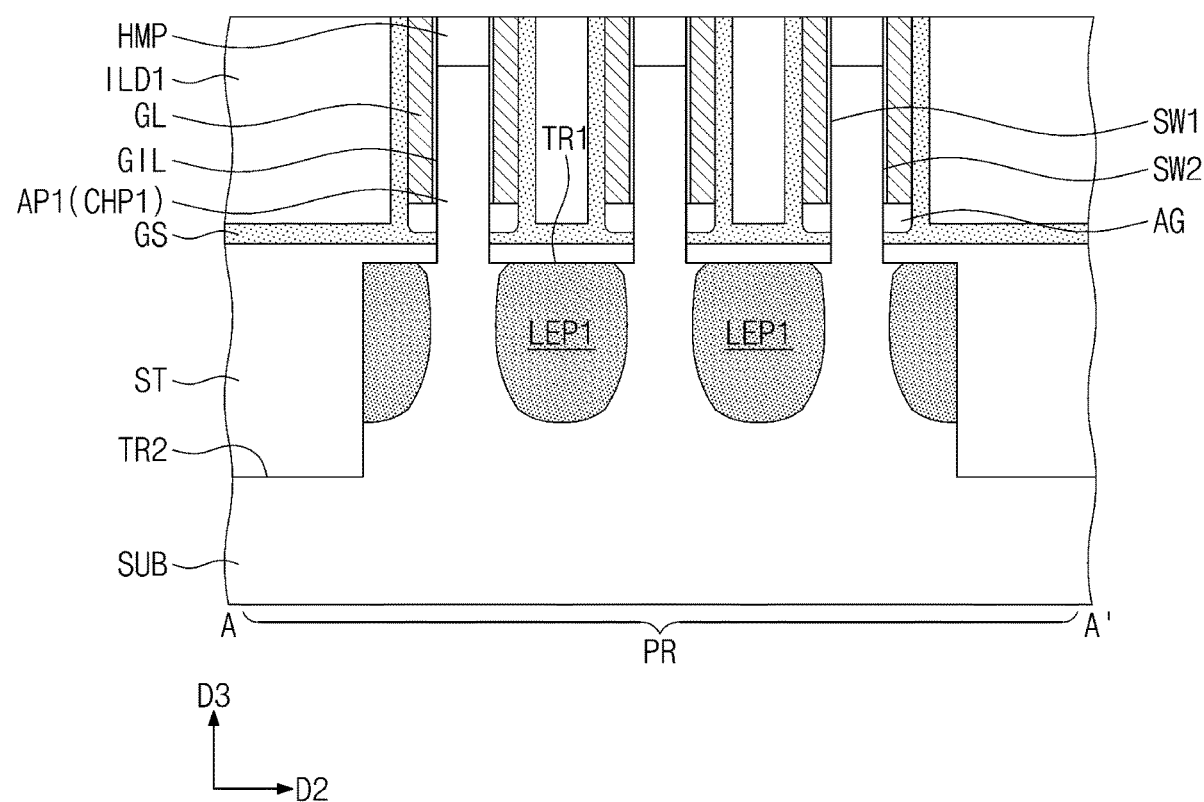
Figure 14B:
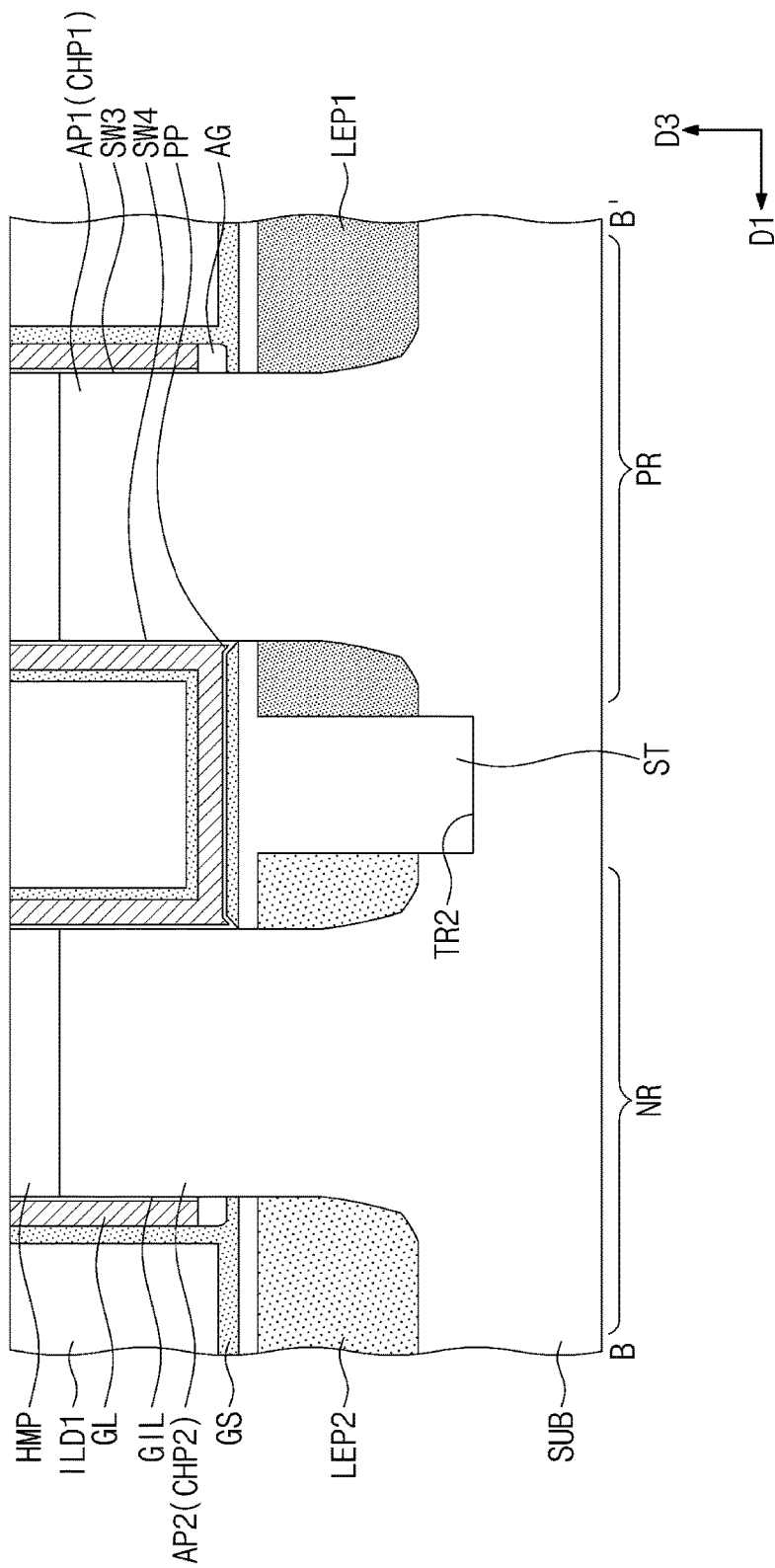

Referring to FIGS. 12, 14A, and 14B, the resist pattern RP may be removed and then a planarization process may be performed. The planarization process may be performed on the top surface of the etched gate electrode layer GL. For example, the planarization process may be performed on the second spacer layer SL2, the hardmask pattern HMP, and the gate electrode layer GL and the gate dielectric layer GIL between the first and second channel patterns CHP1 and CHP2.

After the planarization process is performed, a third spacer layer (not shown) may be additionally deposited between neighboring first channel patterns CHP1 and between neighboring second channel patterns CHP2. The third spacer layer may include or may be formed of the same material as that of the first and second spacer layers SL1 and SL2. The third spacer layer may be deposited on the first and second spacer layers SL1 and SL2.

The deposition of the third spacer layer may form a gate spacer GS on a sidewall of the gate electrode layer GL. In an embodiment, the third spacer layer may be merged with the first and second spacer layers SL1 and SL2 to form the gate spacer GS. The third spacer layer may be deposited by chemical vapor deposition (CVD) or physical vapor deposition (PVD). For example, the use of chemical vapor deposition (CVD) or physical vapor deposition (PVD) each having a poor step coverage may cause the third spacer layer to insufficiently fill the first void VD1. Therefore, an air gap AG may be formed below the gate electrode layer GL. In an embodiment, a deposition process of forming the third spacer layer may be controlled to have a step coverage such that the third spacer layer does not fill the first void VD1 and the air gap AG is formed. The air gaps AG may be formed to extend along the first, second, and third sidewalls SW1, SW2, and SW3 of each of the first and second channel patterns CHP1 and CHP2. The gate spacer GS may extend along the device isolation layer ST. No air gap is not present on the fourth sidewall SW4 on which the first void VD1 is not formed.

At least a portion of the gate spacer GS may be interposed between the device isolation layer ST and the gate electrode layer GL. For example, a portion of the gate spacer GS which is disposed on the device isolation layer ST between the first and second channel patterns CHP1 and CHP2 may be interposed between the device isolation layer ST and the gate electrode layer GL.

A first interlayer dielectric layer ILD1 may be formed on the gate spacer GS. The first interlayer dielectric layer ILD1 may include or may be formed of, for example, a silicon oxide layer or a silicon oxynitride layer. Afterwards, the planarization process may be performed on the first interlayer dielectric layer ILD1 to expose the top surface of the hardmask pattern HMP.

Figure 15:
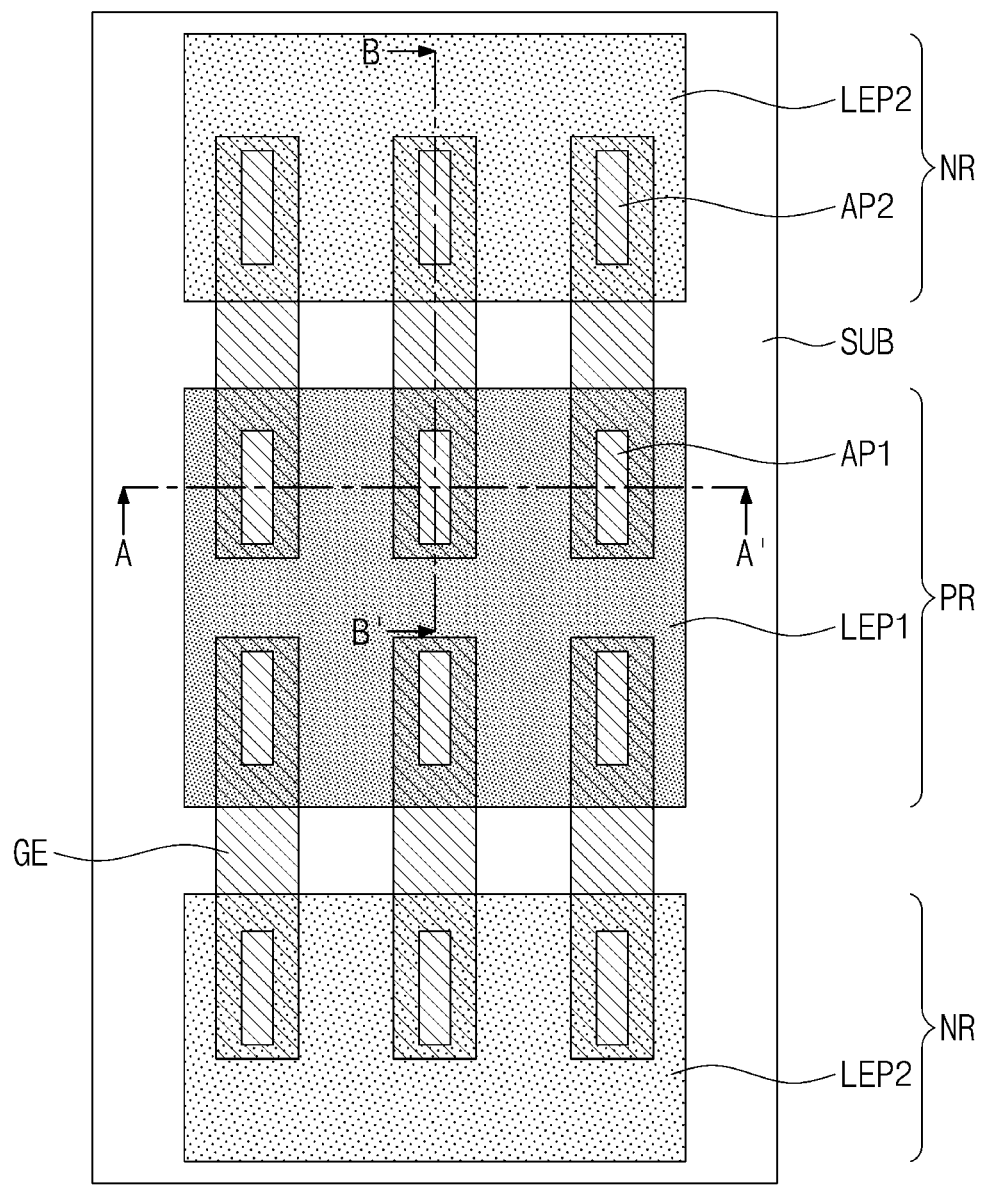
Figure 16A:
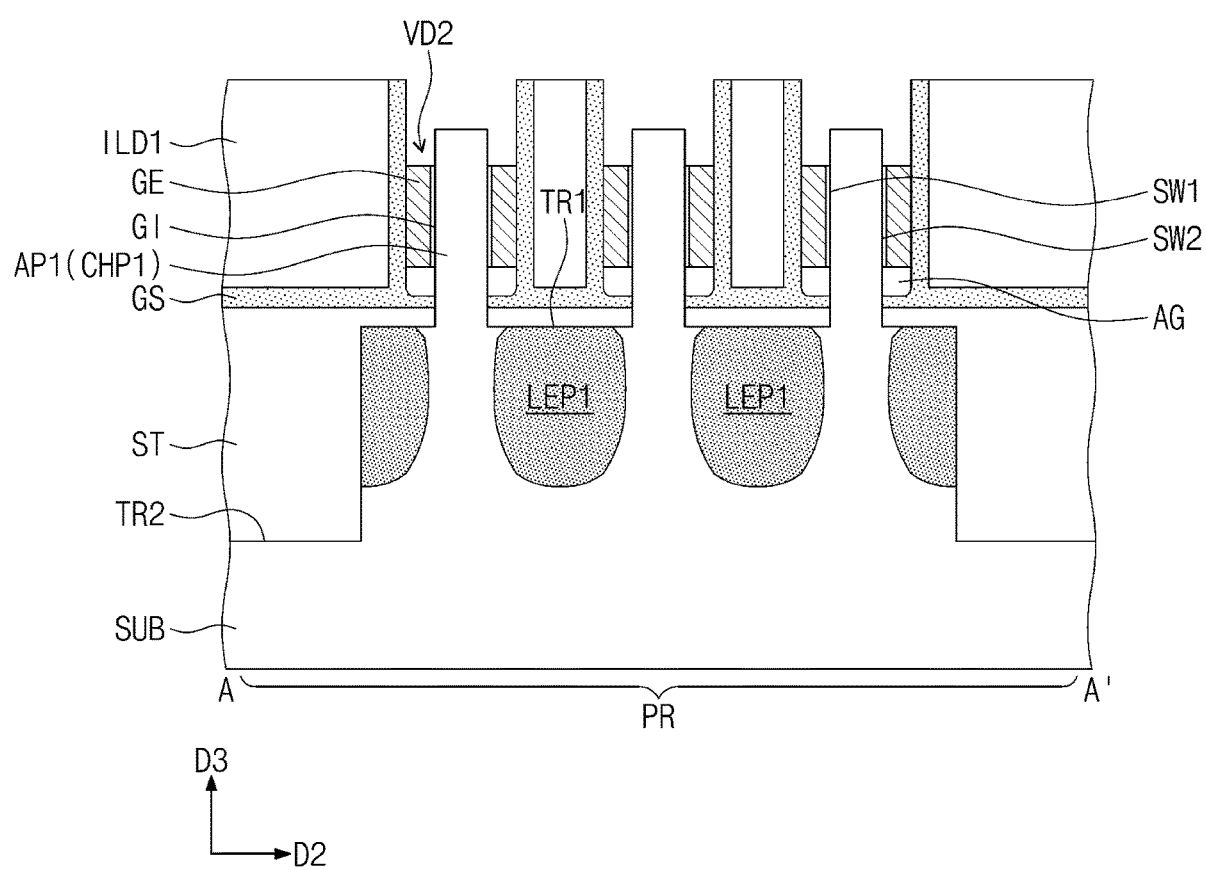
Figure 16B:
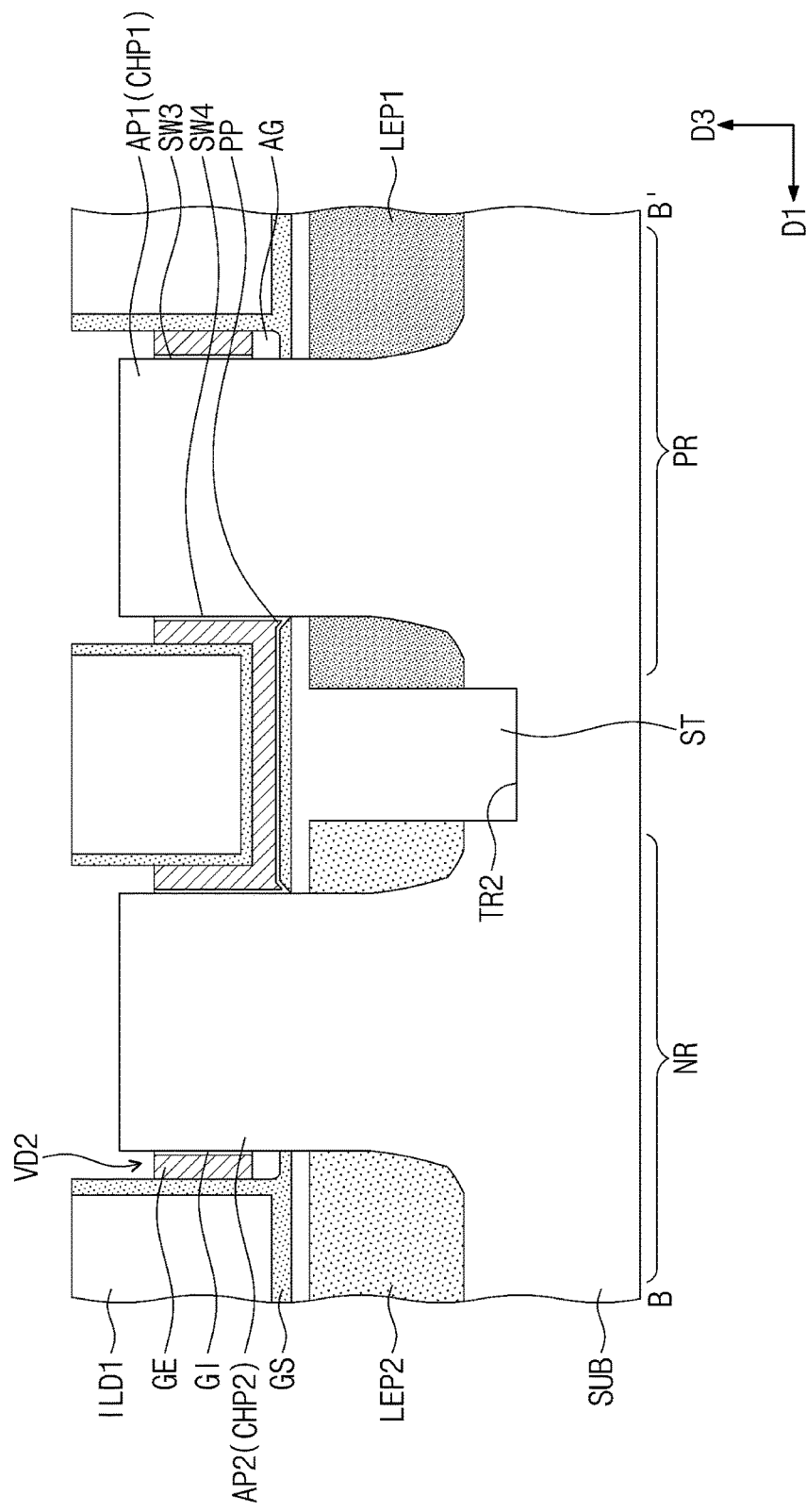

Referring to FIGS. 15, 16A, and 16B, the hardmask pattern HMP may be removed. For example, an ashing process may be performed to remove the hardmask pattern HMP.

After the hardmask pattern HMP is removed, an etching process may be performed again on the gate electrode layer GL. A wet etching process may be adopted as the etching process. Upper portions of the gate electrode layer GL and the gate dielectric layer GIL may be removed to eventually form a gate electrode GE and a gate dielectric pattern GI. As the gate spacer GS includes a material having etch selectivity with respect to the gate electrode layer GL, the gate spacer GS is not removed or may be barely removed by the wet etching process. For example, the gate electrode GE and the gate dielectric pattern GI may have their top surfaces at a lower level than that of top surfaces of the first and second channel patterns CHP1 and CHP2. Therefore, a second void VD2 may be formed on the gate electrode GE. The second void VD2 may be an empty space formed between the gate spacer GS and the sidewalls of each of the first and second channel patterns CHP1 and CHP2.

Figure 17A:
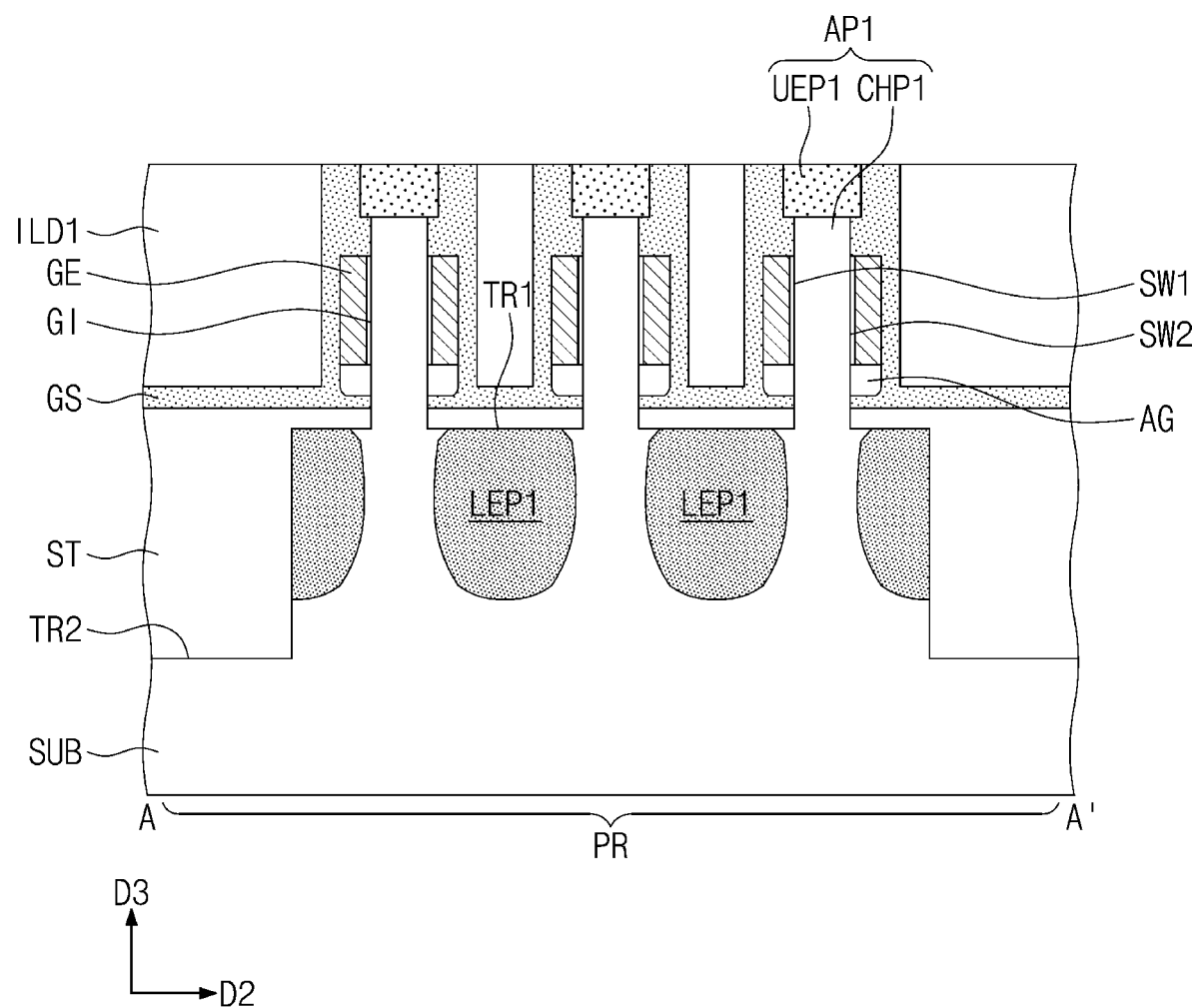
Figure 17B:
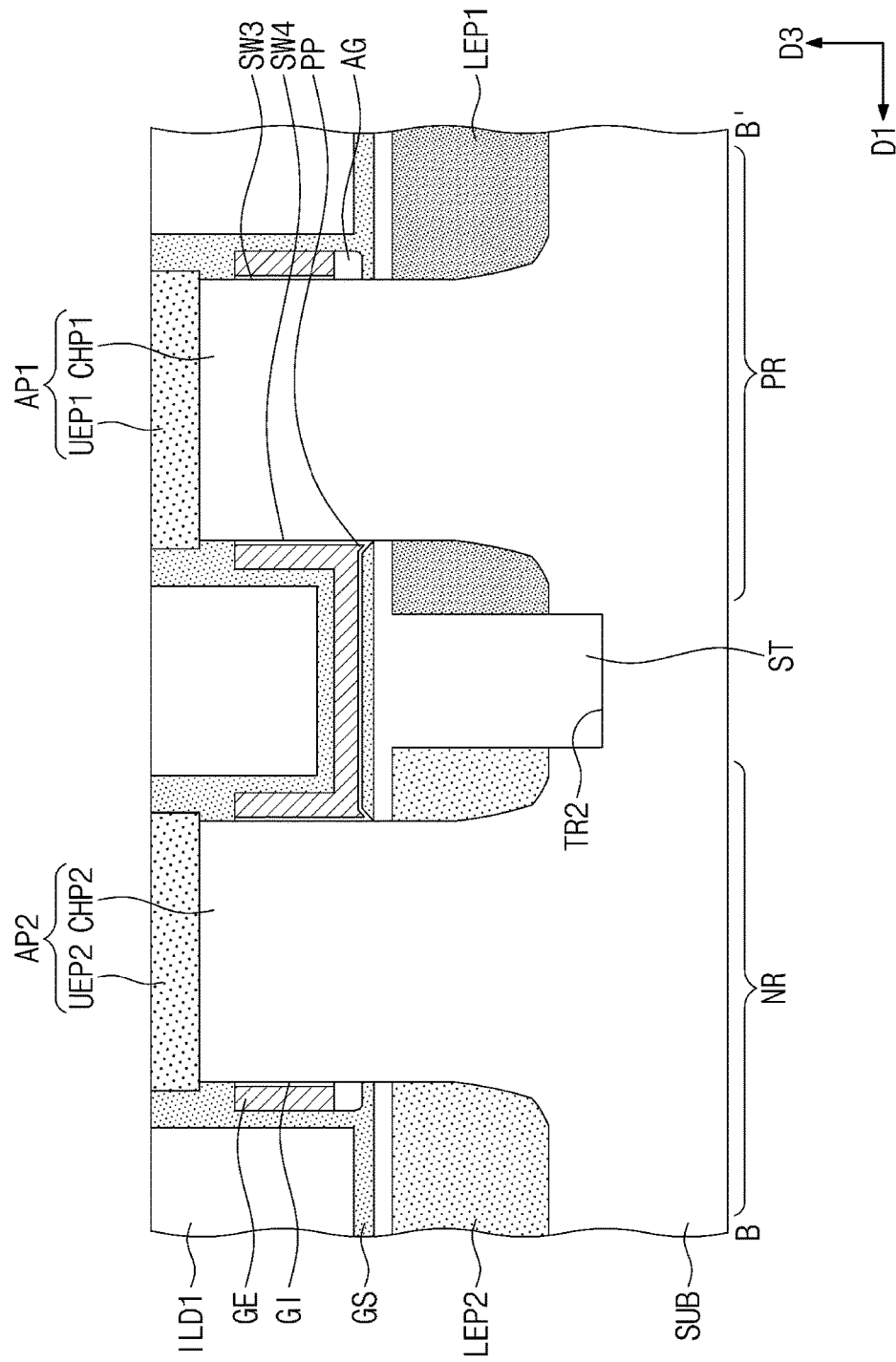

Referring to FIGS. 15, 17A, and 17B, a fourth spacer layer (not shown) may be additionally deposited on the first and second channel patterns CHP1 and CHP2. The fourth spacer layer may include or may be formed of the same material as that of the gate spacer GS. The fourth spacer layer may fill the second void VD2 and may cover the top surfaces of the first and second channel patterns CHP1 and CHP2. For example, the fourth spacer layer is deposited on the gate spacer GS, and the gate spacer GS may cover the top surface of the gate electrode GE. The gate spacer GS may have a top surface coplanar with that of the first interlayer dielectric layer ILD1.

Thereafter, an upper portion of the gate spacer GS may be partially removed to expose the top surfaces of the first and second channel patterns CHP1 and CHP2. A selective epitaxial growth process may be performed on the exposed top surfaces of the first and second channel patterns CHP1 and CHP2 to form first and second upper epitaxial patterns UEP1 and UEP2 on the first and second channel patterns CHP1 and CHP2, respectively. The first channel pattern CHP1 and the first upper epitaxial pattern UEP1 may constitute a first active pattern AP1. The second channel pattern CHP2 and the second upper epitaxial pattern UEP2 may constitute a second active pattern AP2.

The first and second upper epitaxial patterns UEP1 and UEP2 may be respectively grown from the first and second channel patterns CHP1 and CHP2 each of which serves as a seed, and may thus have the same crystalline structures as those of the first and second channel patterns CHP1 and CHP2, respectively. For example, the first and second upper epitaxial patterns UEP1 and UEP2 may include or may be formed of one or more of silicon, germanium, and silicon-germanium. The first upper epitaxial pattern UEP1 may be doped to have a first conductivity type, and the second upper epitaxial pattern UEP2 may be doped to have a second conductivity type.

Figure 18:
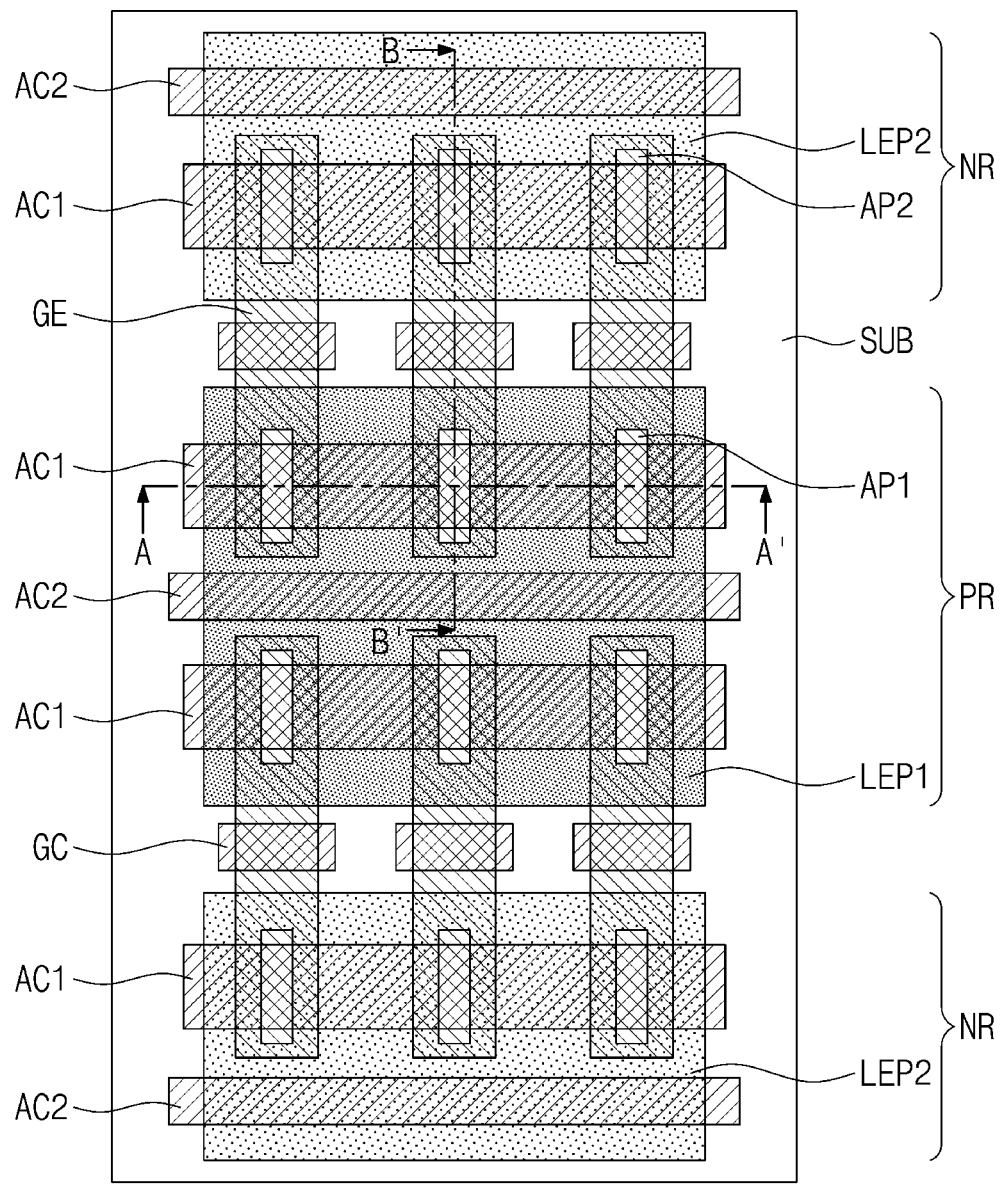
Figure 19A:
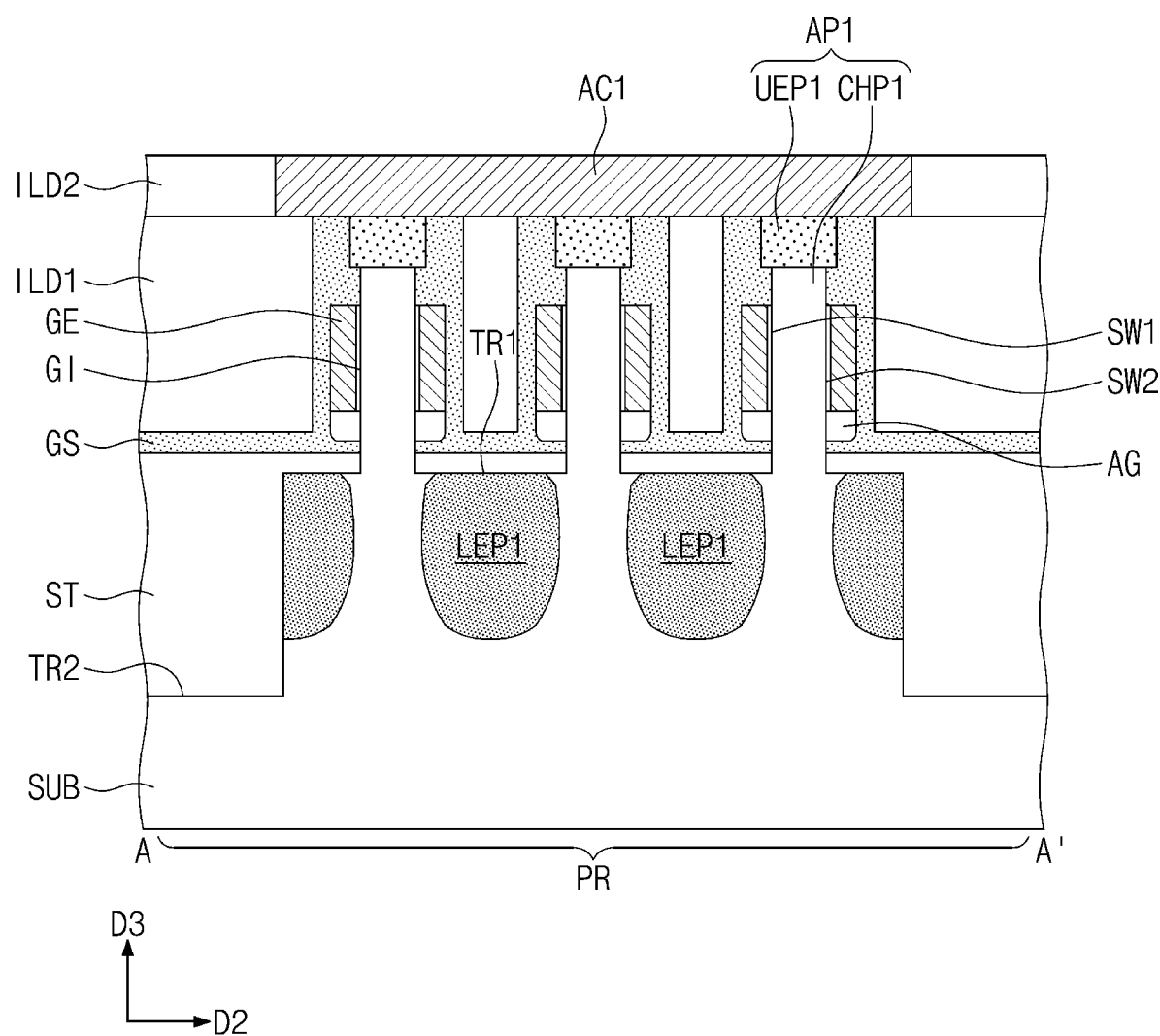
Figure 19B:
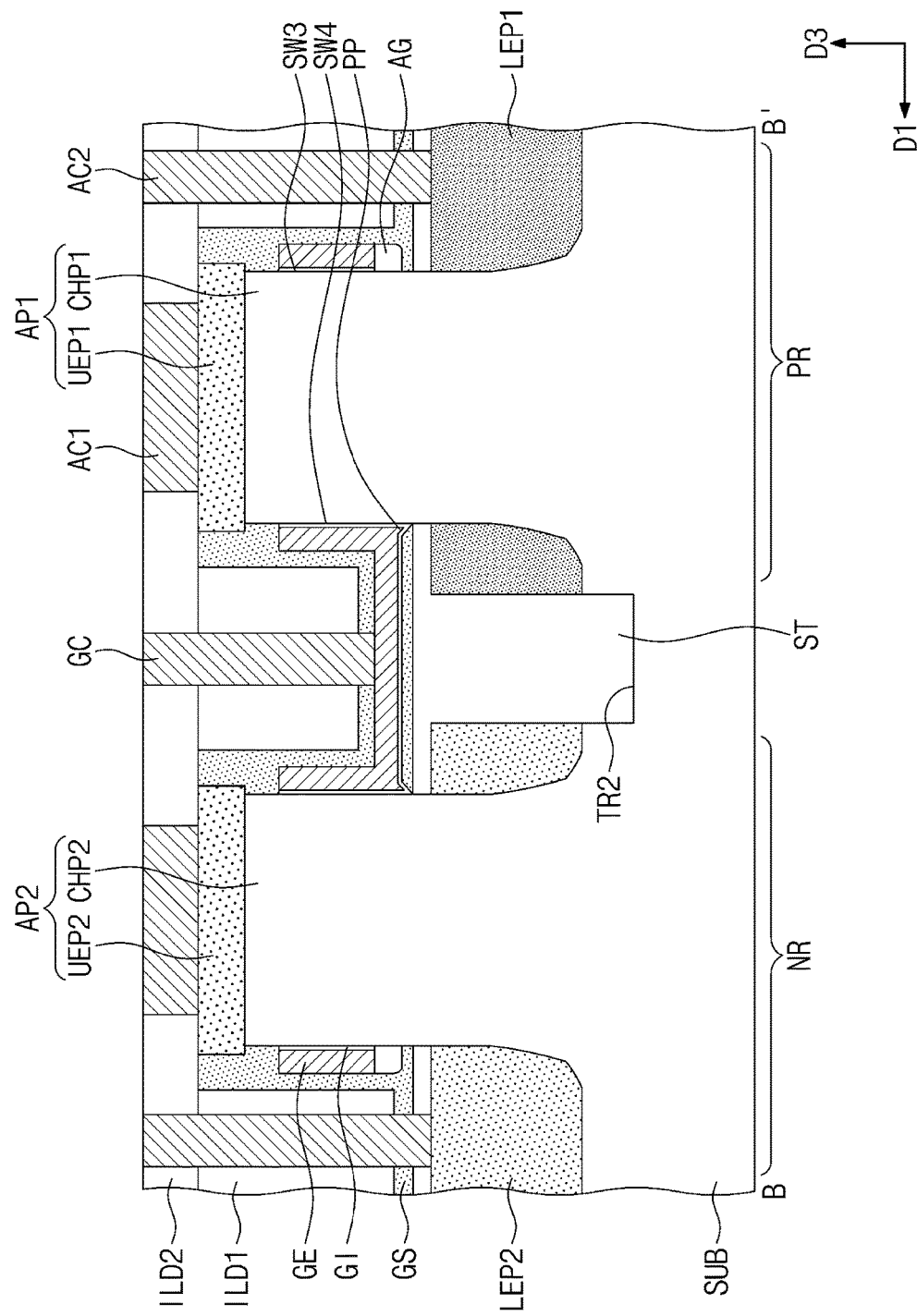

Referring to FIGS. 18, 19A, and 19B, a second interlayer dielectric layer ILD2 may be formed on the first interlayer dielectric layer ILD1. The second interlayer dielectric layer ILD2 may include or may be formed of, for example, a silicon oxide layer or a silicon oxynitride layer.

A first active contact AC1 may be formed to penetrate the second interlayer dielectric layer ILD2. The first active contact AC1 may be coupled to one or more of the first and second upper epitaxial patterns UEP1 and UEP2. In an embodiment, when the substrate SUB is viewed in a plan view, the first active contact AC1 may extend in the second direction D2. For example, the first active contact AC1 may have a rectangular shape of which long sides extend in the second direction D2 and short sides extend in the first direction D1. The first active contact AC1 may overlap three first active patterns AP1 which are arranged in the second direction D2 or three second active patterns AP2 which are arranged in the second direction D2. The present inventive concept is not limited thereto. In an embodiment, the first active contact AC1 may overlap less than or more than three first active patterns AP1 which are arranged in the second direction D2, or less than or more than three second active patterns AP2 which are arranged in the second direction D2.

A second active contact AC2 may be formed to penetrate the first and second interlayer dielectric layers ILD1 and ILD2. The second active contact AC2 may additionally penetrate the gate spacer GS and the device isolation layer ST. The second active contact AC2 may be coupled to one or more of the first and second lower epitaxial patterns LEP1 and LEP2. In an embodiment, when the substrate SUB is viewed in a plan view, the second active contact AC2 may extend in the second direction D2. For example, the second active contact AC2 may have a rectangular shape of which long sides extend in the second direction D2 and short sides extend in the first direction D1. The second active contact AC2 may be disposed between a first short side of one of two gate electrodes GE adjacent to each other in the first direction D1, and a second short side of the other. The first short side and the second short side may face each other in the first direction D1.

A gate contact GC may be formed to penetrate the first and second interlayer dielectric layers ILD1 and ILD2. The gate contact GC may additionally penetrate the gate spacer GS. The gate contact GC may be coupled to the gate electrode GE. When the substrate SUB is viewed in a plan view, the gate contact GC may be formed between the first and second active patterns AP1 and AP2. In an embodiment, the gate contact GC may overlap a portion of the device isolation layer ST disposed between the first active region PR and the second active region NR which are spaced apart from each other in the first direction D1.

The first and second active contacts AC1 and AC2 may have their top surfaces substantially coplanar with that of the gate contact GC. The gate contact GC may have a bottom surface at a higher level than that of a bottom surface of the second active contact AC2.

Referring back to FIGS. 1 and 2A to 2D, a third interlayer dielectric layer ILD3 and a fourth interlayer dielectric layer ILD4 may be sequentially formed on the second interlayer dielectric layer ILD2. The third and fourth interlayer dielectric layers ILD3 and ILD4 may include or may be formed of, for example, a silicon oxide layer or a silicon oxynitride layer.

A first metal layer M1 may be formed in the third interlayer dielectric layer ILD3. The first metal layer M1 may include first, second, and third power rails POR1, POR2, and POR3, first lines IL1 and first vias VI1.

The first, second, and third power rails POR1, POR2, and POR3 and the first lines IL1 may extend in the second direction D2. A damascene process may be used to form the first, second, and third power rails POR1, POR2, and POR3 and the first lines ILL The first vias VI1 may be formed below the first, second, and third power rails POR1, POR2, and POR3 and the first lines IL1.

A second metal layer M2 may be formed in the fourth interlayer dielectric layer ILD4. The second metal layer M2 may include second lines IL2 and second vias VI2. The second lines IL2 may extend in the first direction D1. A damascene process may be used to form the second lines IL2. The second vias VI2 may be formed below the second lines IL2. For the simplicity of drawing, the second metal layer M2 is omitted from FIG. 1.

Figure 20:
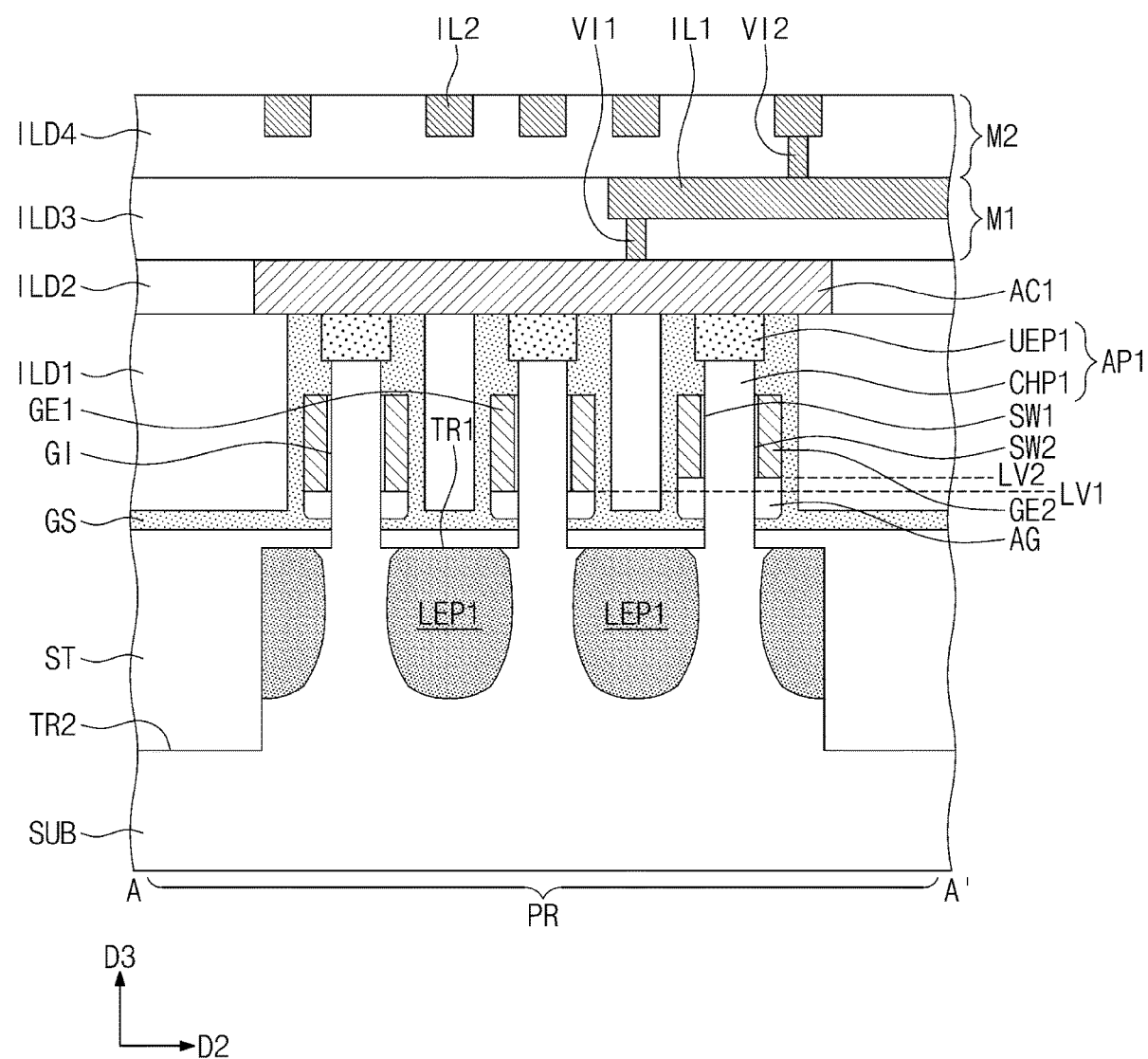
FIG. 20 illustrates a cross-sectional view taken along line A-A' of FIG. 1, showing a semiconductor device according to some example embodiments of the present inventive concepts.

FIG. 20 illustrates a cross-sectional view taken along line A-A' of FIG. 1, showing a semiconductor device according to some example embodiments of the present inventive concepts. In the embodiment that follows, a detailed description of technical features repetitive to those discussed above with reference to FIGS. 1 and 2A to 2D will be omitted, and a difference thereof will be discussed in detail.

Referring to FIGS. 1 and 20, a first gate electrode GE1 and a second gate electrode GE2 may each be provided to surround its adjacent first active pattern AP1. The first and second gate electrodes GE1 and GE2 may be spaced apart from each other in the second direction D2. The first gate electrode GE1 may have a bottom surface whose uppermost level is a first level LV1. The second gate electrode GE2 may have a bottom surface whose uppermost level is a second level LV2. The first and second levels LV1 and LV2 may be different from each other. For example, the first level LV1 may be lower than the second level LV2.

For example, when performing the etching process discussed with reference to FIGS. 13A and 13B or 16A and 16B, an etching rate and the like may be controlled to individually adjust lengths of the first and second gate electrodes GE1 and GE2. Accordingly, the first and second gate electrodes GE1 and GE2 may have various lengths.

Figure 21A:
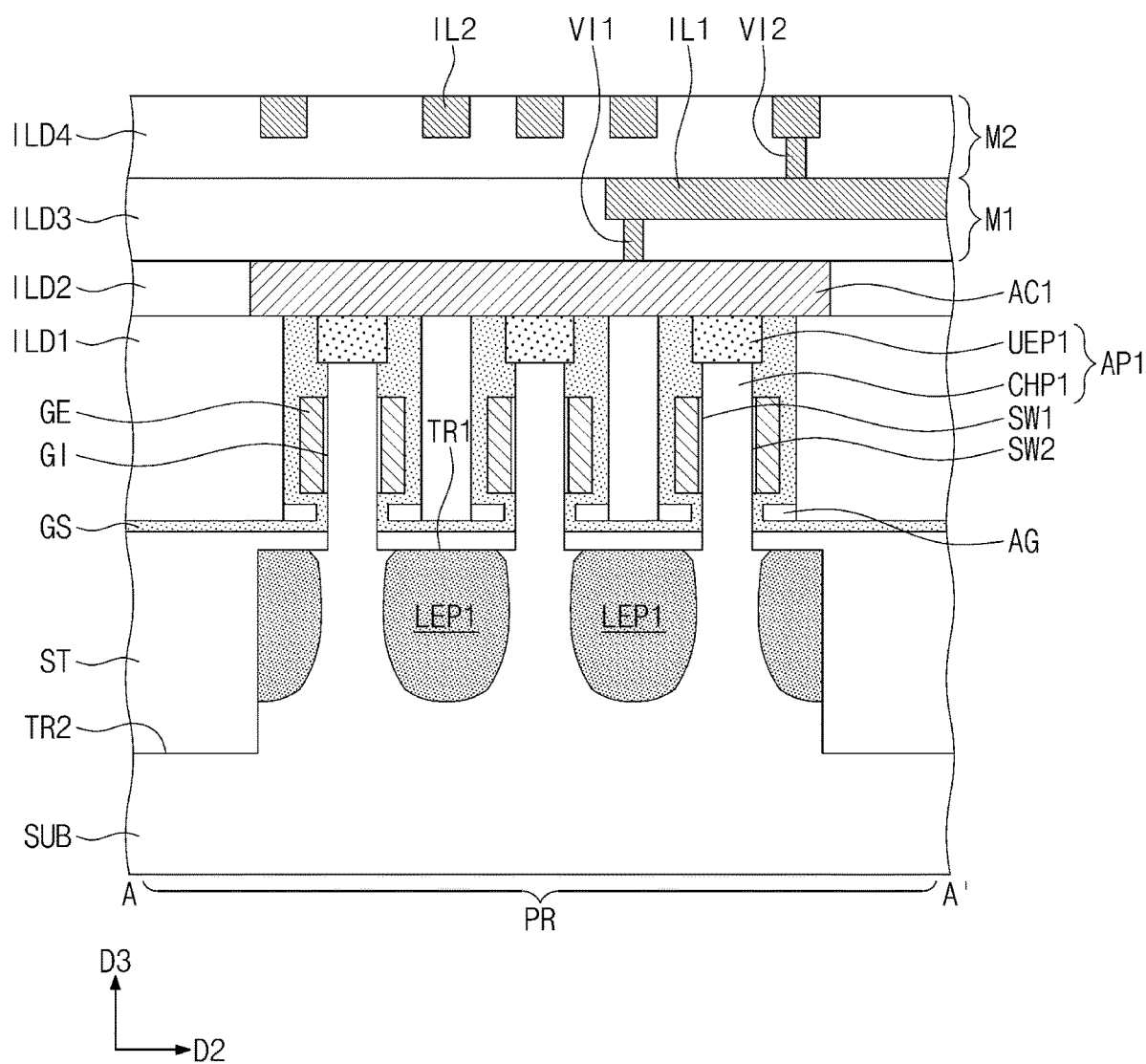
FIGS. 21A and 21B illustrate cross-sectional views respectively taken along lines A-A' and D-D' of FIG. 1, showing a semiconductor device according to some example embodiments of the present inventive concepts.
Figure 21B:
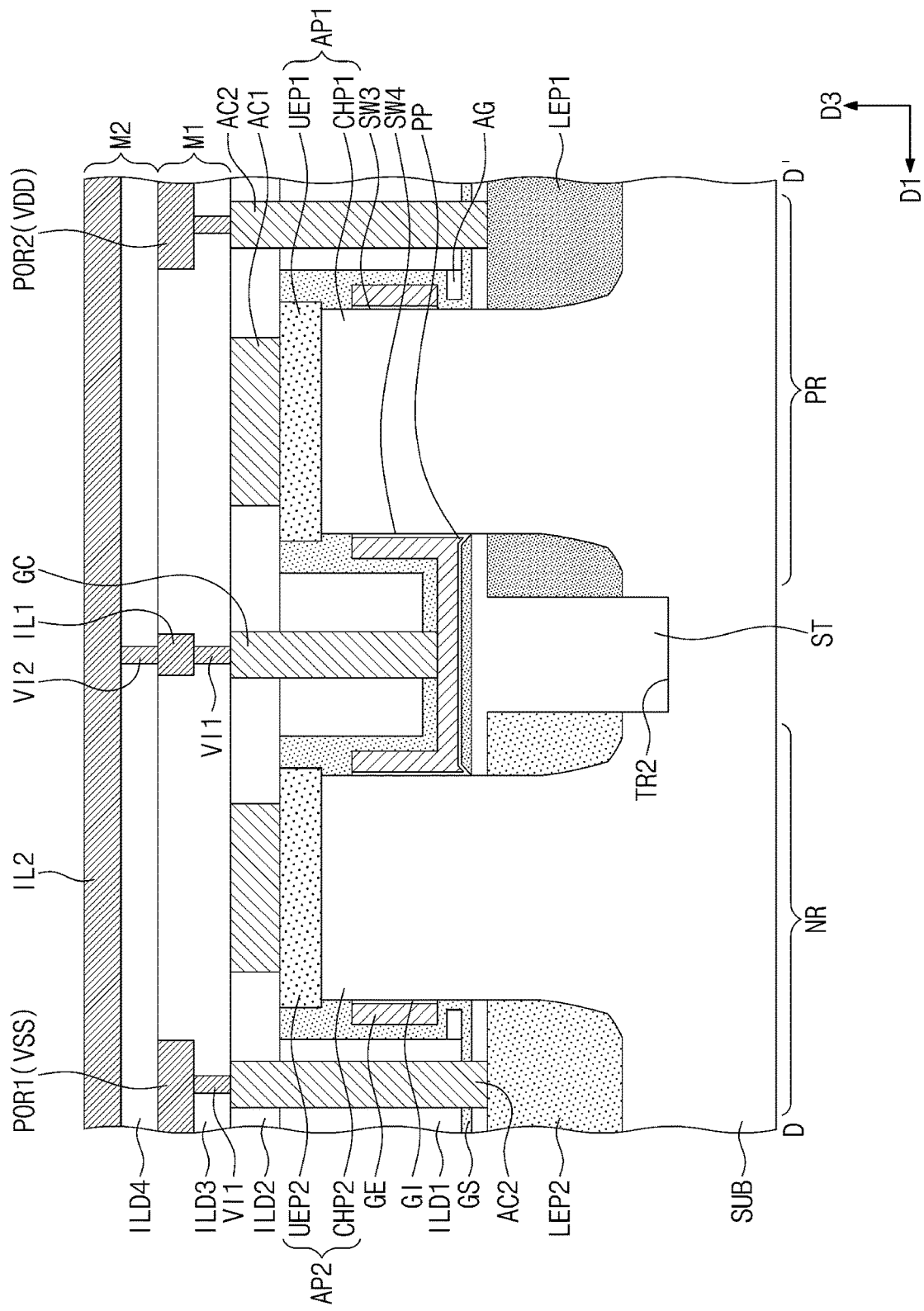

FIGS. 21A and 21B illustrate cross-sectional views respectively taken along lines A-A' and D-D' of FIG. 1, showing a semiconductor device according to some example embodiments of the present inventive concepts. In the embodiment that follows, a detailed description of technical features repetitive to those discussed above with reference to FIGS. 1 and 2A to 2D will be omitted, and a difference thereof will be discussed in detail.

Referring to FIGS. 1, 21A, and 21B, the gate spacer GS may extend along a bottom surface of the gate electrode GE. For example, the gate spacer GS may cover the bottom surface of the gate electrode GE. Therefore, the bottom surface of the gate electrode GE is not exposed by the gate spacer GS.

The gate spacer GS may extend along the sidewall and the top and bottom surfaces of the gate electrode GE. In addition, the gate spacer GS may extend along the sidewalls of the first and second channel patterns CHP1 and CHP2. The gate spacer GS may extend along upper and lower portion of the sidewalls of the first and second channel patterns CHP1 and CHP2. For example, four sidewalls SW1, SW2, SW3, and SW4 of each of the first and second channel patterns CHP1 and CHP2 are not exposed.

The air gap AG may be disposed between the gate electrode GE and the device isolation layer ST. The air gap AG may be disposed below the gate electrode GE. The air gap AG may be disposed between the first interlayer dielectric layer ILD1 and the gate spacer GS. For example, the air gap AG may be an empty space formed between the first interlayer dielectric layer ILD1 and the gate spacer GS. The air gap AG may be adjacent to the gate spacer GS. At least a portion of the air gap AG may vertically overlap the gate electrode GE.

The air gap AG may be formed by recessing a lower portion of the gate electrode GE. The air gaps AG may extend along the first, second, and third sidewalls SW1, SW2, and SW3 of each of the first and second channel patterns CHP1 and CHP2.

In the present embodiment, as the air gap AG is provided below the gate electrode GE, a spacing distance may be controlled between the gate electrode GE and the lower epitaxial pattern LEP1 or LEP2. Therefore, the gate electrode GE and the lower epitaxial patterns LEP1 and LEP2 may have therebetween reduced parasitic capacitance produced by the fact that the gate electrode GE partially extends toward the lower epitaxial patterns LEP1 and LEP2. As a result, a semiconductor device may operate faster owing to the reduced parasitic capacitance.

Figure 22A:
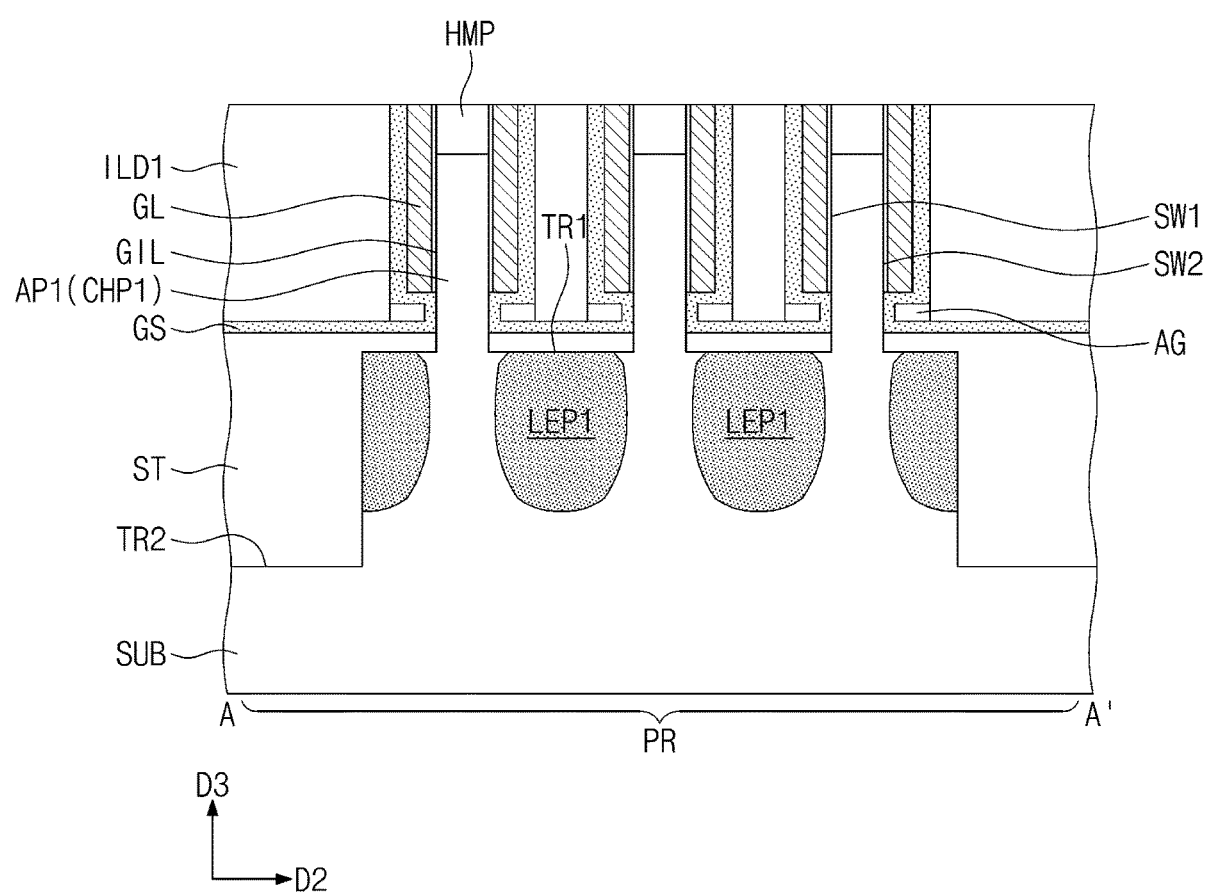
FIGS. 22A and 22B illustrate cross-sectional views respectively taken along lines A-A' and B-B' of FIG. 12, showing a method of fabricating a semiconductor device according to some example embodiments of the present inventive concepts.
Figure 22B:
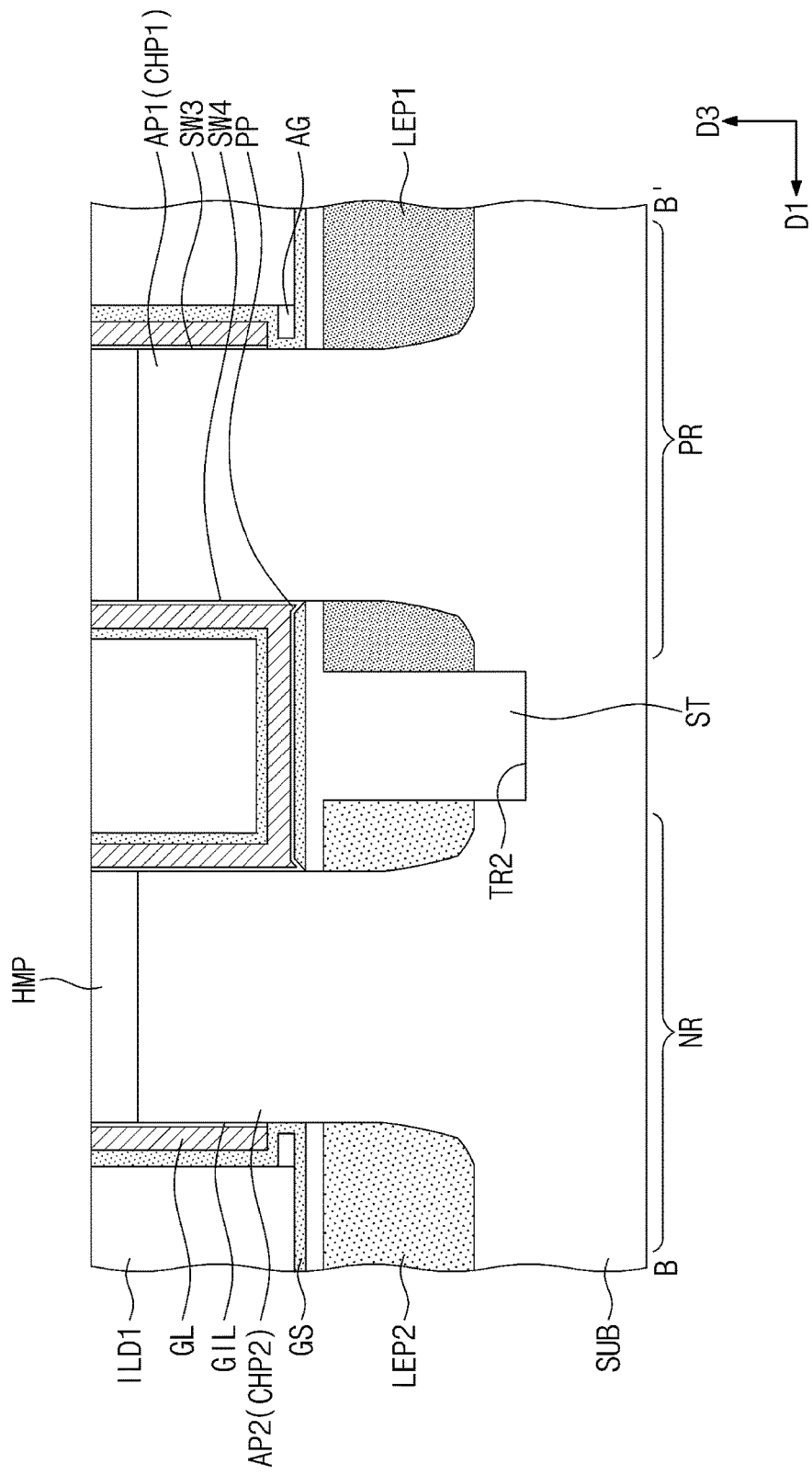

FIGS. 22A and 22B illustrate cross-sectional views respectively taken along lines A-A' and B-B' of FIG. 12, showing a method of fabricating a semiconductor device (e.g., a semiconductor device having structures of FIGS. 21A and 21B) according to some example embodiments of the present inventive concepts.

Referring to FIGS. 12, 22A, and 22B, the resist pattern RP may be removed after the process discussed with reference to FIGS. 12, 13A, and 13B. A planarization process may be performed after the removal of the resist pattern RP. The planarization process may be performed on the top surface of the etched gate electrode layer GL. For example, the planarization process may be performed on the second spacer layer SL2, the hardmask pattern HMP, and the gate electrode layer GL and the gate dielectric layer GIL between the first and second channel patterns CHP1 and CHP2.

A third spacer layer (not shown) may be additionally deposited between neighboring first channel patterns CHP1 and between neighboring second channel patterns CHP2. The third spacer layer may include or may be formed of the same material as that of the first and second spacer layers SL1 and SL2. The third spacer layer may be deposited on the first and second spacer layers SL1 and SL2.

The deposition of the third spacer layer may form a gate spacer GS on a sidewall of the gate electrode layer GL. In this step, the third spacer layer may be conformally deposited along bottom surfaces of the gate electrode layer GL and the gate dielectric layer GIL and along sidewalls of the first and second channel patterns CHP1 and CHP2. Thus, the gate spacer GS may extend along the bottom surface of the gate electrode layer GL and the sidewalls of the first and second channel patterns CHP1 and CHP2.

A first interlayer dielectric layer ILD1 may be formed on the gate spacer GS. The first interlayer dielectric layer ILD1 may be deposited by chemical vapor deposition (CVD) or physical vapor deposition (PVD). For example, the use of chemical vapor deposition (CVD) or physical vapor deposition (PVD) each having a poor step coverage may form an air gap AG without completely filling an empty space between the gate electrode layer GL and the device isolation layer ST.

The air gap AG may be defined by the first interlayer dielectric layer ILD1 and the gate spacer GS. The air gap AG may be an empty space formed between the first interlayer dielectric layer ILD1 and the gate spacer GS. The air gaps AG may extend along the first, second, and third sidewalls SW1, SW2, and SW3 of each of the first and second channel patterns CHP1 and CHP2.

Afterwards, a planarization process may be performed on the first interlayer dielectric layer ILD1 to expose the top surface of the hardmask pattern HMP.

Subsequently, substantially same processes as those discussed with reference to FIGS. 15 to 19B may be performed. A semiconductor device may be eventually fabricated as discussed with reference to FIGS. 21A and 21B.

Figure 23A:
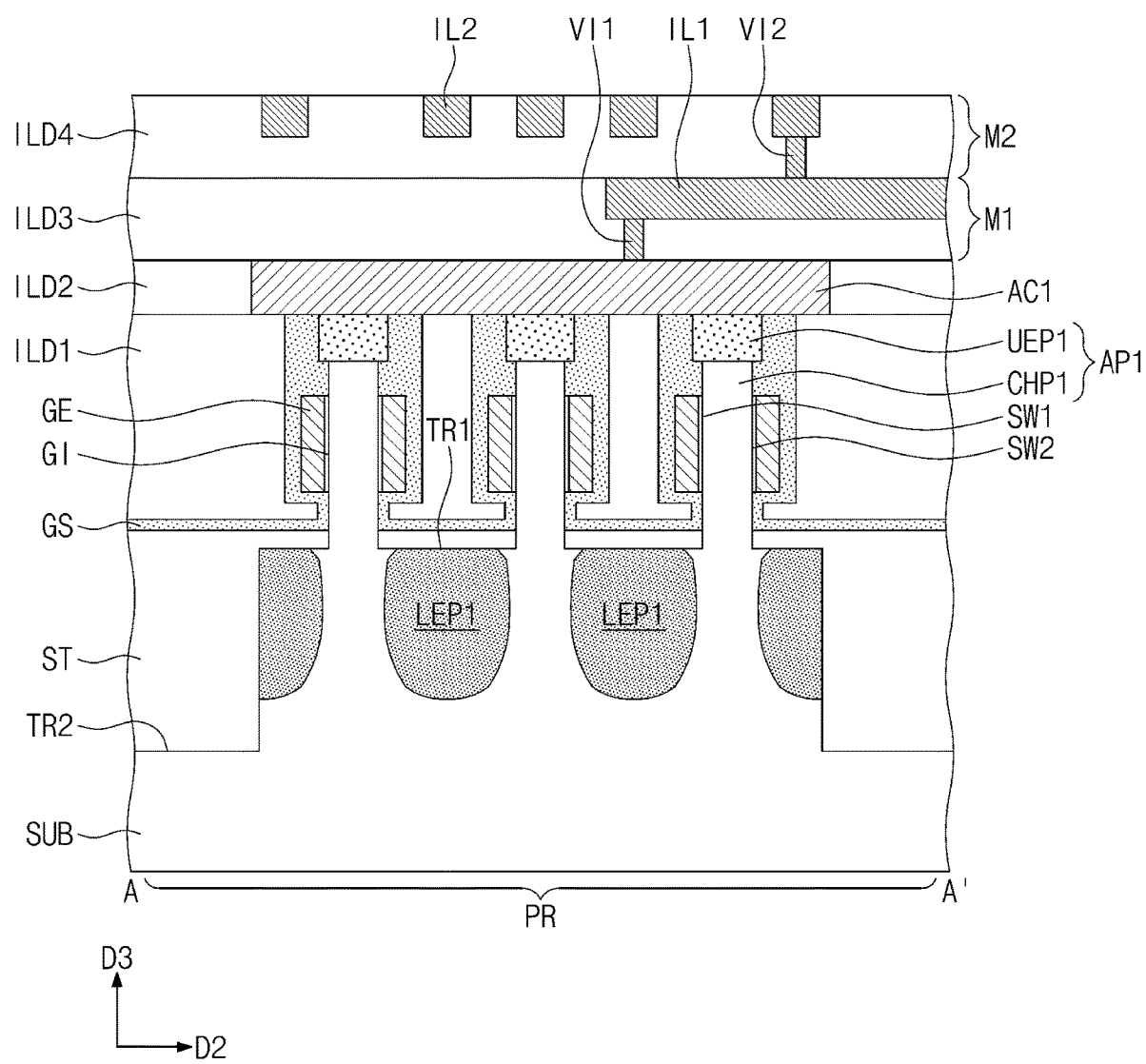
FIGS. 23A and 23B illustrate cross-sectional views respectively taken along lines A-A' and D-D' of FIG. 1, showing a semiconductor device according to some example embodiments of the present inventive concepts.
Figure 23B:
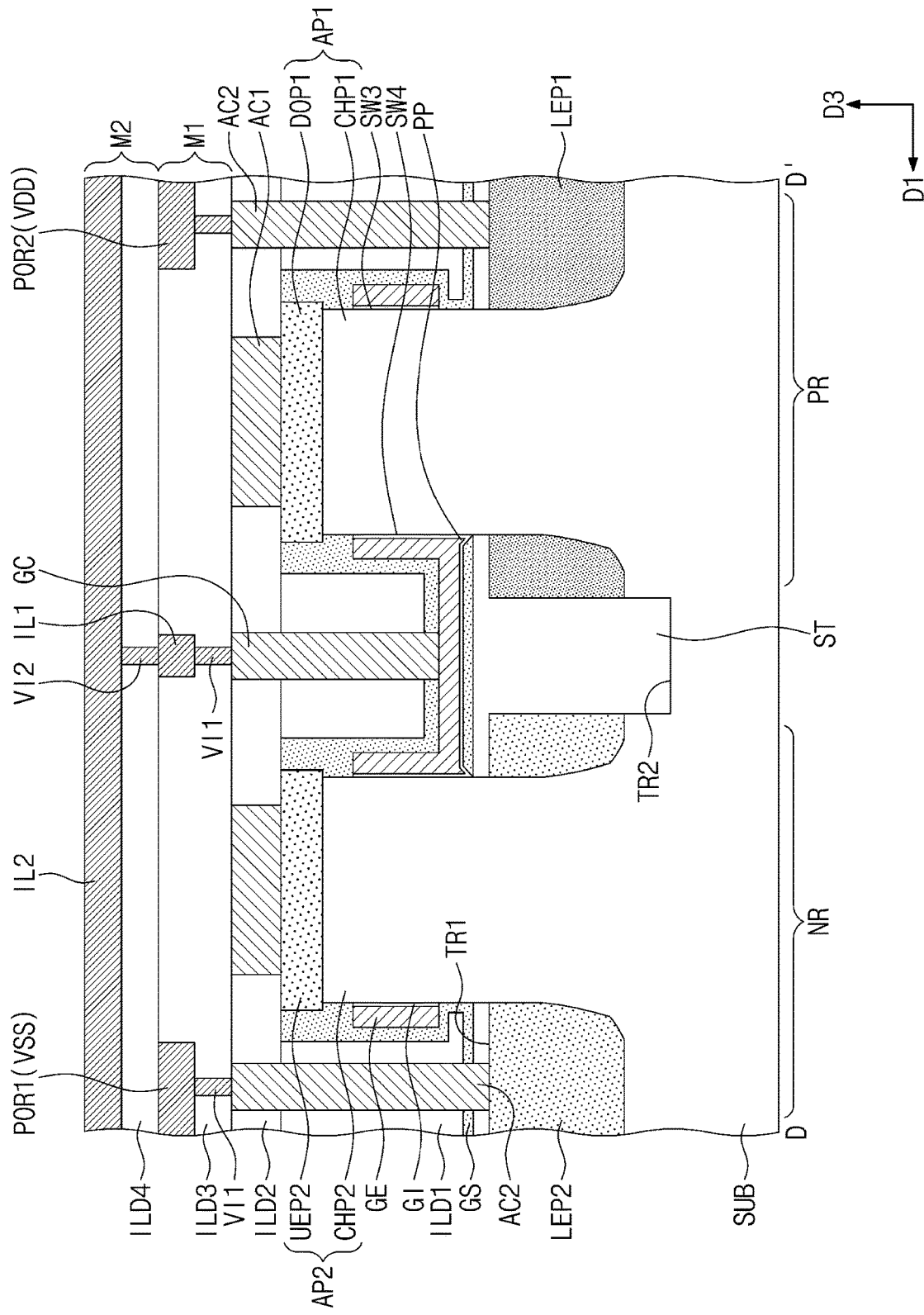

FIGS. 23A and 23B illustrate cross-sectional views respectively taken along lines A-A' and D-D' of FIG. 1, showing a semiconductor device according to some example embodiments of the present inventive concepts. In the embodiment that follows, a detailed description of technical features repetitive to those discussed above with reference to FIGS. 1 and 2A to 2D will be omitted, and a difference thereof will be discussed in detail.

Referring to FIGS. 1, 23A, and 23B, the gate spacer GS may extend along a bottom surface of the gate electrode GE and along sidewalls of the first and second channel patterns CHP1 and CHP2. The gate spacer GS may extend along upper and lower portion of the sidewalls of the first and second channel patterns CHP1 and CHP2. The first interlayer dielectric layer ILD1 may fill an empty space between the gate electrode GE and the device isolation layer ST. The first interlayer dielectric layer ILD1 may have a portion that protrudes toward the first and second channel patterns CHP1 and CHP2. At least a portion of the first interlayer dielectric layer ILD1 may vertically overlap the gate electrode GE. For example, the air gap AG is not formed between the first interlayer dielectric layer ILD1 and the gate spacer GS.

In the present embodiment, as the air gap AG is not be formed and a lower portion of the gate electrode GE is recessed, a spacing distance may be controlled between the gate electrode GE and the lower epitaxial pattern LEP1 or LEP2. Therefore, the gate electrode GE and the lower epitaxial patterns LEP1 and LEP2 may have therebetween reduced parasitic capacitance produced by the fact that the gate electrode GE partially extends toward the lower epitaxial patterns LEP1 and LEP2. As a result, a semiconductor device may operate faster owing to the reduced parasitic capacitance.

Figure 24A:
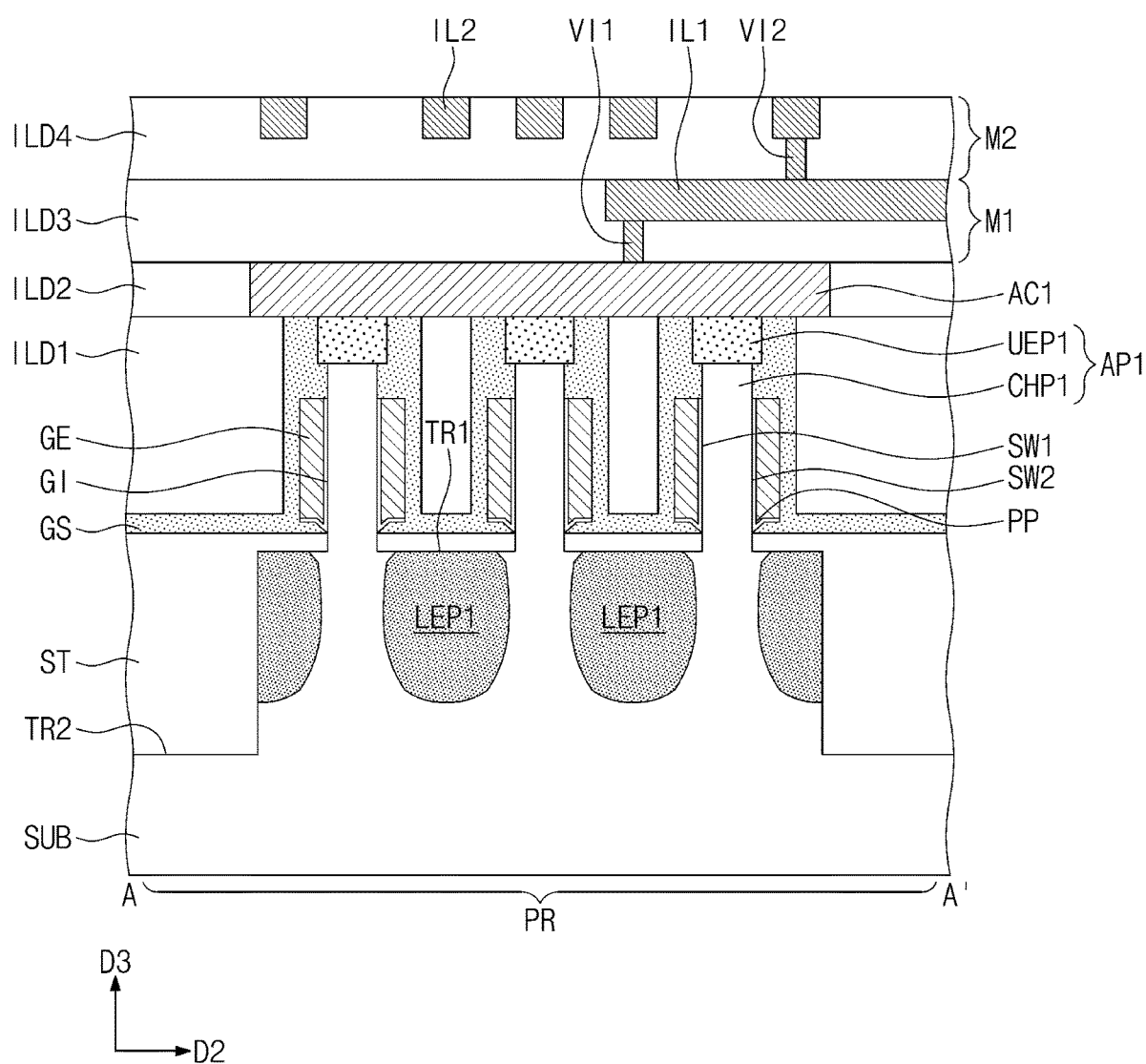
FIGS. 24A and 24B illustrate cross-sectional views respectively taken along lines A-A' and D-D' of FIG. 1, showing a semiconductor device according to some example embodiments of the present inventive concepts.
Figure 24B:
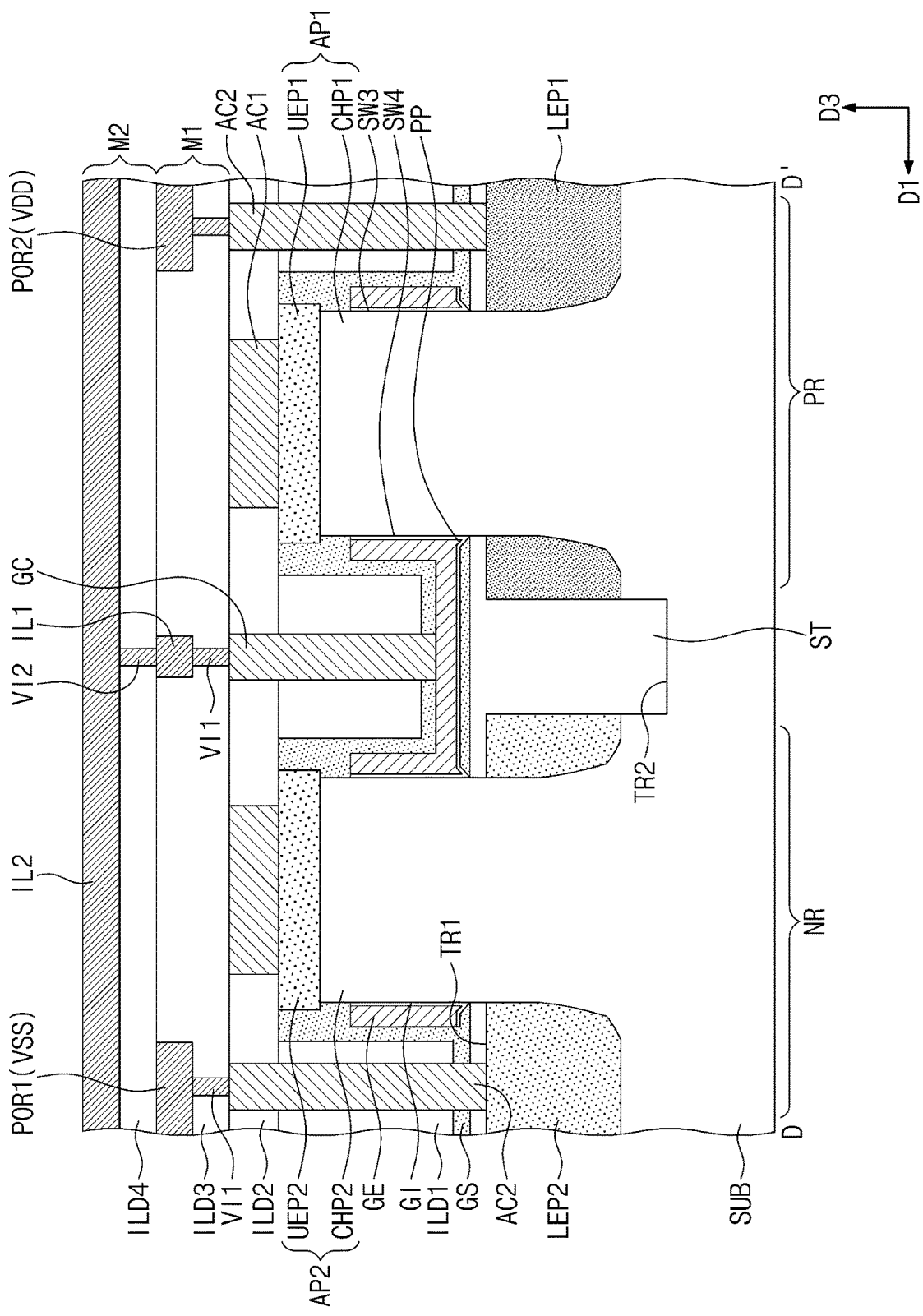

FIGS. 24A and 24B illustrate cross-sectional views respectively taken along lines A-A' and D-D' of FIG. 1, showing a semiconductor device according to some example embodiments of the present inventive concepts. In the embodiment that follows, a detailed description of technical features repetitive to those discussed above with reference to FIGS. 1 and 2A to 2D will be omitted, and a difference thereof will be discussed in detail.

Referring to FIGS. 1, 24A, and 24B, the gate electrode GE may include the protrusion PP. The protrusion PP may be disposed between the gate spacer GS and each of the first and second channel patterns CHP1 and CHP2. For example, the protrusion PP may be disposed between the gate spacer GS and four sidewalls SW1, SW2, SW3, and SW4 of each of the first and second channel patterns CHP1 and CHP2. For example, the protrusion PP may extend along four sidewalls SW1, SW2, SW3, and SW4 of each of the first and second channel patterns CHP1 and CHP2. The protrusion PP may protrude toward a portion of the device isolation layer ST which partially fills the first trench TR1.

With the presence of the protrusion PP, four sidewalls SW1, SW2, SW3, and SW4 of each of the first and second channel patterns CHP1 and CHP2 are not exposed. The gate spacer GS may extend along a bottom surface of the gate electrode GE. The gate dielectric pattern GI may cover the bottom surface and inner walls of the gate electrode GE.

In the present embodiment, as the air gap AG is not formed, but the gate electrode GE extending toward the lower epitaxial patterns LEP1 and LEP2 is partially recessed, the gate electrode GE and the lower epitaxial patterns LEP1 and LEP2 may have reduced parasitic capacitance therebetween. The presence of the protrusion PP may expand a region where the gate electrode GE overlaps the lower epitaxial pattern LEP1 or LEP2. In addition, the presence of the protrusion PP may increase a contact area between the gate electrode GE and each of the channel patterns CHP1 and CHP2. A semiconductor device may eventually have an enhanced operating speed.

Figure 25A:
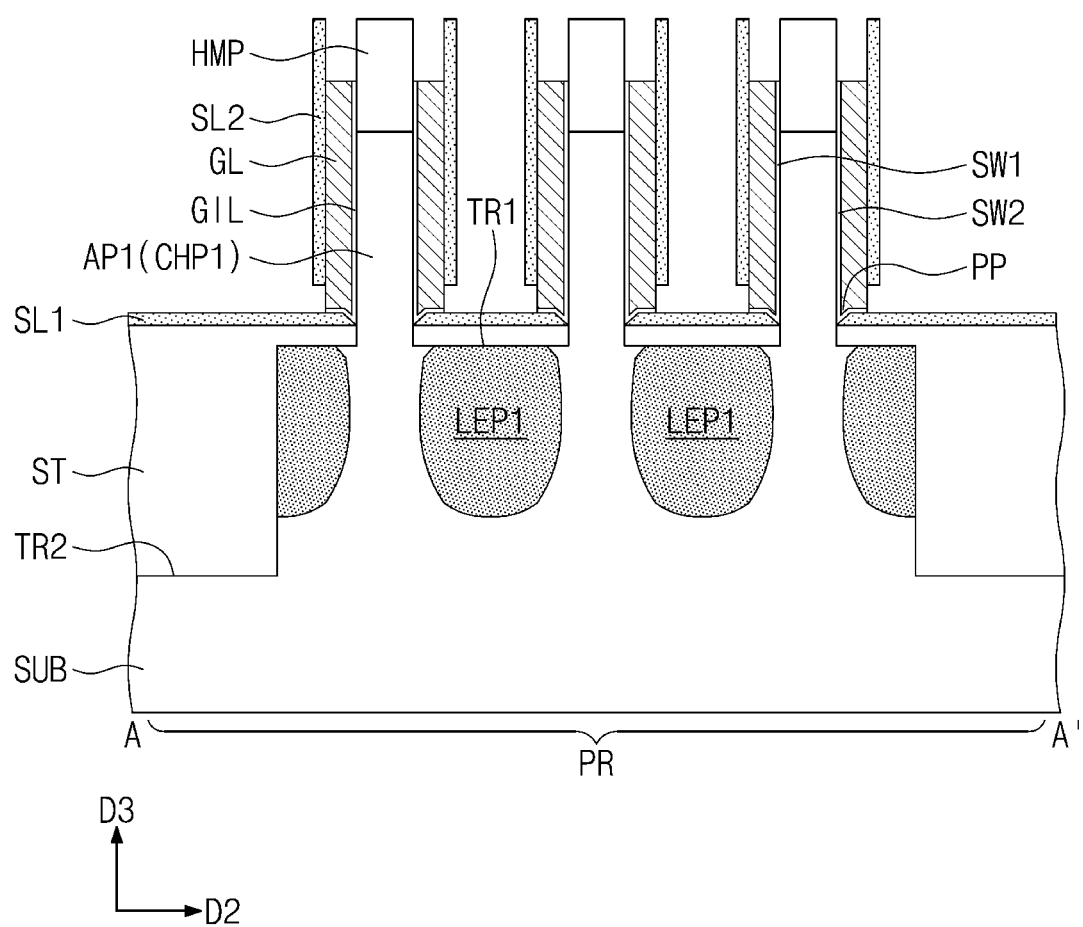
FIGS. 25A and 26A illustrate cross-sectional views taken along line A-A' of FIG. 12, showing a method of fabricating a semiconductor device according to some example embodiments of the present inventive concepts.
Figure 25B:
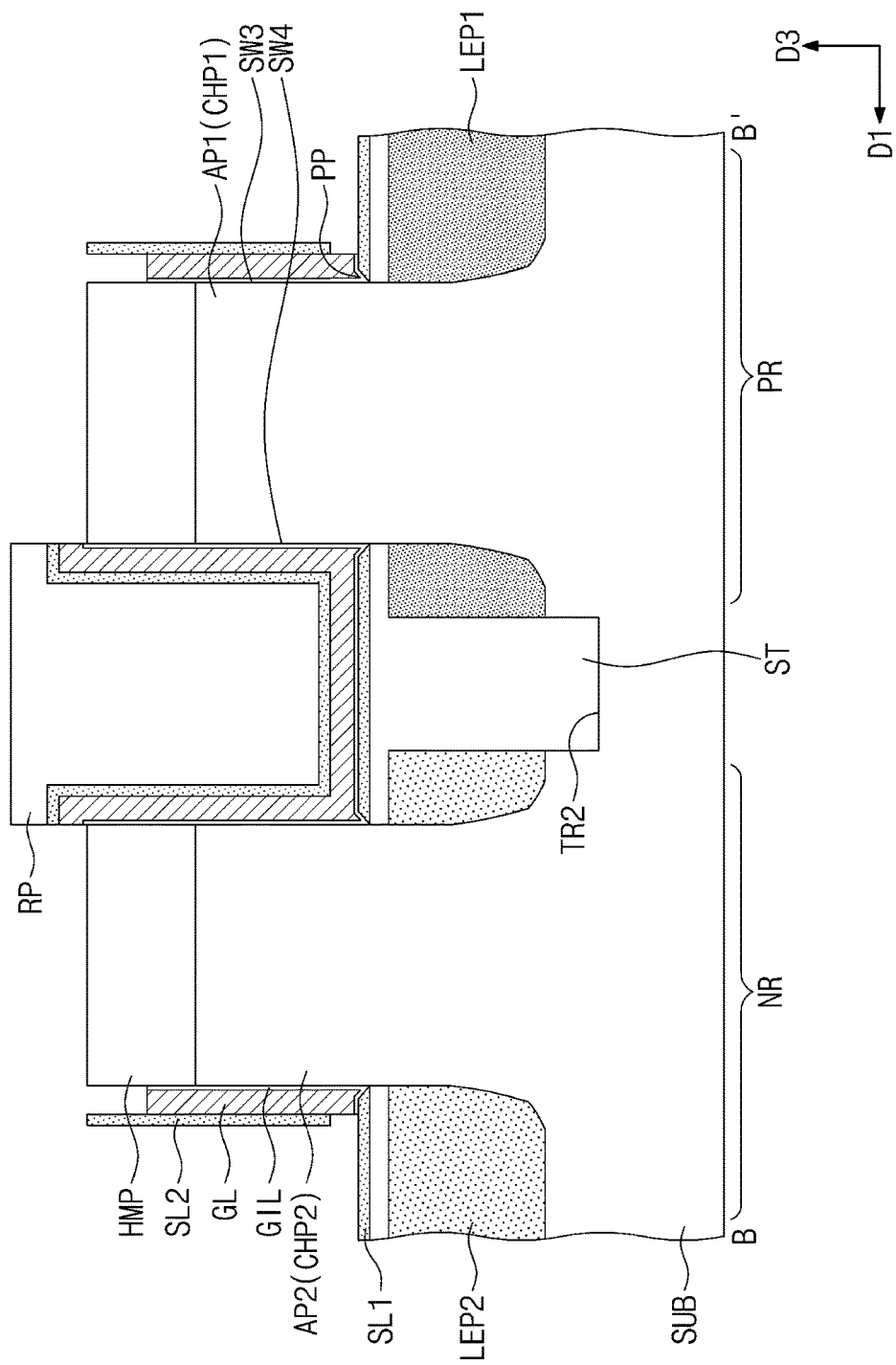
FIGS. 25B and 26B illustrate cross-sectional views taken along line B-B' of FIG. 12, showing a method of fabricating a semiconductor device according to some example embodiments of the present inventive concepts.
Figure 26A:
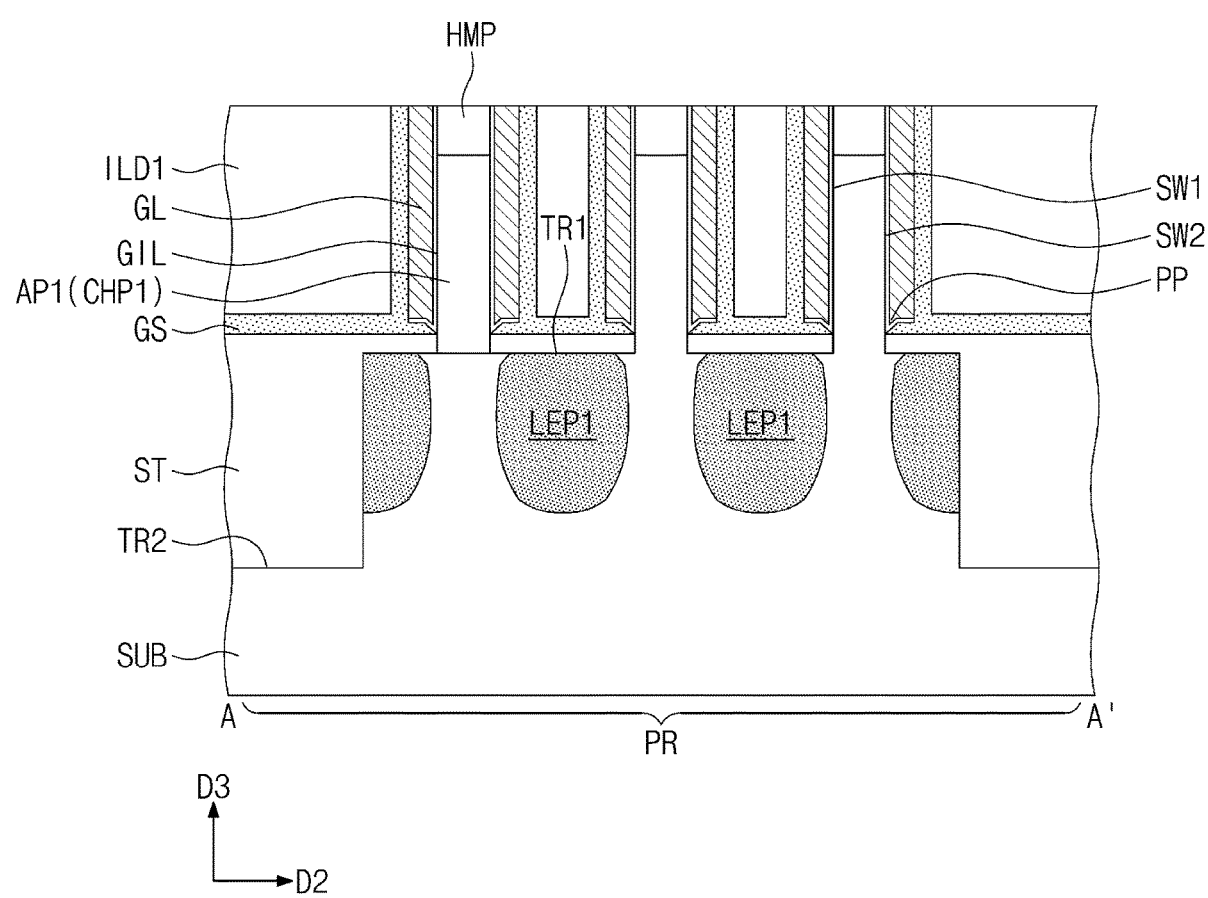
Figure 26B:
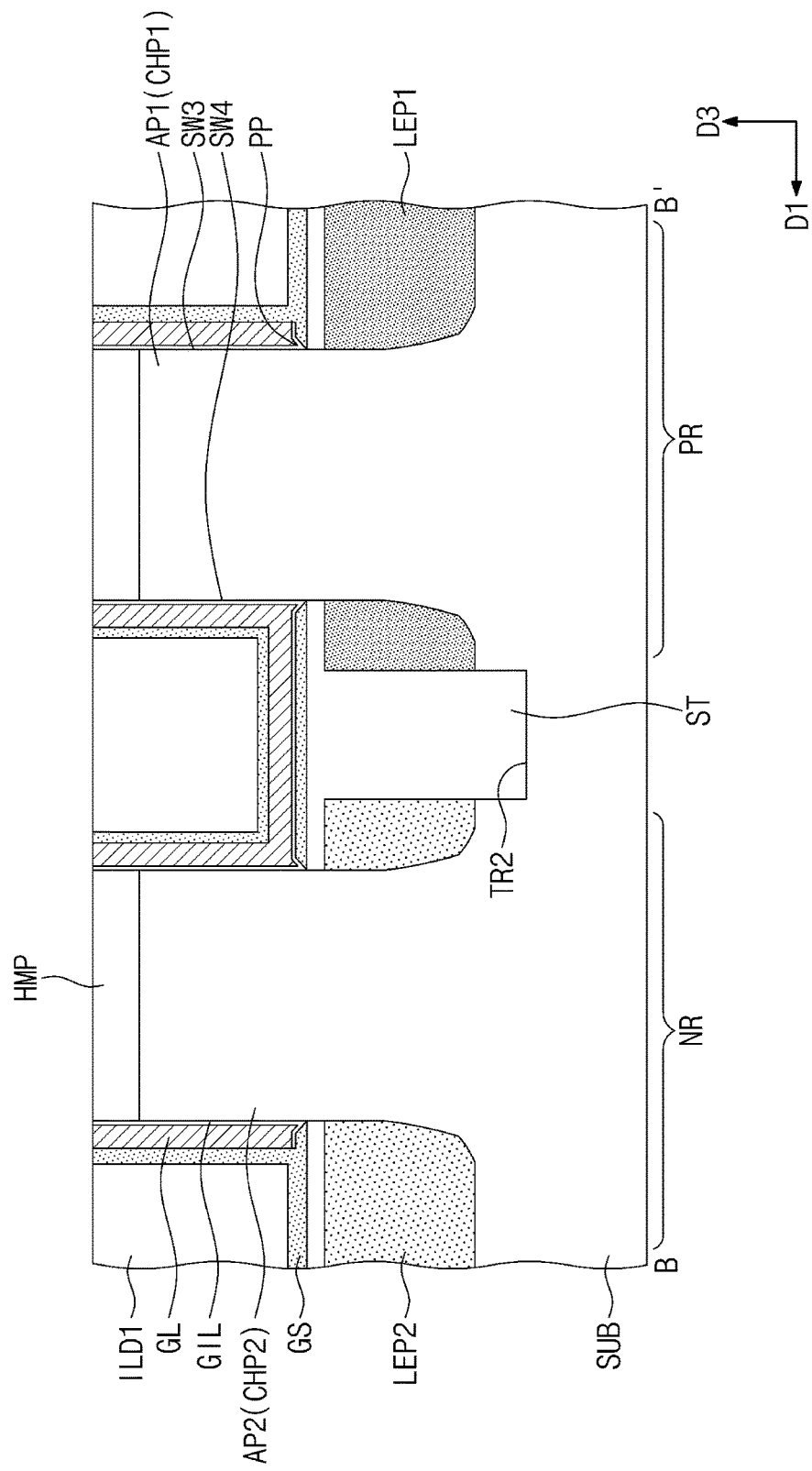

FIGS. 25A and 26A illustrate cross-sectional views taken along line A-A' of FIG. 12, showing a method of fabricating a semiconductor device according to some example embodiments of the present inventive concepts. FIGS. 25B and 26B illustrate cross-sectional views taken along line B-B' of FIG.

12, showing a method of fabricating a semiconductor device according to some example embodiments of the present inventive concepts.

Referring to FIGS. 12, 25A, and 25B, after the process discussed with reference to FIGS. 10, 11A, and 11B, an etching process may be performed on the gate electrode layer GL. A wet etching process may be adopted as the etching process. The etching process may partially remove upper and lower portions of the gate electrode layer GL. The etching process may also remove the gate dielectric layer GIL which was adjacent to the removed gate electrode layer GL. As the first and second spacer layers SL1 and SL2 include a material having etch selectivity with respect to the gate electrode layer GL, the first and second spacer layers SL1 and SL2 is not removed or may be barely removed by the wet etching process.

The resist pattern RP may remain on the second spacer layer SL2 between the first and second channel patterns CHP1 and CHP2, and therefore the gate electrode layer GL may extend in the first direction D1 along the first and second channel patterns CHP1 and CHP2.

The etched gate electrode layer GL and the etched gate dielectric layer GIL may have their top surfaces at a lower level than that of the top surface of the hardmask pattern HMP.

Lower portions of the gate electrode layer GL and the gate dielectric layer GIL may be partially removed. For example, the gate electrode layer GL and the gate dielectric layer GIL may be removed which vertically overlap the second spacer layer SL2. For example, the gate electrode layer GL may be removed at its portion that extends toward the first and second lower epitaxial patterns LEP1 and LEP2. The first spacer layer SL1 may be interposed between the gate electrode layer GL and the device isolation layer ST. In this case, no empty space may be formed below the gate electrode layer GL.

Each of the first and second channel patterns CHP1 and CHP2 may have a first sidewall SW1 and a second sidewall SW2 that face each other in the second direction D2, and may also have a third sidewall SW3 and a fourth sidewall SW4 that face each other in the first direction D1. The fourth sidewall SW4 may be adjacent to the device isolation layer ST between the first and second channel patterns CHP1 and CHP2. For example, a protrusion PP may remain between the first spacer layer SL1 and four sidewalls SW1, SW2, SW3, and SW4 of each of the first and second channel patterns CHP1 and CHP2.

Referring to FIGS. 12, 26A, and 26B, the resist pattern RP may be removed and then a planarization process may be performed. The planarization process may be performed on the top surface of the etched gate electrode layer GL. For example, the planarization process may be performed on the second spacer layer SL2, the hardmask pattern HMP, and the gate electrode layer GL and the gate dielectric layer GIL between the first and second channel patterns CHP1 and CHP2.

After the planarization process is performed, a third spacer layer (not shown) may be additionally deposited between neighboring first channel patterns CHP1 and between neighboring second channel patterns CHP2. The third spacer layer may include or may be formed of the same material as that of the first and second spacer layers SL1 and SL2. The third spacer layer may be deposited on the first and second spacer layers SL1 and SL2.

The deposition of the third spacer layer may form a gate spacer GS on a sidewall of the gate electrode layer GL. The gate spacer GS may extend along the device isolation layer ST.

A first interlayer dielectric layer ILD1 may be formed on the gate spacer GS. The first interlayer dielectric layer ILD1 may include or may be formed of, for example, a silicon oxide layer or a silicon oxynitride layer. Afterwards, a planarization process may be performed on the first interlayer dielectric layer ILD1 to expose the top surface of the hardmask pattern HMP.

Subsequently, substantially same processes as those discussed with reference to FIGS. 15 to 19B may be performed. A semiconductor device may be eventually fabricated as discussed with reference to FIGS. 24A and 24B.

A semiconductor device according to the present inventive concepts may be configured such that a lower portion of a gate electrode is recessed to reduce parasitic capacitance between the gate electrode and a lower epitaxial pattern. As a result, the semiconductor device may have enhanced electrical characteristics.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device comprising:
a substrate provided with a first active region protruding from a main surface of the substrate, wherein the first active region is provided with a first channel pattern protruding from an upper surface of the first active region;
a device isolation layer on the substrate, the device isolation layer including a first part defining the first active region and a second part surrounding a first portion of the first channel pattern of the first active region;
a first upper epitaxial pattern disposed on an upper surface of the first channel pattern of the first active region;
a first gate electrode that surrounds a second portion of the first channel pattern of the first active region and extends in a first direction parallel to the main surface of the substrate;
a gate spacer on the first gate electrode;
an interlayer dielectric layer on the gate spacer; and
an air gap between a bottom surface of the first gate electrode and the second part of the device isolation layer,
wherein at least a portion of the air gap vertically overlaps the first gate electrode, and
wherein the second portion of the first channel pattern of the first active region is higher than the first portion of the first channel pattern of the first active region.

2. The semiconductor device of claim 1,
wherein the gate spacer is further disposed on a sidewall of the first channel pattern of the first active region,
wherein a portion of the gate spacer contacts the second part of the device isolation layer and a sidewall of the first channel pattern of the first active region,
wherein at least a portion of a bottom surface of the first gate electrode is spaced apart from the portion of the gate spacer, and wherein the air gap is disposed between the bottom surface of the first gate electrode and the portion of the gate spacer.

3. The semiconductor device of claim 1,
wherein the gate spacer contacts a bottom surface of the first gate electrode and a sidewall of the first channel pattern, and
wherein the air gap is disposed between the interlayer dielectric layer and the gate spacer.

4. The semiconductor device of claim 1,
wherein the substrate is further provided with a second active region protruding from the main surface of the substrate,
wherein the second active region is spaced apart in the first direction from the first active region,
wherein the second active region is provided with a second channel pattern protruding from an upper surface of the second active region,
wherein the semiconductor device further comprises:
a second upper epitaxial pattern that are disposed on an upper surface of the second channel pattern of the second active region,
wherein the device isolation layer surrounds a first portion of the second channel pattern, and
wherein the first gate electrode surrounds a second portion of the second channel pattern of the second active region.

5. The semiconductor device of claim 4,
wherein the first channel pattern of the first active region includes:
a first sidewall and a second sidewall that face each other in a second direction different from the first direction; and
a third sidewall and a fourth sidewall that face each other in the first direction,
wherein a portion of the device isolation layer is between the first and second channel patterns,
wherein the portion of the device isolation layer is closer to the fourth sidewall of the first channel pattern of the first active region than the third sidewall of the first channel pattern,
wherein the air gap extends along the first, second, and third sidewalls of the first channel pattern of the first active region, and
wherein the first gate electrode contacts the fourth sidewall of the first channel pattern of the first active region.

6. The semiconductor device of claim 5,
wherein the gate spacer is further disposed on the second part of the device isolation layer and the first part of the device isolation layer,
wherein a portion of the gate spacer extends from the fourth sidewall of the first channel pattern of the first active region toward the second channel pattern of the second active region,
wherein the portion of the gate spacer includes a first end with an inclined sidewall adjacent to the fourth sidewall of the first channel pattern of the first active region,
wherein the first gate electrode includes a protrusion that extends into a region between the fourth sidewall of the first channel pattern of the first active region and the inclined sidewall of the first end of the portion of the gate spacer.

7. The semiconductor device of claim 4,
wherein the air gap partially surrounds a third portion of the first channel pattern of the first active region,
wherein the third portion of the first channel pattern is disposed between the first portion of the first channel pattern and the second portion of the first channel pattern, and
wherein the air gap is defined by a bottom surface of the first gate electrode, the gate spacer, and first, second, and third sidewalls of the first channel pattern of the first active region.

8. The semiconductor device of claim 1,
wherein the first active region is further provided with a second channel pattern protruding from the upper surface of the first active region,
wherein the second channel pattern of the first active region is spaced apart in a second direction from the first channel pattern of the first active region, the second direction being different from the first direction,
wherein the semiconductor device further comprises:
a second gate electrode that surrounds a portion of the second channel pattern of the first active region and extends in the first direction,
wherein an uppermost level of a bottom surface of the first gate electrode is lower than an uppermost level of a bottom surface of the second gate electrode.

9. The semiconductor device of claim 1,
wherein a portion of the gate spacer is disposed between the interlayer dielectric layer and the air gap.

10. The semiconductor device of claim 1, further comprising:
a first lower epitaxial pattern disposed in a recessed region of the first active region of the substrate;
a first active contact that penetrates the interlayer dielectric layer and is coupled to the first lower epitaxial pattern; and
a gate contact that penetrates the interlayer dielectric layer and is coupled to the first gate electrode,
wherein a bottom surface of the gate contact is higher than a bottom surface of the first active contact.

11. A semiconductor device comprising:
a substrate provided with a first active region and a second active region,
wherein the second active region is spaced apart in a first direction from the first active region,
wherein each of the first active region and the second active region vertically protrudes from a main surface of the substrate,
wherein the first active region is provided with a first channel pattern protruding from an upper surface of the first active region,
wherein the second active region is provided with a second channel pattern protruding from an upper surface of the second active region, and
wherein each of the first and second channel patterns extends in the first direction;
a device isolation layer on the substrate, the device isolation layer defining the first and second active regions and surrounding a first portion of each of the first channel pattern and the second channel pattern;
a gate electrode that surrounds the first and second channel patterns and extends in the first direction;
a gate spacer on the gate electrode and on the device isolation layer; and
an air gap below the gate electrode, at least a portion of the air gap vertically overlapping the gate electrode, wherein at least one side of the air gap is defined by the gate spacer.

12. The semiconductor device of claim 11,
wherein a portion of the gate spacer is disposed between the first channel pattern of the first active region and the second channel pattern of the second active region,
wherein the portion of the gate spacer includes a first end with an inclined sidewall adjacent to a sidewall of the first channel pattern of the first active region, and
wherein the gate electrode includes a protrusion that extends into a region between the sidewall of the first channel pattern of the first active region and the inclined sidewall of the first end of the portion of the gate spacer.

13. The semiconductor device of claim 11,
wherein a portion of the gate spacer contacts the device isolation layer, and
wherein at least a portion of a bottom surface of the gate electrode is spaced apart from the portion of the gate spacer.

14. The semiconductor device of claim 11, further comprising:
an interlayer dielectric layer on the gate spacer,
wherein the air gap is disposed between the interlayer dielectric layer and the gate spacer.

15. The semiconductor device of claim 11,
wherein each of the first and second channel patterns includes a plurality of sidewalls,
wherein the gate electrode contacts one of the plurality of sidewalls of each of the first and second channel patterns, and
wherein the air gap includes a first air gap and a second air gap, the first air gap extending along the other sidewalls of the plurality of sidewalls of the first channel pattern, and the second air gap extending along the other sidewalls of the plurality of sidewalls of the second channel pattern.

16. A semiconductor device comprising:
a substrate provided with a first active region and a second active region, the first and second active regions being spaced apart from each other in a first direction,
wherein each of the first and second active regions vertically protrudes from a main surface of the substrate,
wherein the first active region is provided with a first channel pattern protruding from an upper surface of the first active region, and
wherein the second active region is provided with a second channel pattern protruding from an upper surface of the second active region;
a first lower epitaxial pattern and a second lower epitaxial pattern disposed in a recessed region of the first active region and a recessed region of the second active region, respectively;
a device isolation layer on the substrate, the device isolation layer defining the first and second active regions;
a first upper epitaxial pattern and a second upper epitaxial pattern disposed on an upper surface of the first channel pattern and an upper surface of the second channel pattern, respectively;
a first gate electrode that surrounds the first and second channel patterns and extends in the first direction;
a gate spacer on the first gate electrode, at least a portion of the gate spacer being interposed between the device isolation layer and a bottom surface of the first gate electrode;
an interlayer dielectric layer on the gate spacer;
a first active contact that penetrates the interlayer dielectric layer and is coupled to the first upper epitaxial pattern;
a second active contact and a third active contact that penetrate the interlayer dielectric layer and the gate spacer and are coupled to the first lower epitaxial pattern and the second lower epitaxial pattern, respectively;
a gate contact that penetrates the interlayer dielectric layer and the gate spacer and is coupled to the first gate electrode;
a first metal layer on the interlayer dielectric layer,
wherein the first metal layer includes a first power rail, a second power rail, and a first line, each of the first power rail, the second power rail, and the first line extending in a second direction different from the first direction, and the first line being between the first power rail and the second power rail,
wherein the first line is electrically connected to the gate contact,
wherein the first power rail is electrically connected to the first lower epitaxial pattern via the second active contact, and
wherein the second power rail is electrically connected to the second lower epitaxial pattern via the third active contact;
a second metal layer on the first metal layer, the second metal layer including a second line that extends in the first direction, the second line being electrically connected to the first line of the first metal layer; and
an air gap between the first gate electrode and the device isolation layer,
wherein at least a portion of the air gap vertically overlaps the first gate electrode.

17. The semiconductor device of claim 16,
wherein the first channel pattern of the first active region includes:
a first sidewall and a second sidewall that face each other in the second direction; and
a third sidewall and a fourth sidewall that face each other in the first direction,
wherein a portion of the device isolation layer is between the first and second channel patterns,
wherein the portion of the device isolation layer is closer to the fourth sidewall of the first channel pattern of the first active region than the third sidewall of the first channel pattern,
wherein the air gap extends along the first, second, and third sidewalls of the first channel pattern of the first active region, and
wherein the first gate electrode contacts the fourth sidewall of the first channel pattern of the first active region.

18. The semiconductor device of claim 16,
wherein a portion of the gate spacer is disposed between the interlayer dielectric layer and the air gap.

19. The semiconductor device of claim 16,
wherein the gate spacer extends along a bottom surface of the first gate electrode, a plurality of sidewalls of the first channel pattern of the first active region, and a plurality of sidewalls of the second channel pattern of the second active region, and wherein the air gap is disposed between the interlayer dielectric layer and the gate spacer.

20. The semiconductor device of claim 16, further comprising:
   a second gate electrode that extends in the first direction and is spaced apart in the second direction from the first gate electrode,
   wherein the first active region is further provided with a third channel pattern spaced apart in the second direction from the first channel pattern,
   wherein the second gate electrode that surrounds the third channel pattern, and
   wherein an uppermost level of a bottom surface of the first gate electrode is lower than an uppermost level of a bottom surface of the second gate electrode.

* * * * *